US011901697B2

(12) United States Patent
Colles et al.

(10) Patent No.: US 11,901,697 B2
(45) Date of Patent: Feb. 13, 2024

(54) SINGLE-FET PULSED LASER DIODE DRIVER

(71) Applicant: Silanna Asia Pte Ltd, Singapore (SG)

(72) Inventors: Joseph H. Colles, Bonsall, CA (US); Steven E. Rosenbaum, San Diego, CA (US); Stuart B. Molin, Carlsbad, CA (US)

(73) Assignee: Silanna Asia Pte Ltd, Singapore (SG)

( * ) Notice: Subject to any disclaimer, the term of this patent is extended or adjusted under 35 U.S.C. 154(b) by 106 days.

(21) Appl. No.: 17/661,184

(22) Filed: Apr. 28, 2022

(65) Prior Publication Data
US 2023/0318259 A1 Oct. 5, 2023

Related U.S. Application Data

(63) Continuation-in-part of application No. 17/657,973, filed on Apr. 5, 2022.

(51) Int. Cl.
H01S 5/042 (2006.01)
H03K 17/687 (2006.01)

(52) U.S. Cl.
CPC ....... H01S 5/0428 (2013.01); H03K 17/6871 (2013.01)

(58) Field of Classification Search
CPC .................................... H01S 5/0428
USPC .................................... 372/38.02
See application file for complete search history.

(56) References Cited

U.S. PATENT DOCUMENTS

| 3,944,854 A | 3/1976 | Keller |
| 4,075,536 A | 2/1978 | Stevens |
| 4,146,830 A | 3/1979 | Foster |
| 5,287,375 A | 2/1994 | Fujimoto |
| 5,895,984 A | 4/1999 | Renz |
| 5,978,393 A | 11/1999 | Feldman et al. |
| 8,564,252 B2 | 10/2013 | Raimar et al. |

(Continued)

FOREIGN PATENT DOCUMENTS

| JP | 2016096221 A | 5/2016 |
| KR | 20150105889 A | 9/2015 |

OTHER PUBLICATIONS

International Search Report and Written Opinion dated Jun. 29, 2023 for PCT Patent Application No. PCT/IB2023/052658.

(Continued)

Primary Examiner — Tuan N Nguyen
(74) Attorney, Agent, or Firm — MLO, a professional corp.

(57) ABSTRACT

A pulsed laser diode driver includes multiple resonant laser diode driver cells, each cell including an inductor having a first inductor terminal to receive a source voltage, a source capacitor coupled between the first inductor terminal and ground, a bypass capacitor having a first terminal connected to the first inductor terminal and a second terminal connected to a second inductor terminal, a laser diode having a cathode that is connected to the first inductor terminal and an anode that is connected to the second inductor terminal, and a bypass switch connected between the second inductor terminal and ground. Each cell's bypass switch is configured to control a current flow through that cell's respective inductor to produce a high-current pulse through that cell's laser diode, the high-current pulse corresponding to a peak current of a resonant waveform developed at the anode of that cell's laser diode.

19 Claims, 59 Drawing Sheets

(56) References Cited

U.S. PATENT DOCUMENTS

| | | |
|---|---|---|
| 9,048,675 B2 | 6/2015 | Yang et al. |
| 9,368,936 B1 | 6/2016 | Lenius et al. |
| 2003/0016711 A1 | 1/2003 | Crawford |
| 2004/0202215 A1 | 10/2004 | Fairgrieve |
| 2004/0202216 A1 | 10/2004 | Fairgrieve |
| 2005/0185428 A1 | 8/2005 | Crawford et al. |
| 2005/0243879 A1 | 11/2005 | Horiuchi et al. |
| 2009/0161707 A1 | 6/2009 | Champion et al. |
| 2010/0283322 A1 | 11/2010 | Wibben |
| 2011/0085576 A1 | 4/2011 | Crawford et al. |
| 2011/0291578 A1 | 12/2011 | Philippbar et al. |
| 2014/0009952 A1 | 1/2014 | Nomura et al. |
| 2016/0344156 A1 | 11/2016 | Rothberg et al. |
| 2017/0085057 A1 | 3/2017 | Barnes et al. |
| 2017/0223788 A1 | 8/2017 | Jämsä et al. |
| 2017/0244212 A1 | 8/2017 | Burkholder |
| 2018/0261975 A1 | 9/2018 | Pavlov et al. |
| 2018/0278017 A1 | 9/2018 | Mignoli et al. |
| 2018/0323576 A1* | 11/2018 | Crawford .............. H02M 1/088 |
| 2019/0245624 A1 | 8/2019 | Kishi et al. |
| 2019/0386460 A1 | 12/2019 | Barnes et al. |
| 2020/0067269 A1 | 2/2020 | Eggermont |
| 2021/0066885 A1 | 3/2021 | Kuo et al. |
| 2021/0305770 A1* | 9/2021 | Colles ................... H01S 5/0428 |
| 2022/0045479 A1 | 2/2022 | Wagner et al. |

OTHER PUBLICATIONS

International Search Report and Written Opinion dated Dec. 10, 2021 for PCT Patent Application No. PCT/IB2021/058143.
International Search Report and Written Opinion dated Jul. 19, 2021 for PCT Patent Application No. PCT/IB2021/052368.
Notice of Allowance and Fees dated Sep. 14, 2021 for U.S. Appl. No. 17/301,009.

* cited by examiner

| | $M_{BP}$ | $M_{DL}$ | |
|---|---|---|---|
| Precharge$^n$ | OFF | OFF | ← 301 |
| Preflux$^n$ | ON | ON | ← 302 |
| Pulse Generation$^n$ | OFF | ON | ← 303 |
| Discharge$^n$ | ON | ON | ← 304 |
| Precharge$^{n+1}$ | OFF | OFF | ← 305 |

1301

1309

1501

SINGLE-FET PULSED LASER DIODE DRIVER

RELATED APPLICATIONS

This application is a continuation-in-part of U.S. Non-Provisional patent application Ser. No. 17/657,973, filed Apr. 5, 2022, the entirety of which is incorporated herein by reference for all purposes.

BACKGROUND

Laser-based ranging systems, such as Lidar, often use a pulsed laser diode driver circuit to generate a short, high-current pulse, which is passed through a laser diode to emit a corresponding pulse of laser light. Reflected pulses of laser light are received by the Lidar system and used to determine a distance between the Lidar system and the point of reflection. Spatial resolution of Lidar systems is determined in part by the width of the pulse of laser light. Thus, it is usually desirable to generate a pulse of light having a width of about 5 ns or less. However, parasitic inductances of the pulsed laser diode driver circuit and the laser diode typically must be overcome to achieve the desired short pulse width. For example, many laser diodes have at least one bond wire which can contribute 1 nH of inductance, thereby limiting a slew rate of the current pulse unless there is very high voltage. Thus, some conventional pulsed laser diode driver circuits use a high source voltage, often greater than 40V-100V, to achieve the desired pulse width. Switching devices, such as GaN field-effect transistors (FET) are often used in conventional pulsed laser diode driver circuits as they can withstand such high voltages. However, pulsed laser diode driver circuits that use GaN technology may be more expensive, and/or may be more difficult to integrate with Silicon-based architectures.

SUMMARY

In some embodiments, a pulsed laser diode driver includes multiple resonant laser diode driver cells. Each resonant laser diode driver cell includes an inductor having a first terminal and a second terminal, the first terminal being configured to receive a source voltage, a bypass capacitor having a first terminal directly electrically connected to the first terminal of the inductor and a second terminal directly electrically connected to the second terminal of the inductor, a laser diode having a cathode that is directly electrically connected to the first terminal of the inductor and an anode that is directly electrically connected to the second terminal of the inductor, and a bypass switch having a drain node that is directly electrically connected to the second terminal of the inductor and a source node that is directly electrically connected to ground. The pulsed laser diode driver includes a source capacitor that has a first terminal directly electrically connected to the first terminal of each inductor of the resonant laser diode driver cells to provide the source voltage thereto and a second terminal electrically coupled to ground, and a damping switch having a drain node that is directly electrically connected to the first terminal of the source capacitor and a source node that is directly electrically connected to ground. For each resonant laser diode driver cell, the bypass switch is configured to control a current flow through the inductor to produce a high-current pulse through the laser diode, the high-current pulse corresponding to a peak current of a resonant waveform developed at the anode of the laser diode. The damping switch is configured to discharge the source capacitor after each high-current pulse is produced.

In some embodiments, a pulsed laser diode driver includes multiple resonant laser diode driver cells. Each resonant laser diode driver cell includes an inductor having a first terminal and a second terminal, the first terminal being configured to receive a source voltage, a bypass capacitor having a first terminal directly electrically connected to the first terminal of the inductor and a second terminal directly electrically connected to the second terminal of the inductor, a laser diode having a cathode that is directly electrically connected to the first terminal of the inductor and an anode that is directly electrically connected to the second terminal of the inductor, and a bypass switch having a drain node that is directly electrically connected to the second terminal of the inductor and a source node that is directly electrically connected to ground. The pulsed laser diode driver includes a source capacitor having a first terminal directly electrically connected to the first terminal of each inductor of the resonant laser diode driver cells to provide the source voltage thereto and a second terminal electrically coupled to ground. For each resonant laser diode driver cell, the bypass switch is configured to control a current flow through the inductor to produce a high-current pulse through the laser diode, the high-current pulse corresponding to a peak current of a resonant waveform developed at the anode of the laser diode.

DETAILED DESCRIPTION

Figure 1A:
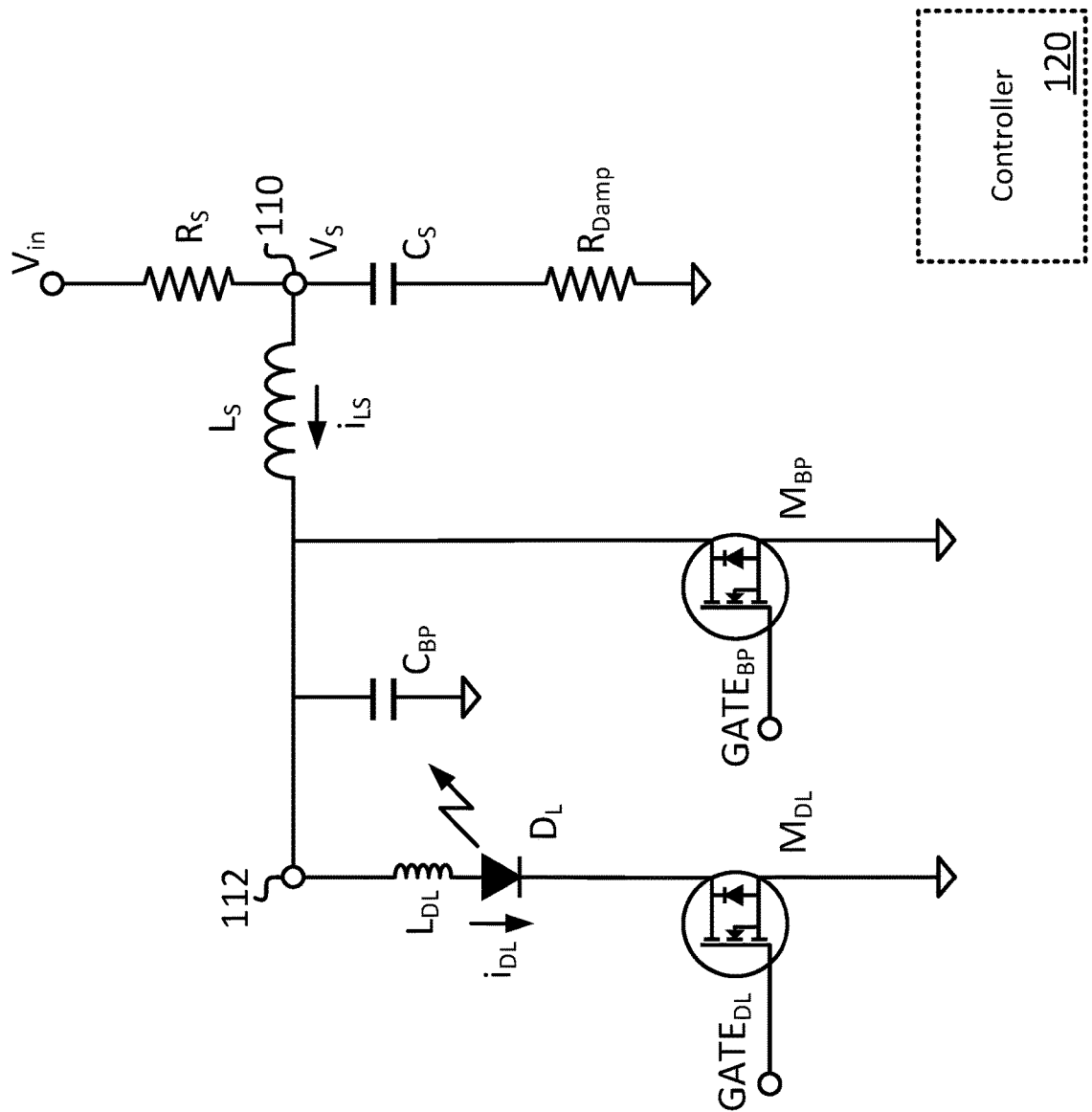
FIGS. 1A-1C are simplified circuit schematics of pulsed laser diode drivers of a first general topology, in accordance with some embodiments.

In accordance with some embodiments, pulsed laser diode driver circuits disclosed herein ("pulsed laser diode drivers"), generate high-current (e.g., 40 Amp) ultra-short pulses (e.g., 1-5 ns) to emit a laser pulse from a laser diode using a tunable resonant circuit, as compared to conventional solutions that rely on fixed, and often unavoidable, parasitic capacitances and inductances of a circuit. The tunable resonant circuit provides easily tunable parameters which control a pulse width, a peak current, a charge time, a recovery time, a decay time, and other tunable parameters of the pulsed laser diode driver. Embodiments of a switching sequence to drive the pulsed laser diode drivers disclosed herein are operable to generate a resonant waveform at an anode of the laser diode to produce the high-current pulse through the laser diode, a voltage level of the resonant waveform being advantageously sufficient to support the high-current pulse and not of a voltage level that exceeds the voltage required to generate the high-current pulse.

Thus, embodiments of such pulsed laser diode drivers can advantageously generate the high-current pulses using a low input voltage (e.g., 6V, 9V, 15V, etc.) and can thereby use Silicon-based switches, rather than GaN-based switches which are used by many conventional solutions. Any of the pulsed laser diode drivers disclosed herein can therefore be integrated into a single semiconductor die. Embodiments of pulsed laser diode drivers disclosed herein advantageously use a discrete inductor (e.g., a through-hole or surface-mounted component) intentionally added to the pulsed laser diode driver to generate a resonant waveform rather than relying on parasitic inductances (e.g., of the laser diode, of bond wires, or inter-circuit connections) of the pulsed laser diode driver. As a result, embodiments of the laser drivers disclosed herein are easily tunable and have a reproducible architecture. By contrast, conventional pulsed laser diode drivers often use a variety of techniques to overcome the effects of parasitic inductances of the pulsed laser diode driver and of the laser diode itself and therefore teach away from intentionally adding yet additional inductance to the pulsed laser diode driver. In addition to such intentionally added inductors, the pulsed laser diode drivers disclosed herein advantageously include a bypass capacitor that may be used by a designer to easily tune a desired pulse width emitted by the laser diode, as compared to conventional solutions which only have a source capacitor, or that only consider non-tunable parasitic capacitances of the pulsed laser diode driver. Once again, such conventional solutions teach away from adding yet additional capacitance to the pulsed laser diode driver. Because conventional solutions rely on parasitic capacitances and inductances of the conventional laser driver, modifying parameters such as a pulse width might require a redesign or re-layout of the conventional solution. By comparison, parameters, such as a pulse width, of the pulsed laser diode drivers disclosed herein can be tuned by simply changing a component value.

Multi-channel laser diodes are conventionally produced on a single monolithic substrate housed in a laser diode package. Conventionally, a single pin of the laser diode package is connected to all of the laser diode cathodes as a group (i.e., "common cathode"), whereas each laser diode anode is individually connected to a respective pin of the laser diode package. Pulsing each laser diode independently conventionally requires a switch in the laser diode anode current path to select which laser diode fires. However, an N-type switch conventionally requires a bootstrap circuit to level-shift a gate drive of that switch when the laser diode current path is enabled. Such bootstrap circuitry adds complexity and cost to a pulsed laser diode driver design. Thus, disclosed herein are embodiments of a multi-channel pulsed laser diode driver circuit for independently driving laser diodes of a common cathode multi-channel laser diode package advantageously using N-type switches without any bootstrap circuitry.

A repetition rate of a multi-channel laser diode driver, as well as of each of the pulsed laser diode drivers described herein, is limited by a charging time of each channel's source capacitor which is described below. The pulsed laser diode drivers described herein create narrow (e.g., 1-5 nsec) high-current pulses (e.g., 40 amp) through a driven laser diode. The instantaneous power in the driven laser diode is therefore high (e.g., in the order of hundreds of watts). For many applications (e.g., Lidar), the duty cycle of the pulse is generally 0.01% or less to limit a total power dissipated in the laser diode, which results in an upper limit to a repetition rate. In conventional pulsed laser diode driver applications, a resistor is used to charge source capacitors during each cycle. In such conventional solutions, an RC time constant of charging circuits is typically not an issue because the duty cycle is so low. However, for applications that require a higher repetition rate for laser pulses, the RC time constant of conventional charging circuits creates an undesirable limitation. Thus, in any of the embodiments disclosed herein, each source resistor of a given laser diode driver may be advantageously replaced by an actively controlled source switch that quickly charges an associated source capacitor.

Typical resonant driver designs require a damping resistor to minimize ringing duration. However, the added damping resistor dissipates power which lowers the overall power efficiency of the design. Thus, in some embodiments, a pulsed laser diode driver is disclosed that advantageously switches a damping resistor into the resonant circuit during portions of a switching sequence during which the damping resistor critically damps ringing, and switches the damping resistor out of the resonant circuit during portions of the switching sequence when the damping resistor is not providing a positive benefit to the resonant circuit, thereby increasing an overall power efficiency of the pulsed laser diode driver as compared to one that includes a damping resistor for the entirety of a switching sequence.

For some applications, the amplitude of a high-current pulse delivered by a pulsed laser diode driver, such as any of those disclosed herein, may need to be adjusted in amplitude from pulse to pulse. Thus, in some embodiments, any of the pulsed laser diode drivers disclosed herein may be advantageously configured to adjust an amplitude of the high-current pulse delivered to one or more laser diodes on a pulse-to-pulse basis.

Figure 1B:
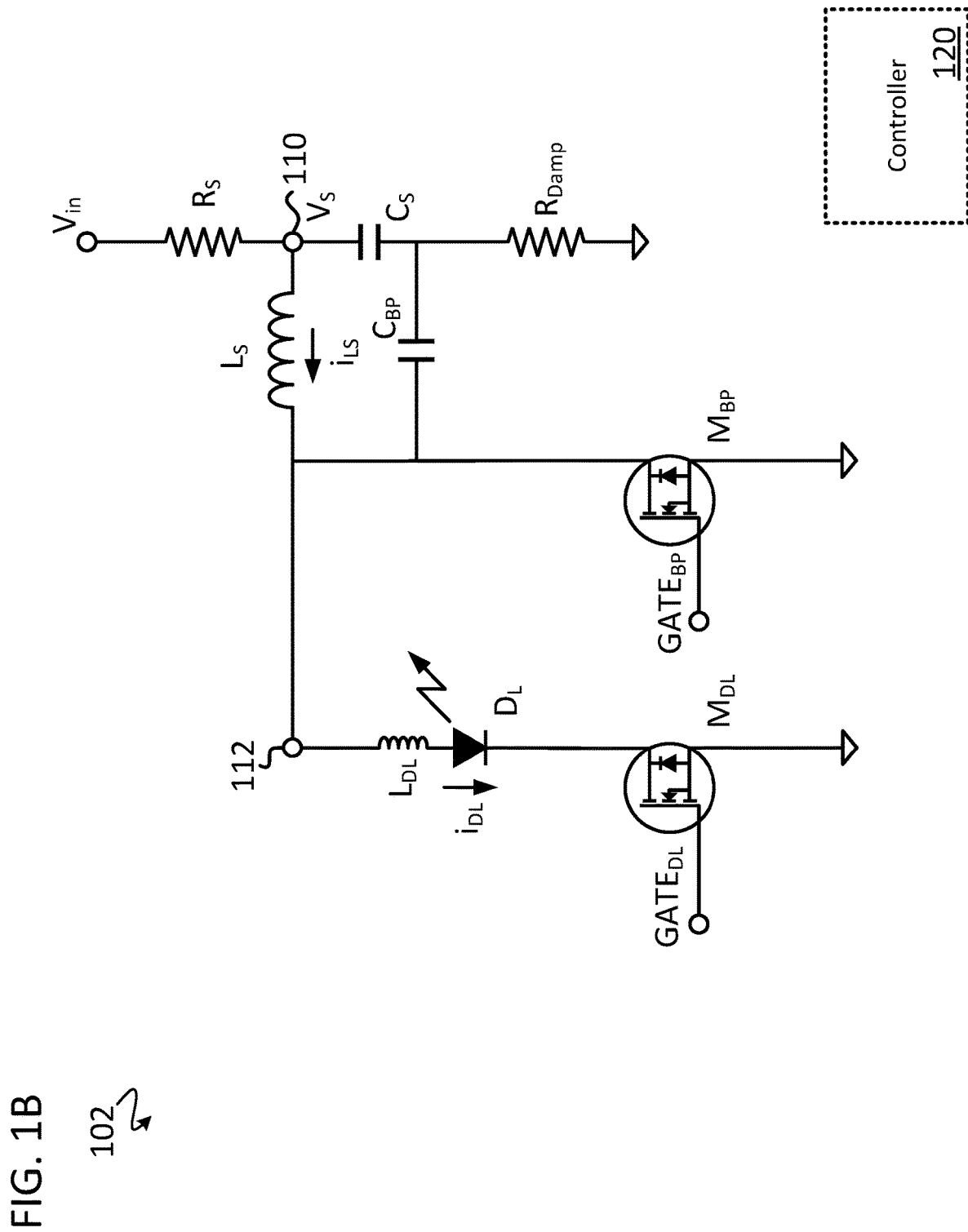
Figure 1C:
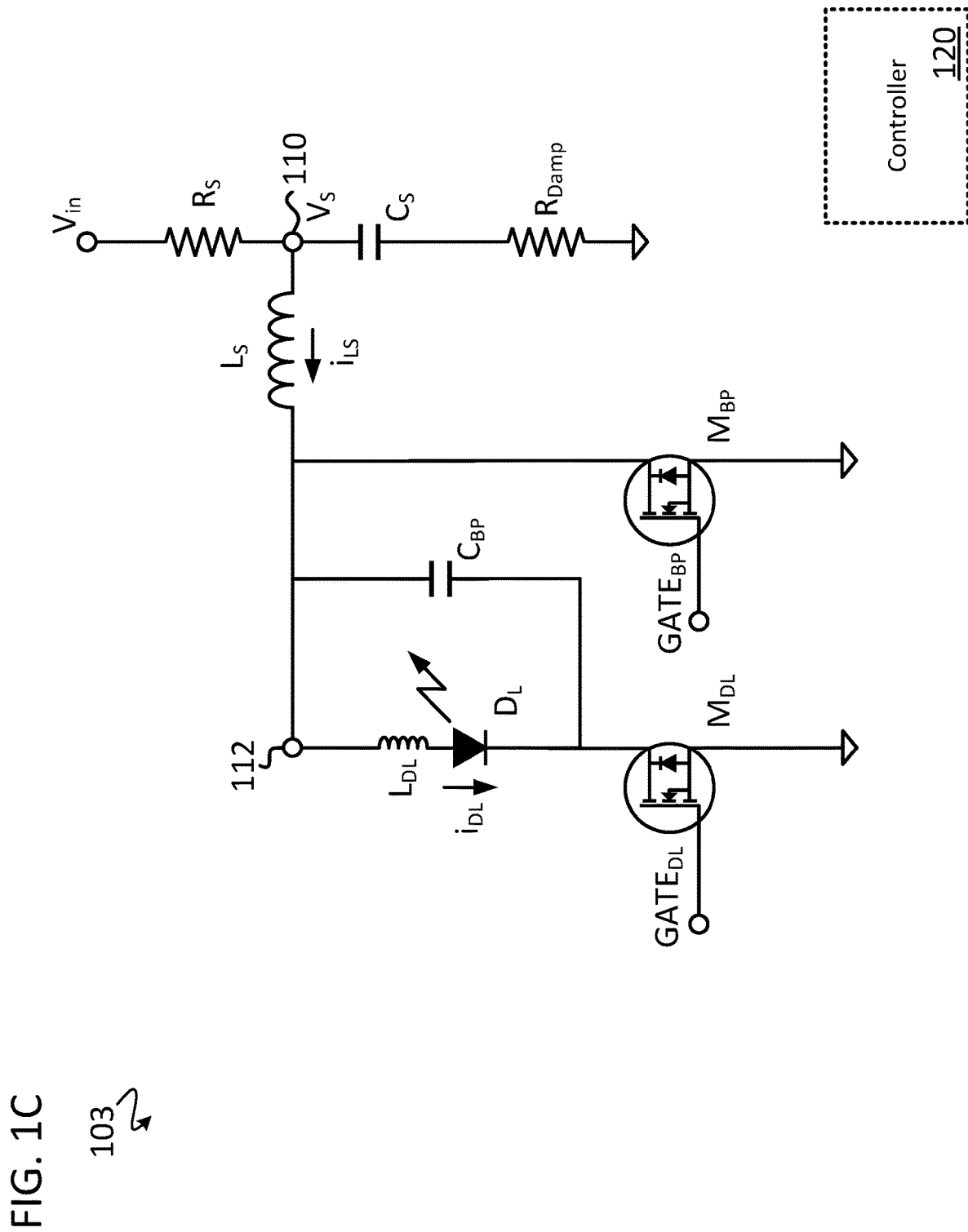

FIGS. 1A-C are simplified circuit schematics of pulsed laser diode drivers 101-103 of a first general topology to drive a laser diode using a low-side switch, in accordance with some embodiments. The pulsed laser diode drivers 101-103 each generally include a source resistor $R_S$, a source capacitor $C_S$ (i.e., a physical component that is not representative of a parasitic capacitance of another component), a damping resistor $R_{Damp}$, an inductor $L_S$ (i.e., a physical component that is not representative of a parasitic inductance of another component), a bypass capacitor $C_{BP}$ (i.e., a physical component that is not representative of a parasitic capacitance of another component), a laser diode $D_L$, a bypass switch $M_{BP}$, and a laser diode switch $M_{DL}$. The laser diode switch $M_{DL}$ is configured as a low-side switch. Also shown is a controller 120, nodes 110, 112, a parasitic inductance $L_{DL}$ of the laser diode $D_L$, a DC input voltage $V_{in}$, a source voltage $V_s$ at the source capacitor $C_S$, a current $i_{LS}$ through the inductor $L_S$, a current $i_{DL}$ through the laser diode $D_L$, a bypass switch gate driver signal $GATE_{BP}$, and a laser diode switch gate driver signal $GATE_{DL}$.

Topologies of the pulsed laser diode drivers 101-103 vary with respect to the placement of the bypass capacitor $C_{BP}$. In each of the topologies of the pulsed laser diode drivers 101-103, a first terminal of the source resistor $R_S$ is configured to be directly electrically connected to the DC input voltage $V_{in}$. A first terminal of the source capacitor $C_S$ is directly electrically connected to a second terminal of the source resistor $R_S$, and a second terminal of the source capacitor $C_S$ is directly electrically connected to a first terminal of the damping resistor $R_{Damp}$. A second terminal of the damping resistor $R_{Damp}$ is directly electrically connected to a bias voltage node such as ground. Thus, the second terminal of the source capacitor $C_S$ is electrically coupled to the bias voltage node. A first terminal of the inductor $L_S$ is directly electrically connected to the second terminal of the source resistor $R_S$ and to the first terminal of the source capacitor $C_S$. A drain node of the bypass switch $M_{BP}$ is directly electrically connected to a second terminal of the inductor $L_S$, and a source node of the bypass switch $M_{BP}$ is directly electrically connected to the bias voltage node. An anode of the laser diode $D_L$ is directly electrically connected to the second terminal of the inductor $L_S$, and a cathode of the laser diode $D_L$ is directly electrically connected to a drain node of the laser diode switch $M_{DL}$. A source node of the laser diode switch $M_{DL}$ is directly electrically connected to the bias voltage node.

The bypass switch $M_{BP}$ is configured to receive the bypass switch gate driver signal $GATE_{BP}$ at a gate node, the bypass switch gate driver signal $GATE_{BP}$ being operable to turn the bypass switch $M_{BP}$ on or off based on a voltage level of the bypass switch gate driver signal $GATE_{BP}$. Similarly, the laser diode switch $M_{DL}$ is configured to receive the laser diode switch gate driver signal $GATE_{DL}$ at a gate node, the laser diode switch gate driver signal $GATE_{DL}$ being operable to turn the laser diode switch $M_{DL}$ on or off based on a voltage level of the laser diode switch gate driver signal $GATE_{DL}$. In some embodiments, the pulsed laser diode driver circuits disclosed herein include one or more bootstrap circuits or other level-shifting circuits to drive one or more high-side switches. Either or both of the bypass switch $M_{BP}$ and the laser diode switch $M_{DL}$ can be implemented as N-type switches or P-type switches. In some embodiments, the bypass switch $M_{BP}$ and the laser diode switch $M_{DL}$ are implemented as Silicon-based or Silicon-Carbide-based field-effect transistors (FETs). Two or more components described herein as having terminals that are directly electrically connected have a DC current path between the respective terminals of the two or more components. For example, a first and second component are not directly electrically connected via a capacitor or inductor connected in series between the first component and the second component.

As shown in the simplified circuit schematic of the pulsed laser diode driver 101 of FIG. 1A, in some embodiments a first terminal of the bypass capacitor $C_{BP}$ is directly electrically connected to the second terminal of the inductor $L_S$ and to the anode of the laser diode $D_L$. In such embodiments, a second terminal of the bypass capacitor $C_{BP}$ is directly electrically connected to the bias voltage node. As shown in the simplified circuit schematic of the pulsed laser diode driver 102 of FIG. 1B, in some embodiments, the first terminal of the bypass capacitor $C_{BP}$ is directly electrically connected to the second terminal of the inductor $L_S$ and to the anode of the laser diode $D_L$. The second terminal of the bypass capacitor $C_{BP}$ is directly electrically connected to the second terminal of the source capacitor $C_S$ and to the first terminal of the damping resistor $R_{Damp}$. As shown in the simplified circuit schematic of the pulsed laser diode driver 103 of FIG. 1C, in some embodiments, the first terminal of the bypass capacitor $C_{BP}$ is directly electrically connected to the second terminal of the inductor $L_S$ and to the anode of the laser diode $D_L$. In such embodiments, the second terminal of the bypass capacitor $C_{BP}$ is directly electrically connected to the drain terminal of the laser diode switch $M_{DL}$ and to the cathode of the laser diode $D_L$.

In some embodiments, the pulsed laser diode drivers 101-103 are configured to receive the DC input voltage $V_{in}$ having a voltage range from about 10V to 20V, which is advantageously lower than an input voltage used by many conventional pulsed laser diode drivers. The inductor $L_S$ is a physical component added to the pulsed laser diode drivers 101-103 (i.e., as opposed to a representation of a parasitic inductance caused by components or interconnections such as bond wires). Similarly, the bypass capacitor $C_{BP}$ is a physical component added to the pulsed laser diode drivers 101-103 (i.e., as opposed to a representation of a parasitic capacitance). One advantage of using physical inductor and capacitor components rather than using parasitic inductances is that values of the inductor $L_S$ and the bypass capacitor $C_{BP}$ can be easily modified by a designer or even an end-user. By comparison, conventional designs that rely on parasitic reactances may require re-design and/or re-layout to change an operating parameter.

As disclosed herein, values of the DC input voltage $V_{in}$, the inductance of the inductor $L_S$, the capacitance of the source capacitor $C_S$, the resistance of the damping resistor $R_{Damp}$, and the capacitance of the bypass capacitor $C_{BP}$ can advantageously be selected ("tuned") to achieve a desired operation of the pulsed laser diode drivers 101-103 (e.g., a charge time, a pulse width, a pulse voltage, a pulse current). For example, a pulse width of the current $i_{DL}$ flowing through the laser diode $D_L$ can be tuned by adjusting the capacitance value of the bypass capacitor $C_{BP}$. A peak current level of the pulse of current $i_{DL}$ flowing through the laser diode $D_L$ can be tuned by adjusting the source voltage $V_s$ on the supply capacitor $C_S$. A capacitance value of the source capacitor $C_S$ can be tuned to adjust a timing delay of the current pulse and an upper range of the current $i_{DL}$ through the laser diode $D_L$. Resistance values of the damping resistor $R_{Damp}$ are dependent on the capacitance value of the supply capacitor $C_S$ and can be tuned within a range of values such that at a lower resistance, a lower frequency resonance of the pulsed laser diode drivers disclosed herein is underdamped (e.g., at about $R_{Damp}$=0.1 Ohm), or is critically damped (e.g., at about $R_{Damp}$=0.4 Ohm). The damping resistor $R_{Damp}$ is operable to prevent current of the generated resonant waveform from becoming negative which could thereby enable a body diode of the bypass switch $M_{BP}$ or the laser diode switch $M_{DL}$. Although a resulting maximum current level of the current $i_{DL}$ through the laser diode $D_L$ is lower for the critically damped case, the current level can be easily adjusted by raising the voltage level of the DC input voltage $V_{in}$. In other embodiments, the damping resistor $R_{Damp}$ is removed entirely from the design (i.e., the second terminal of the source capacitor $C_S$ is directly electrically connected to the bias voltage node). In yet other embodiments, the resistance value of the damping resistor $R_{Damp}$ is set to zero Ohms.

In some embodiments, the DC input voltage $V_{in}$ is about 15V, the inductance of the inductor $L_S$ is about 6 nH, the capacitance of the source capacitor $C_S$ is about 100 nF, the resistance of the damping resistor $R_{Damp}$ is about 0.1 Ohms, and the capacitance of the bypass capacitor $C_{BP}$ is about 1 nF. In some embodiments, a voltage at the first terminal of the damping resistor $R_{Damp}$ is received by the controller 120 to provide an indication of a current flow through the damping resistor $R_{Damp}$.

In some or all of the embodiments disclosed herein, to produce around a 40 A high-current pulse through the laser diode (or laser diodes) $D_L$, the DC input voltage $V_{in}$ may range from 10-15 volts. In some such embodiments, the inductance of inductor $L_S$ may range from 5-10 nH, the value of which determines the amount of flux delay to produce the required current. In some such embodiments, the inductance of the inductor $L_S$ is selected to be an order of magnitude greater than a parasitic inductance of a printed circuit board (PCB) in which the pulsed laser diode driver is implemented. In some embodiments, the resistance of the damping resistor $R_S$ ranges from 100-200 mOhm. A capacitance of the bypass capacitor $C_{BP}$ determines the pulse width of the high-current pulse through the laser diode(s) $D_L$, and in some embodiments ranges in capacitance from 1-5 nF. In some such embodiments, a capacitance of the supply capacitor $C_S$ ranges from 25-100 nF depending on a peak current of the high-current pulse through the laser diode(s) $D_L$ that is required or desired. The smaller the supply capacitor $C_S$, the higher the DC input voltage $V_{in}$ is needed to get the required or desired peak current of the high-current pulse through the laser diode(s) $D_L$. In some such embodiments, a smallest capacitance value of the supply capacitor $C_S$ that can still deliver the needed or desired peak current of the high-current pulse through the laser diode(s) $D_L$ is selected because all the remaining energy after the high-current pulse is shunted to ground and is wasted, thereby lowering a power efficiency of the pulsed laser diode driver.

The controller 120 may be integrated with any embodiment of the pulsed laser diode drivers disclosed herein, or it may be a circuit or module that is external to any embodiment of the pulsed laser diode drivers disclosed herein. The controller 120 is operable to generate one or more gate drive signals having a voltage level that is sufficient to control one or more laser diode switches $M_{DL}$ and one or more bypass switches $M_{BP}$. Additionally, the controller 120 is operable to sense a voltage and/or current at any of the nodes 110 and 112 and at nodes that are similar to, or the same as, the nodes 110 and 112 as described herein, or at still other nodes of the pulsed laser diode drivers disclosed herein. The controller 120 may include one or more timing circuits, look-up tables, processors, memory, or other modules to control the pulsed laser diode drivers disclosed herein. Operation of the pulsed laser diode drivers 101-103 is explained in detail with respect to simplified plots 201-207 of FIGS. 2A-D and an example switching sequence 300 shown in FIG. 3.

FIGS. 2A-2D show simplified plots 201-207 of signals related to operation of the pulsed laser diode driver 101 shown in FIG. 1A, in accordance with some embodiments. However, signals related to the operation of the pulsed laser diode drivers 101-103, 401-404, 501-504, 601-604, 701-705, 801-802, and 901-902 are similar to, or are the same as, those shown in the simplified plots 201-207.

The simplified plot 201 illustrates a voltage plot of the bypass switch gate driver signal $GATE_{BP}$ 220, a voltage plot of the laser diode switch gate driver signal $GATE_{DL}$ 221, a current plot of the current $i_{LS}$ through the inductor $L_S$ 222, a current plot of the current $i_{DL}$ through the laser diode $D_L$ 223, and a voltage plot of the source voltage $V_S$ 224 at the source capacitor $C_S$, all over the same duration of time. Details of these signals are described below. The voltage plots of the bypass switch gate driver signal $GATE_{BP}$ 220 and the laser diode switch gate driver signal $GATE_{DL}$ 221 have been level-shifted for readability, but are, in actuality, low voltage inputs. Additionally, the voltage plots of the bypass switch gate driver signal $GATE_{BP}$ 220 and the laser diode switch gate driver signal $GATE_{DL}$ 221 assume that the laser diode switch $M_{DL}$ and the bypass switch $M_{BP}$ are NFET devices. However, if PFET devices are used instead, the polarity of the bypass switch gate driver signal $GATE_{BP}$ 220 and the laser diode switch gate driver signal $GATE_{DL}$ 221 are inverted.

Upon receiving (e.g., from the controller 120) an asserted level of the bypass switch gate driver signal $GATE_{BP}$ 220 at the gate node of the bypass switch $M_{BP}$, the bypass switch $M_{BP}$ is enabled (i.e., transitioned to an ON-state). Similarly, upon receiving (e.g., from the controller 120) an asserted level of the laser diode switch gate driver signal $GATE_{DL}$ 221 at the gate node of the laser diode switch $M_{DL}$, the laser diode switch $M_{DL}$ is enabled. As highlighted in the plot 202, when the bypass switch $M_{BP}$ is enabled, the rising current $i_{LS}$ 222 begins to flow through the inductor $L_S$, thereby building magnetic flux at the inductor $L_S$. When the current $i_{LS}$ 222 has reached a desired level (e.g., as determined by the controller 120 using sensed current, voltage, a timer circuit, or as determined by design constraints), a de-asserted level of the bypass switch gate driver signal $GATE_{BP}$ 220 is received (e.g., from the controller 120) at the gate node of the bypass switch $M_{BP}$, thereby disabling the bypass switch $M_{BP}$ (i.e., transitioned to an OFF-state). As highlighted in the plot 203, when the bypass switch $M_{BP}$ is disabled, the current $i_{LS}$ 222 which has built up through the inductor $L_S$, having no other current path, is redirected through the laser diode $D_L$, causing a short (e.g., 1 ns-5 ns), high-current (e.g., >30 A) pulse to flow through the laser diode $D_L$, thereby causing the laser diode $D_L$ to emit a pulse of laser light. Because energy in the form of flux has been stored at the inductor $L_S$, the high-current pulse $i_{DL}$ that flows through the laser diode $D_L$ can be significantly greater than the current $i_{LS}$ that flows through the inductor $L_S$. Values of the reactive components of the laser diode drivers disclosed herein can be advantageously selected to generate a desired current amplitude of the high-current pulse $i_{DL}$.

After emission from the laser diode $D_L$, the bypass switch $M_{BP}$ is reenabled by an asserted level of the bypass switch gate driver signal $GATE_{BP}$ 220, and the laser diode switch $M_{DL}$ is maintained in an enabled state by an asserted level of the laser diode switch gate driver signal $GATE_{DL}$ 221. As highlighted in the plot 204, the bypass switch $M_{BP}$ and the laser diode switch $M_{DL}$ are both advantageously maintained in the enabled state as the source voltage $V_S$ 224 stored at the source capacitor $C_S$ is discharged. As highlighted in the plot 205, while the bypass switch $M_{BP}$ and the laser diode switch $M_{DL}$ are maintained in the enabled state, the current $i_{DL}$ 223 through the laser diode $D_L$ (and importantly, through the parasitic inductance $L_{DL}$ of the laser diode $D_L$) diminishes to zero. Thereafter, both the bypass switch $M_{BP}$ and the laser diode switch $M_{DL}$ are disabled by de-asserted levels (e.g., from the controller 120) of the bypass switch gate driver signal $GATE_{BP}$ 220 and the laser diode switch gate driver signal $GATE_{DL}$ 221. Because the laser diode switch $M_{DL}$ is not disabled until a current through the parasitic inductance $L_{DL}$ of the laser diode $D_L$ has diminished to zero, a high voltage spike advantageously does not develop at the anode of the laser diode $D_L$ as there is no rapid change in current through the parasitic inductance $L_{DL}$. Because such high voltage spikes are advantageously mitigated, the laser diode switch $M_{DL}$ does not need to be selected to withstand high voltages, thereby simplifying the design and reducing the cost of the pulsed laser diode drivers disclosed herein as compared to conventional solutions. Additionally, because such high voltage spikes are mitigated, the pulsed laser diode drivers disclosed herein do not require voltage snubbing circuits that are commonly used in conventional solutions, thereby further simplifying the design and reducing the cost of the pulsed laser diode drivers disclosed herein as compared to conventional solutions.

The high-current pulse 223 is a first and largest peak of the resonant waveform developed by reactive components of the pulsed laser diode driver circuit. These reactive components include the source capacitor $C_S$, the inductor $L_S$, the parasitic inductance $L_{DL}$ of the laser diode $D_L$, and the bypass capacitor $C_{BP}$. In addition to the advantages described above, the bypass switch $M_{BP}$ also reduces subsequent resonant waveform "ringing" of the resonant waveform after the high-current pulse 223 is generated. As shown in the plot 206, if a bypass switch gate driver signal $GATE_{BP}$ 220' is not asserted after a high-current pulse $i_{DL}$ 223' is generated, ringing occurs on the current $i_{LS}$ 222' through the inductor $L_S$, on the current $i_{DL}$ 223' through the laser diode $D_L$, and on the source voltage $V_S$ 224' at the source capacitor $C_S$. As shown, the high-current pulse 223 through the laser diode $D_L$ corresponds to a peak (e.g., maximum, or local maximum, amplitude) current of a resonant waveform of current $i_{DL}$ 223' developed at the anode of the laser diode $D_L$.

As previously described, values of the source capacitor $C_S$, the inductor $L_S$ and the bypass capacitor $C_{BP}$ may be advantageously selected or "tuned" by a designer to meet desired performance criteria of the pulsed laser diode driver disclosed herein. For example, a capacitance value of the bypass capacitor $C_{BP}$ may be selected based on a desired pulse width of the current $i_{DL}$ through the laser diode $D_L$. The plot 207 shows the pulse 223 generated when the capacitance of the bypass capacitor $C_{BP}$ is equal to 1 nF, and a pulse 223" generated when the capacitance of the bypass capacitor $C_{BP}$ is equal to 4 nF. In use cases where a wider pulse, such as the pulse 223", is desired, the source voltage $V_S$ may be raised accordingly. Additionally, in some embodiments, the width of the de-asserted portion of the bypass switch gate driver signal $GATE_{BP}$ 220 is widened to accommodate a wider pulse.

Figure 2A:
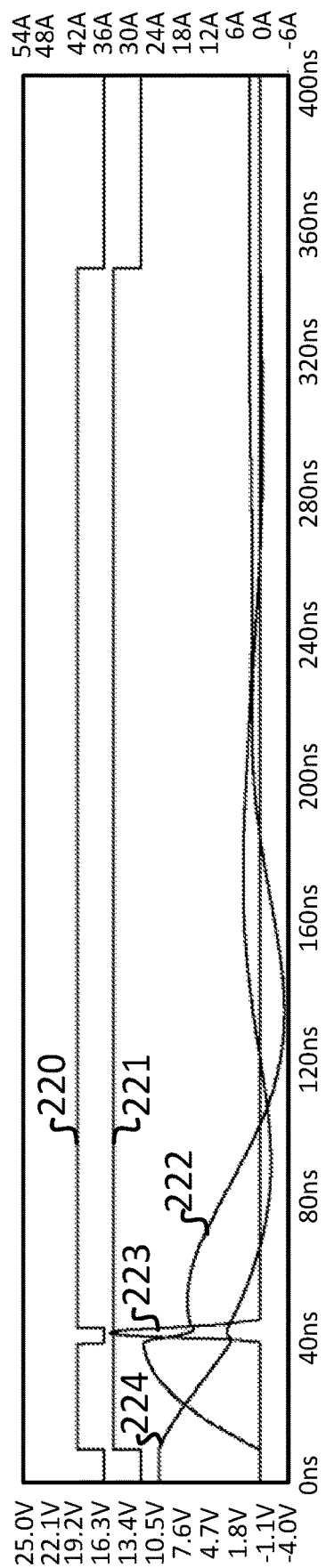
FIGS. 2A-2D show simplified plots of signals related to operation of the pulsed laser diode driver shown in FIG. 1A, in accordance with some embodiments.
Figure 2A:
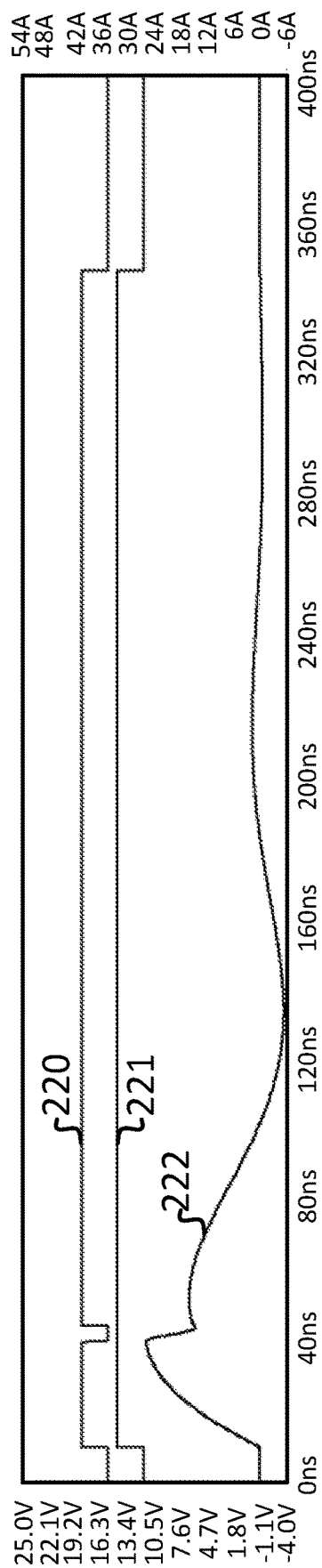
Figure 2B:
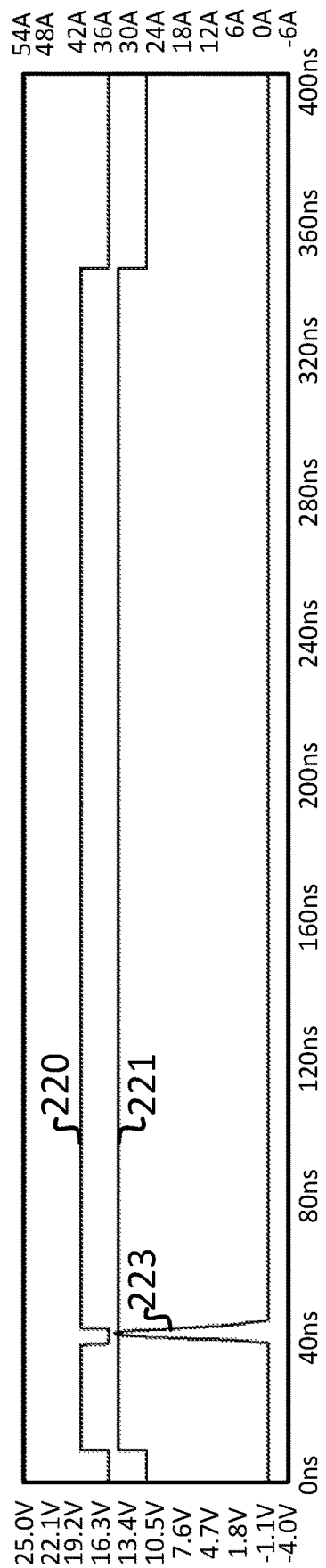
Figure 2B:
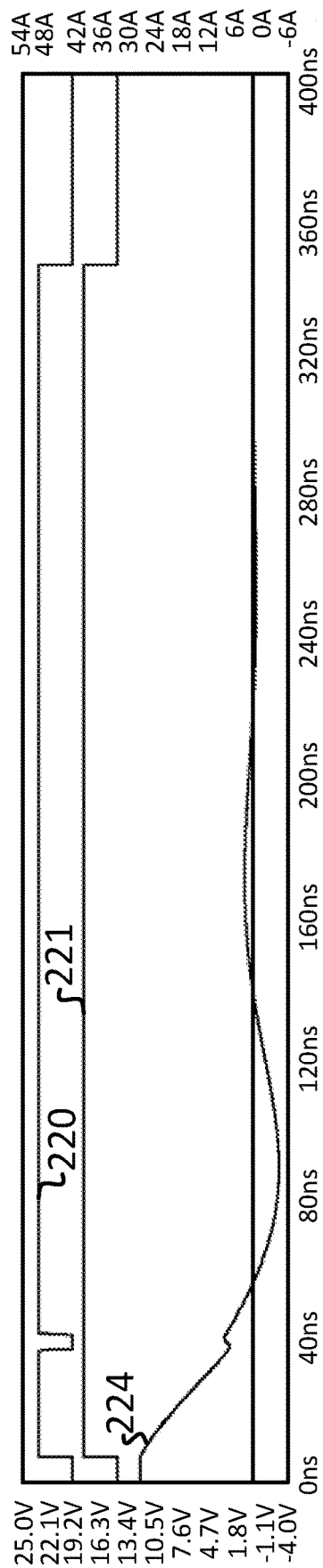
Figure 2C:
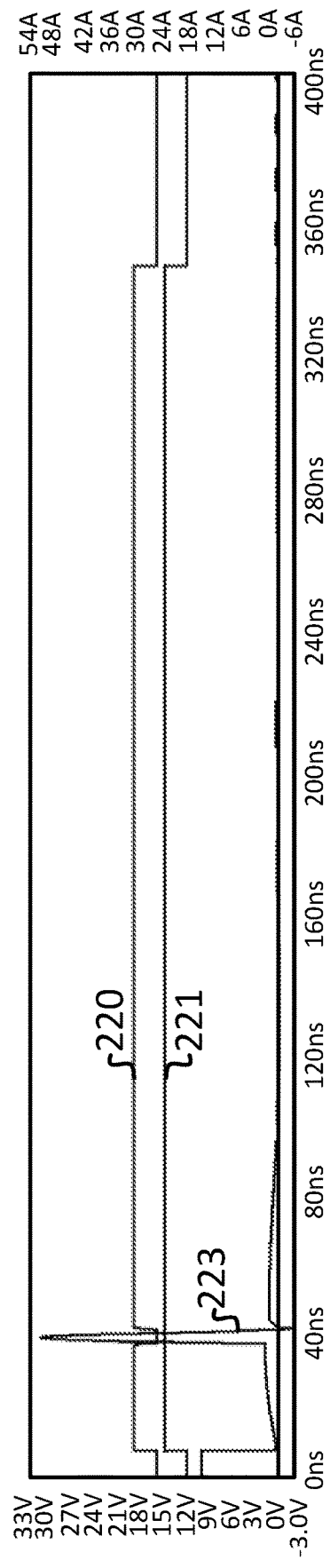
Figure 2C:
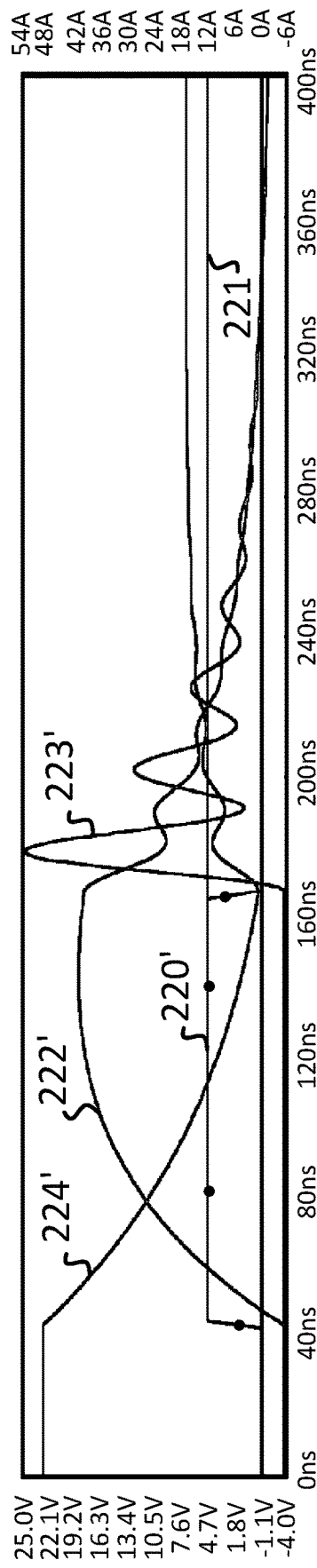
Figure 2D:
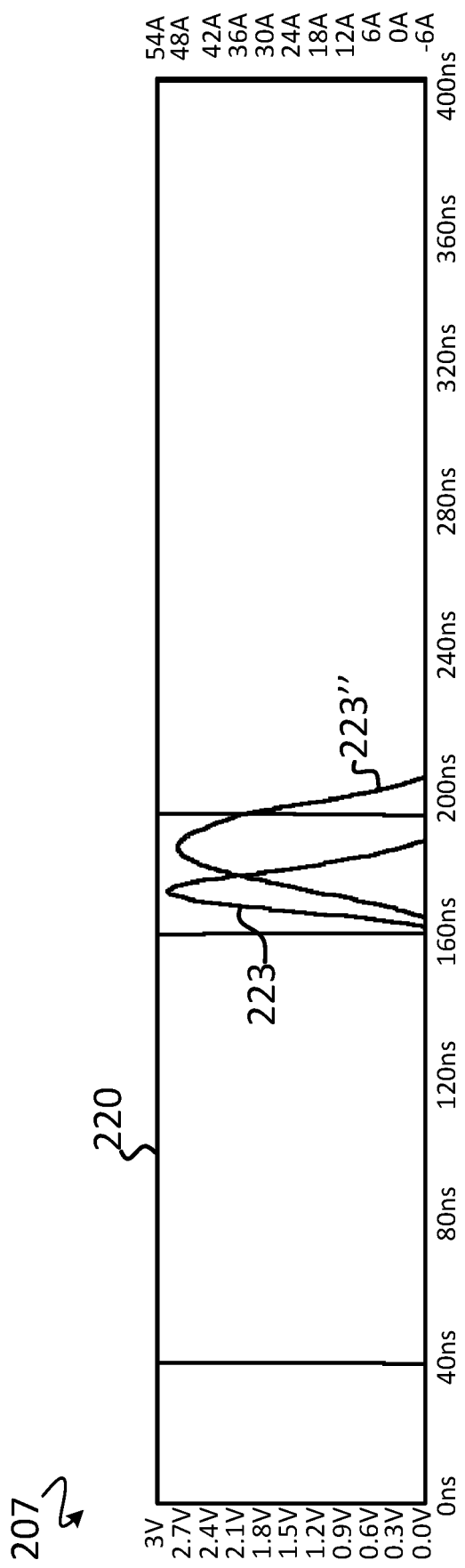
Figure 3:
FIG. 3 is a portion of an example switching sequence for operation of the pulsed laser diode drivers shown in FIGS. 1A-1C, in accordance with some embodiments.

FIG. 3 illustrates a portion of an example switching sequence 300 for operation of the pulsed laser diode drivers 101-103 shown in FIG. 1A-B, in accordance with some embodiments, and as was described with reference to FIGS. 2A-C. However, the switching sequence 300 is similar to, or the same as, respective switching sequences related to the operation of other embodiments of the pulsed laser diode drivers disclosed herein, including but not limited to the pulsed laser diode drivers 401-404, 501-504, 601-604, 701-705, 801-802, and 901-902.

At a precharge step 301, the bypass switch $M_{BP}$ and the laser diode switch $M_{DL}$ are off (i.e., not conducting). During the precharge step 301, the source capacitor $C_S$ is charged through the source resistor $R_S$. At a preflux step 302, the bypass switch $M_{BP}$ and the laser diode switch $M_{DL}$ are transitioned to an ON-state, thereby allowing the current $i_{LS}$ to flow through the inductor $L_S$ to store energy in the form of magnetic flux at the inductor $L_S$. Even though both of the switches ($M_{DL}$, $M_{BP}$) are in an ON-state at the preflux step 302, the bypass path through the bypass switch $M_{BP}$ will carry all of the current $i_{LS}$ because a bandgap voltage of the laser diode $D_L$ needs to be overcome to allow current to flow through the laser diode $D_L$.

In some embodiments, the laser diode switch $M_{DL}$ is transitioned to an ON-state after the bypass switch $M_{BP}$ is transitioned to an ON-state. At a pulse generation step 303, the bypass switch $M_{BP}$ is transitioned to an OFF-state while the laser diode switch $M_{DL}$ is maintained in an ON-state, thereby generating the high-current pulse through the laser diode $D_L$. When the bypass switch $M_{BP}$ is transitioned to the OFF-state, voltage at the anode of the laser diode $D_L$ rises quickly, until the bandgap voltage of the laser diode $D_L$ is overcome and the laser diode $D_L$ begins to conduct current. Because of a resonant circuit formed by the bypass capacitor $C_{BP}$ and the parasitic inductance $L_{DL}$ of the laser diode $D_L$, the voltage formed at the anode of the laser diode $D_L$ will advantageously rise as high as necessary to overcome the bandgap voltage of the laser diode $D_L$ and will generally be higher than the source voltage $V_S$.

At a discharge step 304, the bypass switch $M_{BP}$ and the laser diode switch $M_{DL}$ are maintained in an ON-state to drain charge stored at the source capacitor $C_S$, thereby reducing the current $i_{DL}$ through the parasitic inductance $L_{DL}$ to advantageously eliminate a high voltage spike at the anode of the laser diode $D_L$ when the laser diode switch $M_{DL}$ is transitioned to an OFF-state. At step 305, the bypass switch $M_{BP}$ and the laser diode switch $M_{DL}$ are transitioned to an OFF-state, thereby returning to the precharge state at step 301. Because the source voltage $V_S$ at the source capacitor $C_S$ is completely discharged at the end of the discharge step 304, there is very little current through the laser diode $D_L$. Thus, there is advantageously very little overshoot when the switches $M_{DL}$, $M_{BP}$ are transitioned to the OFF-state at step 305, thereby preventing damage to the laser diode $D_L$ and the switches $M_{DL}$, $M_{BP}$. The time interval of the overall pulse and bypass signals is selected, in some embodiments, such that the source capacitor $C_S$ is fully discharged before the switches $M_{DL}$, $M_{BP}$ are transitioned to the OFF-state at step 305.

Other topologies of pulsed laser drivers, having the same or similar advantages and having similar operation as that of the pulsed laser diode drivers 101-103, are disclosed below. The example topologies disclosed herein are not an exhaustive list of possible topologies that have the same or similar advantages and similar operation as that of the pulsed laser diode drivers 101-103. For example, one of skill in the art will appreciate that some modifications can be made while still adhering to the general principle of operation disclosed herein. Such modifications include placement of the bypass capacitor $C_{BP}$, component values, and the addition of serially connected components that provide a DC current path.

FIGS. 4A-D are simplified circuit schematics of pulsed laser diode drivers 401-404 of a second general topology that is configured to drive two or more laser diodes in a common anode arrangement, in accordance with some embodiments. The pulsed laser diode drivers 401-404 each generally include the source resistor $R_S$, the source capacitor $C_S$, the damping resistor $R_{Damp}$, the inductor $L_S$, the bypass capacitor $C_{BP}$, two or more laser diodes $D_L^1$-$D_L^n$, and the bypass switch $M_{BP}$. The pulsed laser diode drivers 401-402 each include two or more laser diode switches $M_{DL}^1$-$M_{DL}^n$, whereas the pulsed laser diode drivers 403-404 include a single laser diode switch $M_{DL}^1$.

Also shown is the controller 120, nodes 410, 412, respective parasitic inductances $L_{DL}^1$-$L_{DL}^n$ of the laser diodes $D_L^1$-$D_L^n$, the DC input voltage $V_{in}$, the source voltage $V_S$ at the source capacitor $C_S$, the current $i_{LS}$ through the inductor $L_S$, respective currents $i_{DL}^1$-$i_{DL}^n$ through the laser diodes $D_L^1$-$D_L^n$, and the bypass switch gate driver signal $GATE_{BP}$. The pulsed laser diode drivers 401-402 each utilize respective laser diode switch gate driver signals $GATED_{DL}^1$-$GATE_{DL}^n$, whereas the pulsed laser diode drivers 403-404 use a single laser diode switch gate driver signal $GATE_{DL}^1$. Electrical connections of the pulsed laser diode drivers 401-404 are similar to, or the same as, those described with respect to the pulsed laser diode drivers 101-103. Topologies of the pulsed laser diode drivers 401-404 vary with respect to the placement of the bypass capacitor $C_{BP}$.

Figure 4A:
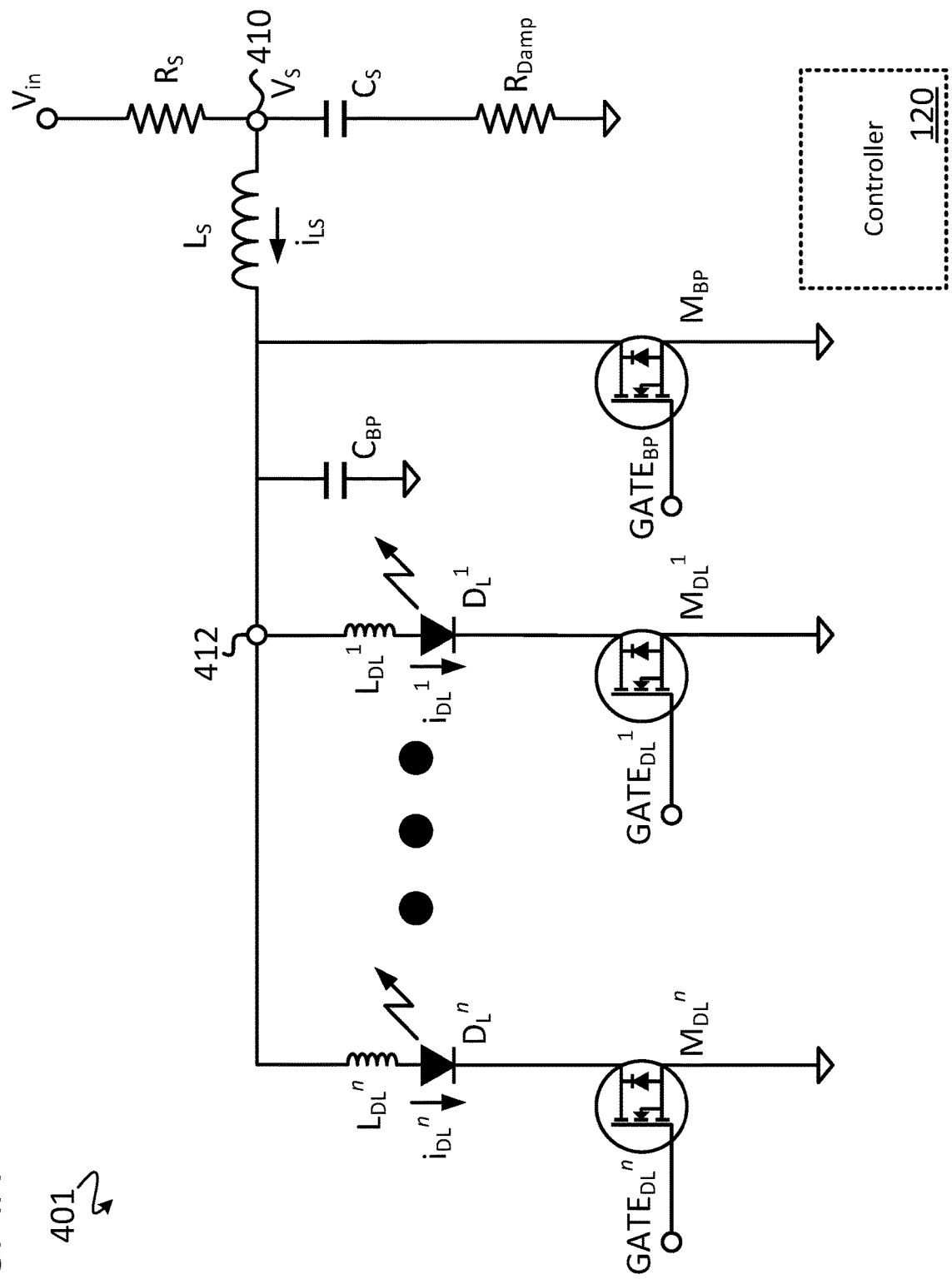
FIGS. 4A-4D are simplified circuit schematics of pulsed laser diode drivers of a second general topology, in accordance with some embodiments.
Figure 4B:
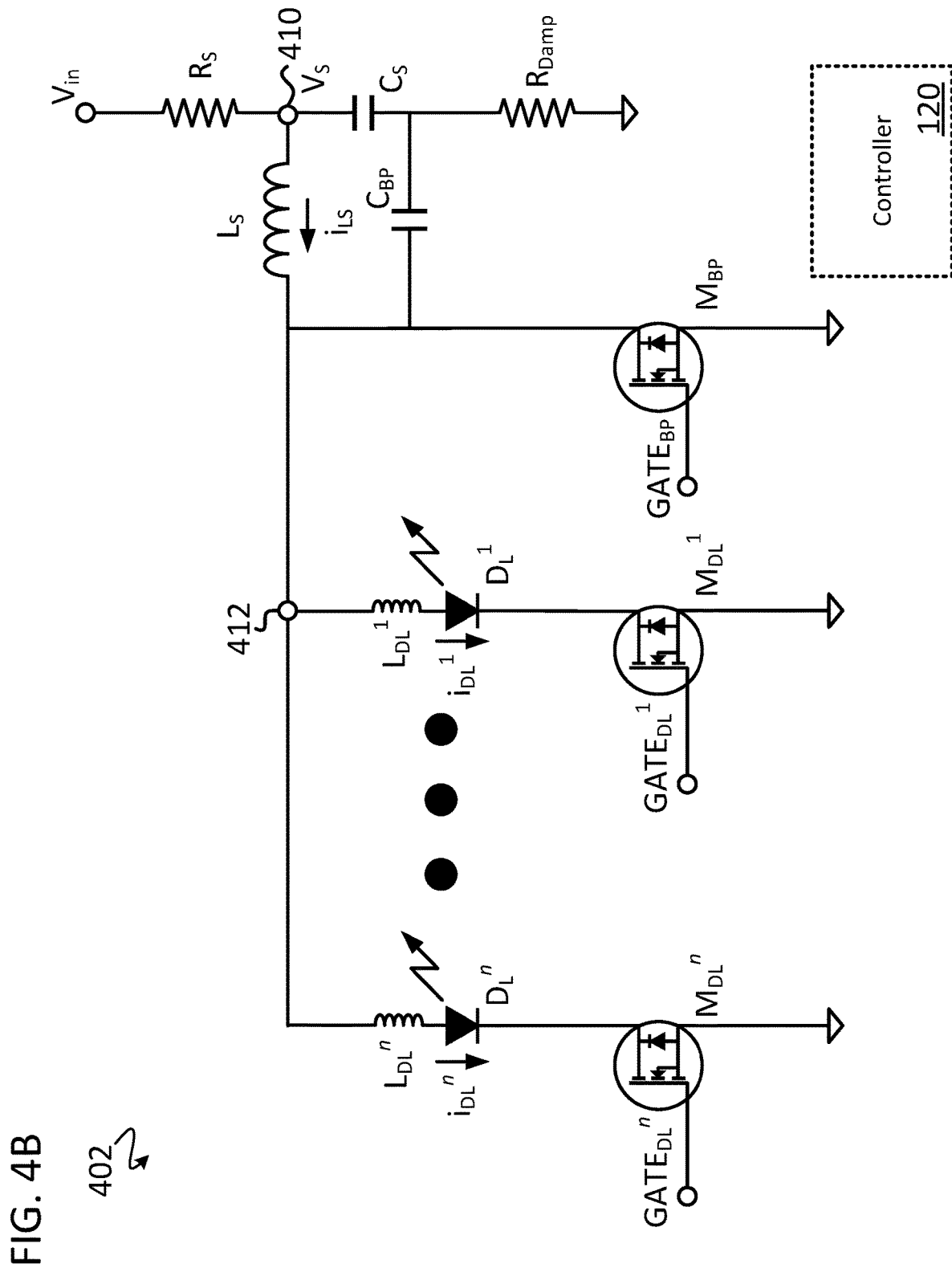
Figure 4C:
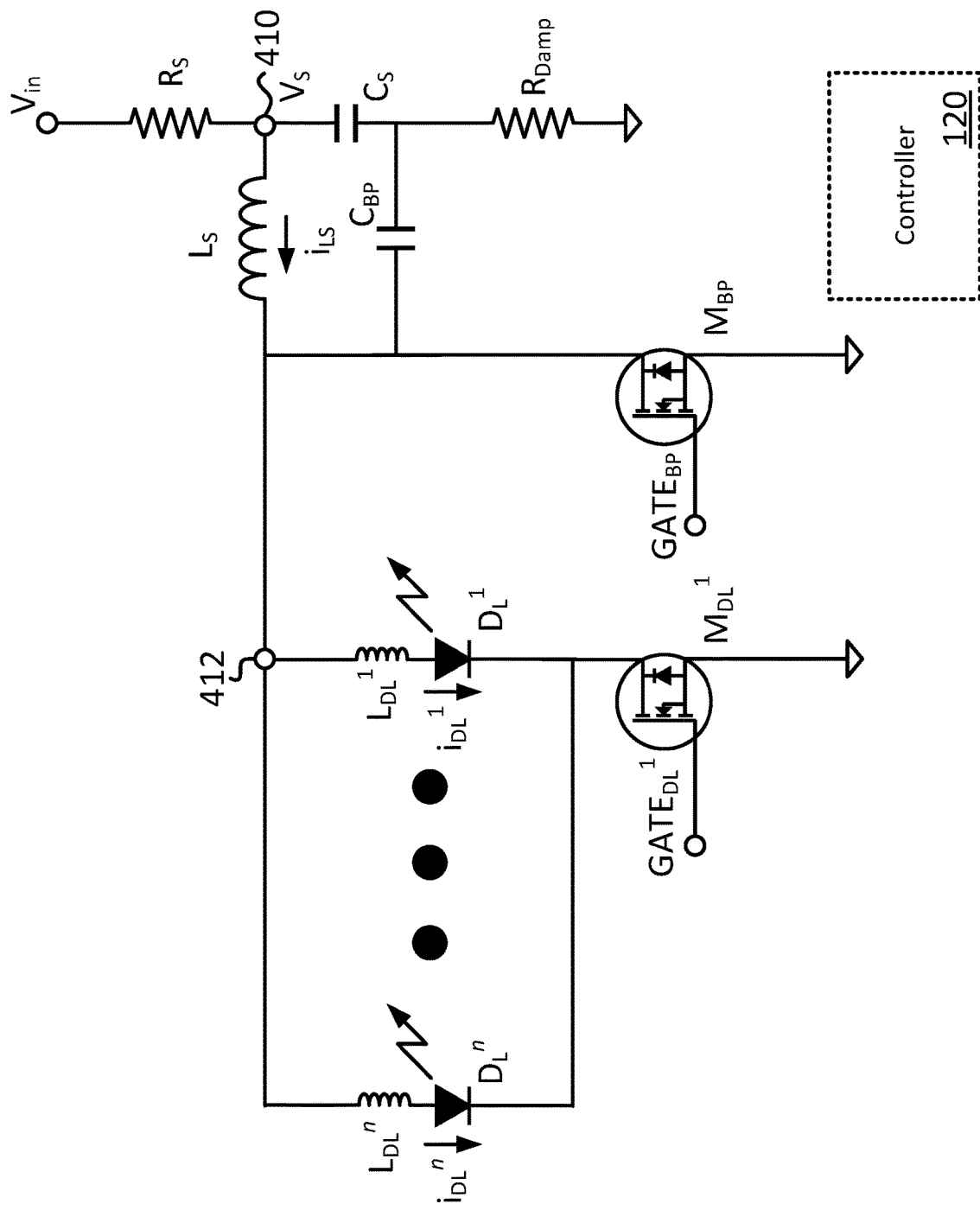
Figure 4D:
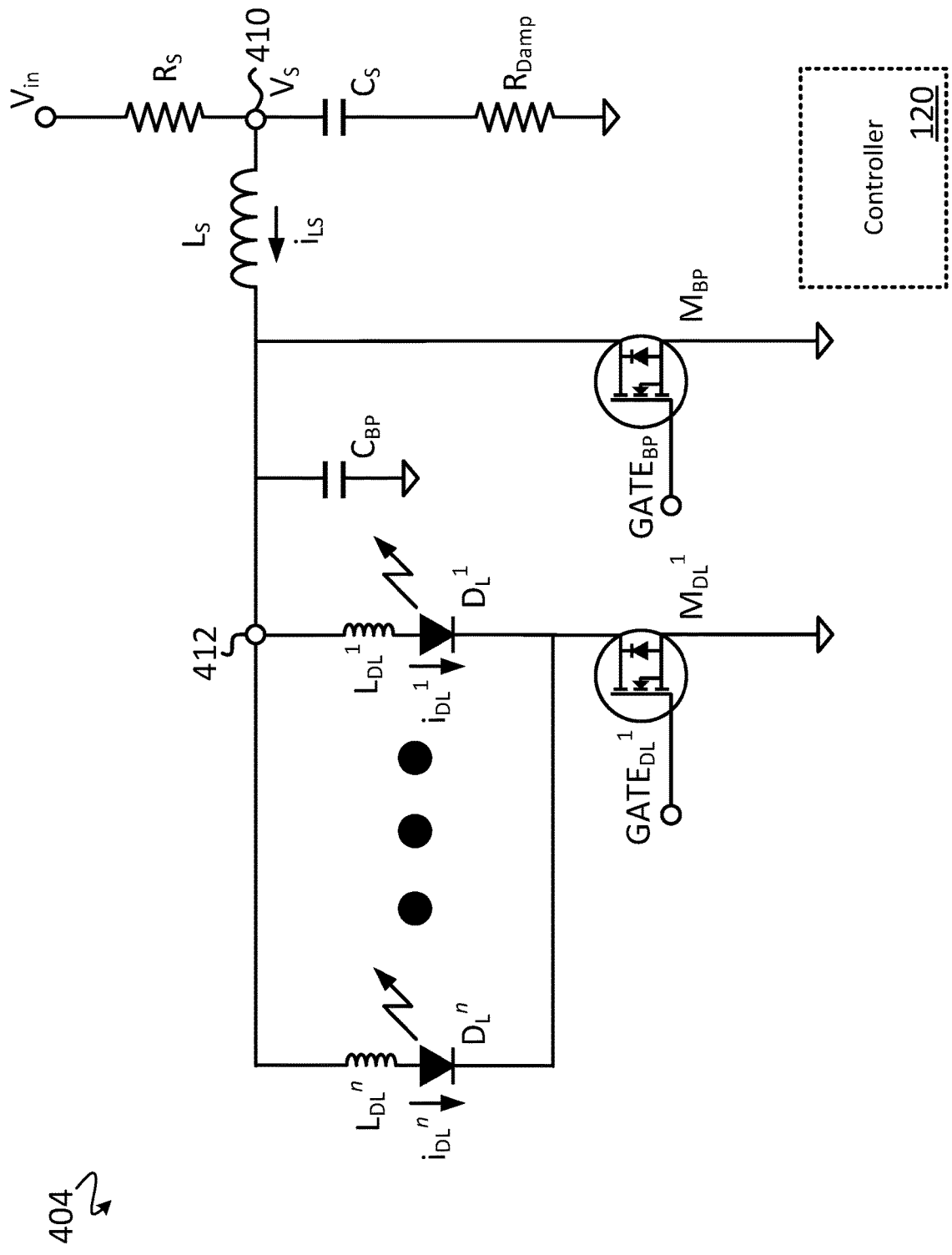

As shown in the simplified circuit schematics of the pulsed laser diode driver 401 of FIG. 4A and the pulsed laser diode driver 404 of FIG. 4D, in some embodiments the first terminal of the bypass capacitor $C_{BP}$ is directly electrically connected to the second terminal of the inductor $L_S$ and to the anodes of the laser diodes $D_L^1$-$D_L^n$. In such embodiments, the second terminal of the bypass capacitor $C_{BP}$ is directly electrically connected to the bias voltage node. As shown in the simplified circuit schematic of the pulsed laser diode drivers 402-403 of FIGS. 4B-C, in some embodiments the first terminal of the bypass capacitor $C_{BP}$ is directly electrically connected to the second terminal of the inductor $L_S$ and to the respective anodes of the laser diodes $D_L^1$-$D_L^n$. In such embodiments, the second terminal of the bypass capacitor $C_{BP}$ is directly electrically connected to the second terminal of the source capacitor $C_S$ and to the first terminal of the damping resistor $R_{Damp}$. In some embodiments, values of the DC input voltage $V_{in}$, inductance of the inductor $L_S$, capacitance of the source capacitor $C_S$, resistance of the damping resistor $R_{Damp}$, and capacitance of the bypass capacitor $C_{BP}$ are similar to, or the same as, those respective values as described with reference to the pulsed laser diode drivers 101-103. However, the values of the DC input voltage $V_{in}$, inductance of the inductor $L_S$, capacitance of the source capacitor $C_S$, resistance of the damping resistor $R_{Damp}$, and capacitance of the bypass capacitor $C_{BP}$ can advantageously be selected to achieve desired operation of the pulsed laser diode drivers 401-404 (e.g., a charge time, a pulse width, a pulse voltage, a pulse current level). Operation of the pulsed laser diode drivers 401-404 is similar to, or the same as, operation of the pulsed laser diode drivers 101-103 as explained in detail with respect to the simplified plots 201-206 of FIGS. 2A-D, as well as the example switching sequence 300 shown in FIG. 3.

In some embodiments, the controller 120 is configured to determine how many of the laser diodes $D_L^1$-$D_L^n$ are enabled simultaneously and to adjust a voltage level of the DC input voltage $V_{in}$ in accordance with that determination to supply a required amount of current (e.g., using a digitally adjustable voltage source (described below) controlled by a digital control signal from the controller 120).

FIGS. 5A-D are simplified circuit schematics of pulsed laser diode drivers 501-504 of a third general topology that is configured to drive a laser diode using a high-side switch, in accordance with some embodiments. The pulsed laser diode drivers 501-504 each generally include the source resistor $R_S$, the source capacitor $C_S$, the damping resistor $R_{Damp}$, the inductor $L_S$, the bypass capacitor $C_{BP}$, the laser diode $D_L$, the bypass switch $M_{BP}$, and the laser diode switch $M_{DL}$. The laser diode switch $M_{DL}$ is configured as a high-side switch.

Also shown is the controller 120, nodes 510, 512, the parasitic inductance $L_{DL}$ of the laser diode $D_L$, the DC input voltage $V_{in}$, the source voltage $V_S$ at the source capacitor $C_S$, the current $i_{LS}$ through the inductor $L_S$, the current $i_{DL}$ through the laser diode $D_L$, the bypass switch gate driver signal $GATE_{BP}$, and the laser diode switch gate driver signal $GATE_{DL}$. Most of the electrical connections of the pulsed laser diode drivers 501-504 are similar to, or the same as, those described with respect to the pulsed laser diode drivers 101-103. However, in contrast to the low-side configuration of the pulsed laser diode drivers 101-103, the drain node of the laser diode switch $M_{DL}$ is directly electrically connected to the second terminal of the inductor $L_S$ and to the drain node of the bypass switch $M_{BP}$. The source node of the laser diode switch $M_{DL}$ is directly electrically connected to the anode of the laser diode $D_L$, and the cathode of the laser diode $D_L$ is directly electrically connected to the bias voltage node. Topologies of the pulsed laser diode drivers 501-504 vary with respect to placement of the bypass capacitor $C_{BP}$.

Figure 5A:
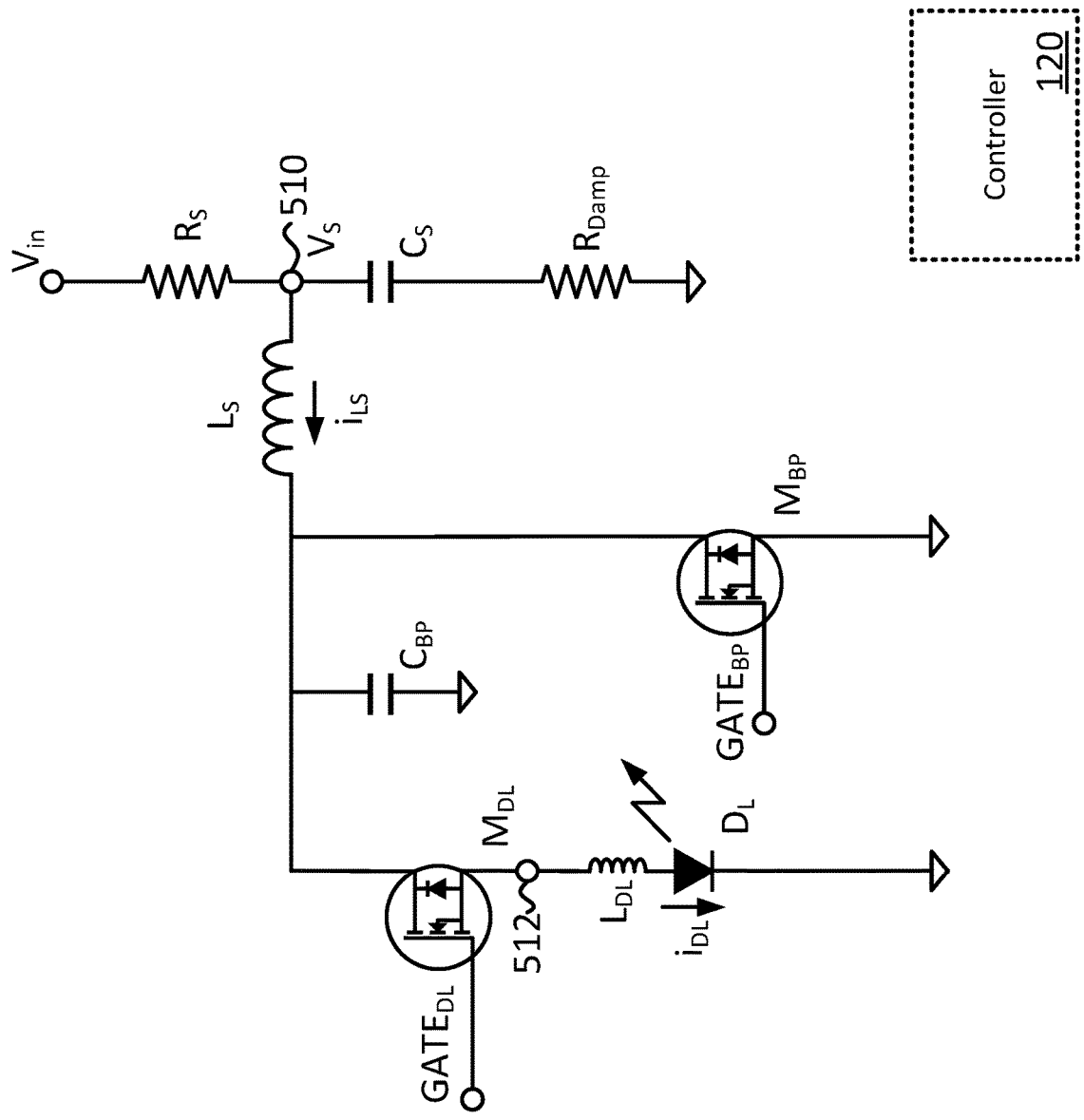
FIGS. 5A-5D are simplified circuit schematics of pulsed laser diode drivers of a third general topology, in accordance with some embodiments.
Figure 5B:
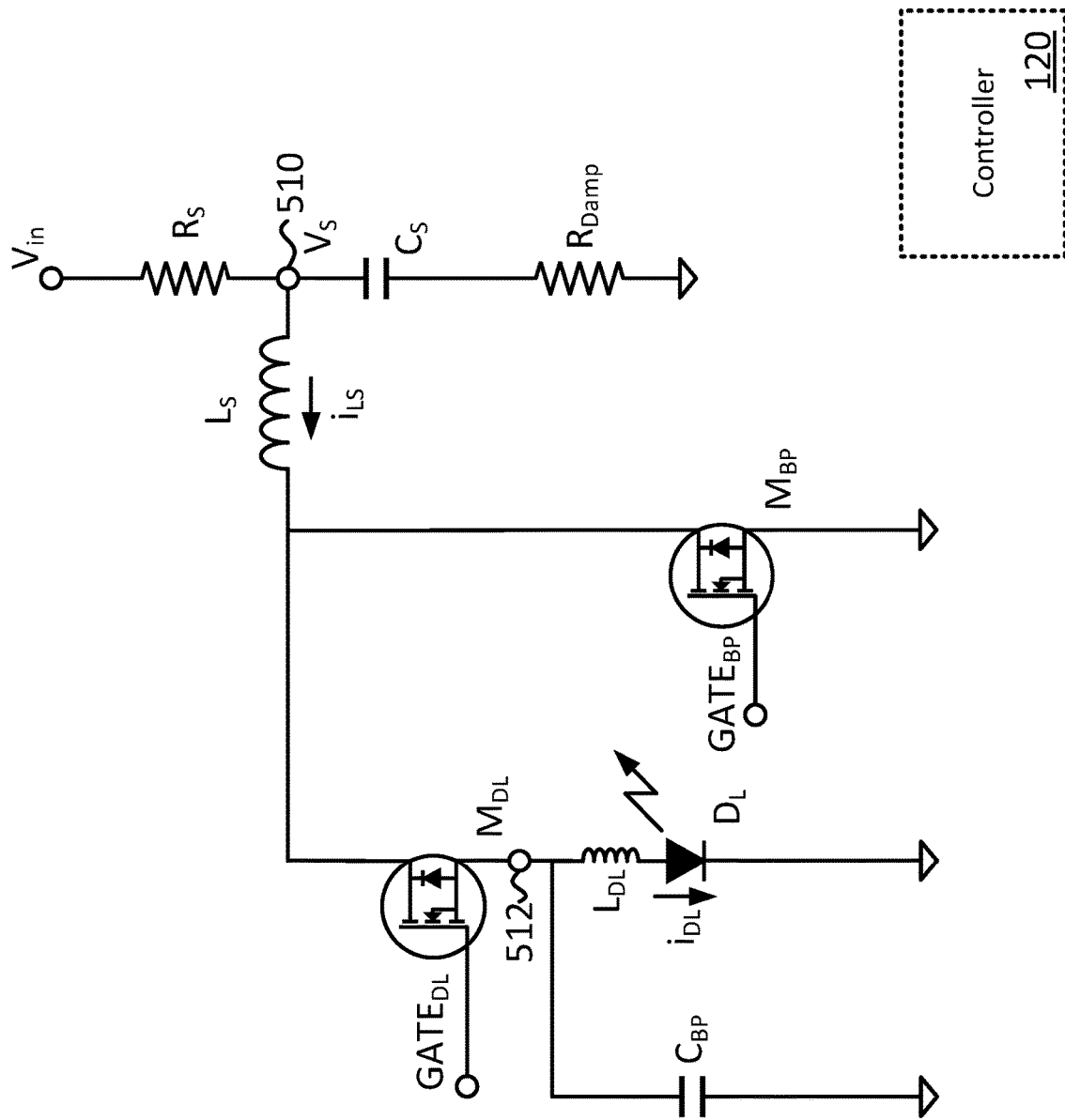
Figure 5C:
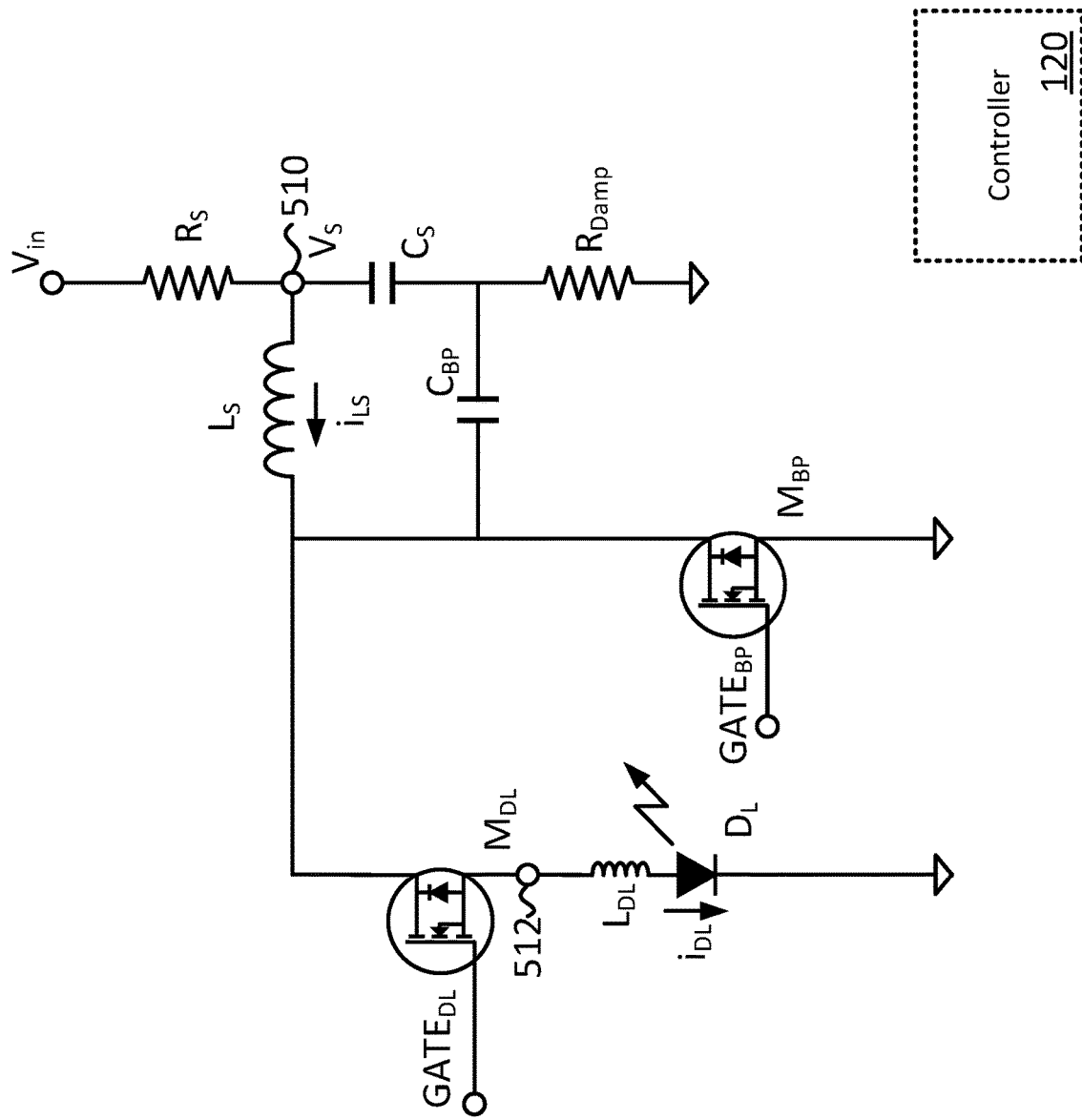

As shown in the simplified circuit schematic of the pulsed laser diode driver 501 of FIG. 5A, in some embodiments the first terminal of the bypass capacitor $C_{BP}$ is directly electrically connected to the second terminal of the inductor $L_S$ and to the drain node of the laser diode switch $M_{DL}$. In such embodiments, the second terminal of the bypass capacitor $C_{BP}$ is directly electrically connected to the bias voltage node. As shown in the simplified circuit schematic of the pulsed laser diode driver 502 of FIG. 5B, in some embodiments the first terminal of the bypass capacitor $C_{BP}$ is directly electrically connected to the source node of the laser diode switch $M_{DL}$ and to the anode of the laser diode $D_L$. In such embodiments, the second terminal of the bypass capacitor $C_{BP}$ is directly electrically connected to the bias voltage node. As shown in the simplified circuit schematic of the pulsed laser diode driver 503 of FIG. 5C, in some embodiments the first terminal of the bypass capacitor $C_{BP}$ is directly electrically connected to the second terminal of the inductor $L_S$, to the drain node of the bypass switch $M_{BP}$, and to the drain node of the laser diode switch $M_{DL}$. In such embodiments, the second terminal of the bypass capacitor $C_{BP}$ is directly electrically connected to the second terminal of the source capacitor $C_S$ and to the first terminal of the damping resistor $R_{Damp}$. As shown in the simplified circuit schematic of the pulsed laser diode driver 504 of FIG. 5D, in some embodiments the first terminal of the bypass capacitor $C_{BP}$ is directly electrically connected to the source node of the laser diode switch $M_{DL}$ and the anode of the laser diode $D_L$. In such embodiments, the second terminal of the bypass capacitor $C_{BP}$ is directly electrically connected to the second terminal of the source capacitor $C_S$ and to the first terminal of the damping resistor $R_{Damp}$.

FIGS. 6A-D are simplified circuit schematics of pulsed laser diode drivers 601-604 of a fourth general topology that is configured to drive two or more laser diodes in a common cathode configuration using a high-side switch, in accordance with some embodiments. The pulsed laser diode drivers 601-604 each generally include the source resistor $R_S$, the source capacitor $C_S$, the damping resistor $R_{Damp}$, the inductor $L_S$, the bypass capacitor $C_{BP}$, the bypass switch $M_{BP}$, two or more laser diodes $D_L^1$-$D_L^n$, and two or more respective laser diode switches $M_{DL}^1$-$M_{DL}^n$.

Also shown is the controller 120, nodes 610, 612, 614, respective parasitic inductances $L_{DL}^1$-$L_{DL}^n$ of the laser diodes $D_L^1$-$D_L^n$, the DC input voltage $V_{in}$, the source voltage $V_S$ at the source capacitor $C_S$, the current $i_{LS}$ through the inductor $L_S$, respective currents $i_{DL}^1$-$i_{DL}^n$ through the laser diodes $D_L^1$-$D_L^n$, the bypass switch gate driver signal $GATE_{BP}$, and respective laser diode switch gate driver signals $GATE_{DL}^1$-$GATE_{DL}^n$ of the laser diode switches $M_{DL}^1$-$M_{DL}^n$.

Most of the electrical connections of the pulsed laser diode drivers 601-604 are similar to, or are the same as, those described with respect to the pulsed laser diode drivers 501-504. However, topologies of the pulsed laser diode drivers 601-604 vary from one another with respect to placement of the bypass capacitor $C_{BP}$.

Figure 6A:
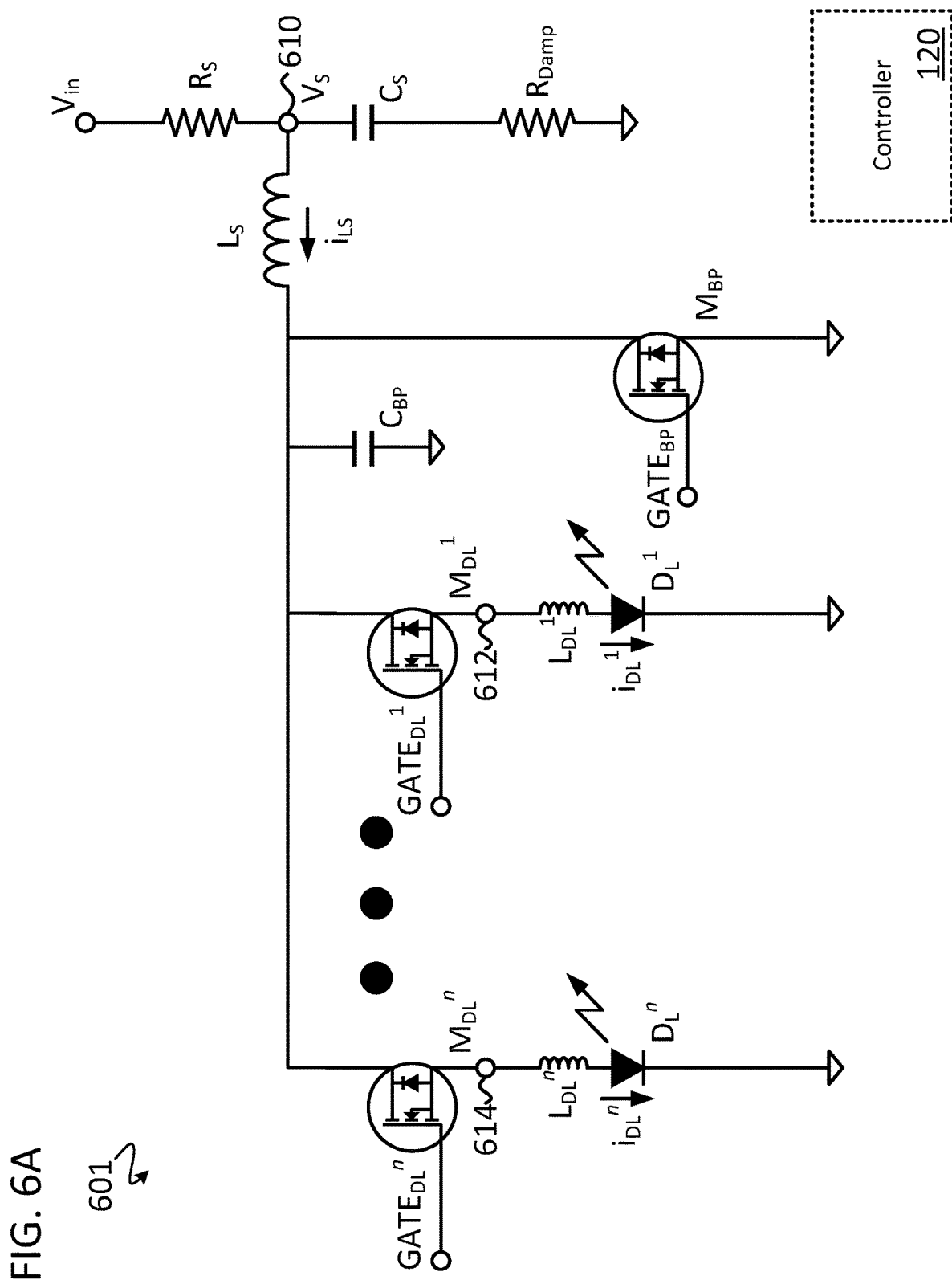
FIGS. 6A-6D are simplified circuit schematics of pulsed laser diode drivers of a fourth general topology, in accordance with some embodiments.
Figure 6B:
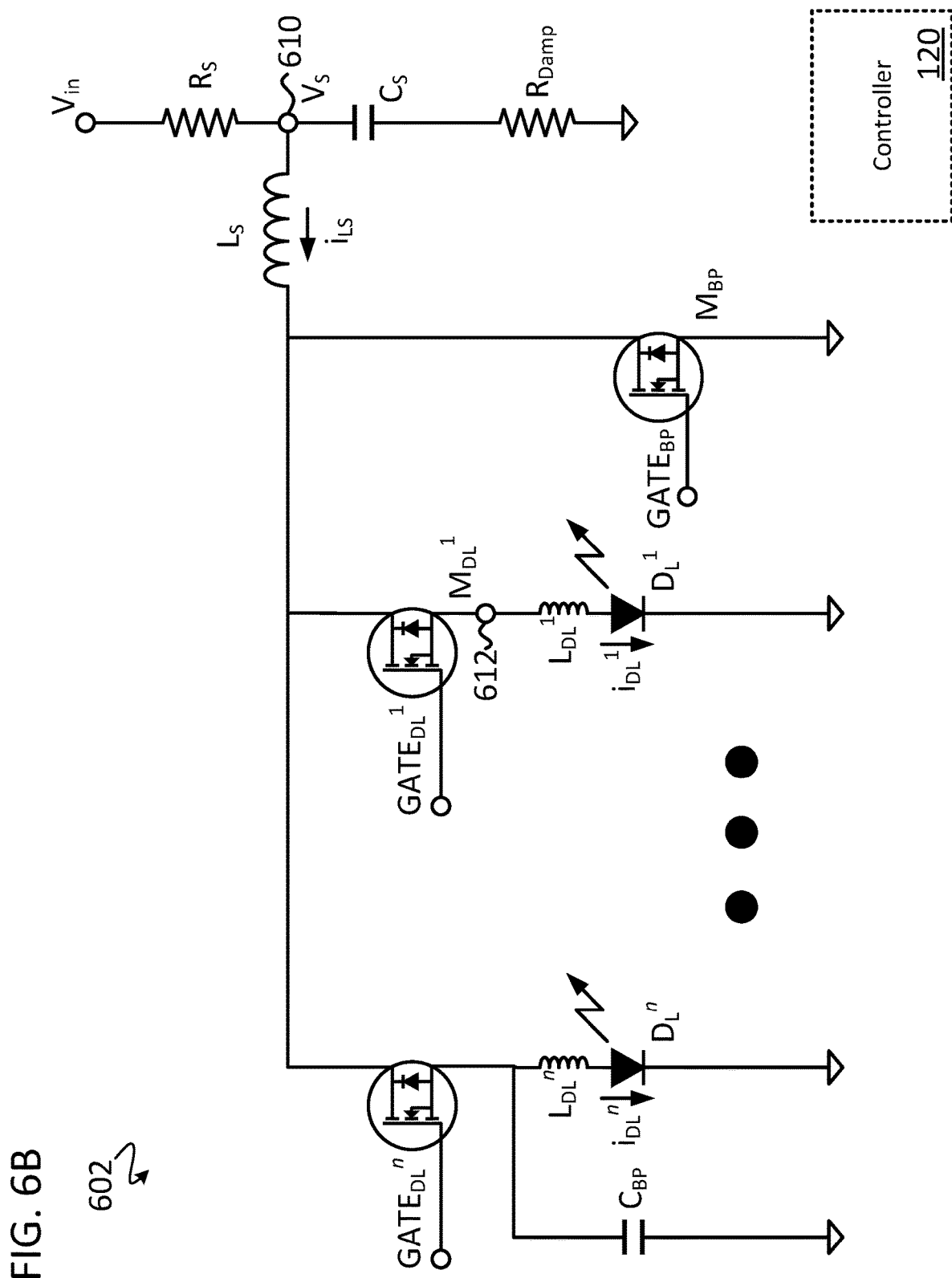
Figure 6C:
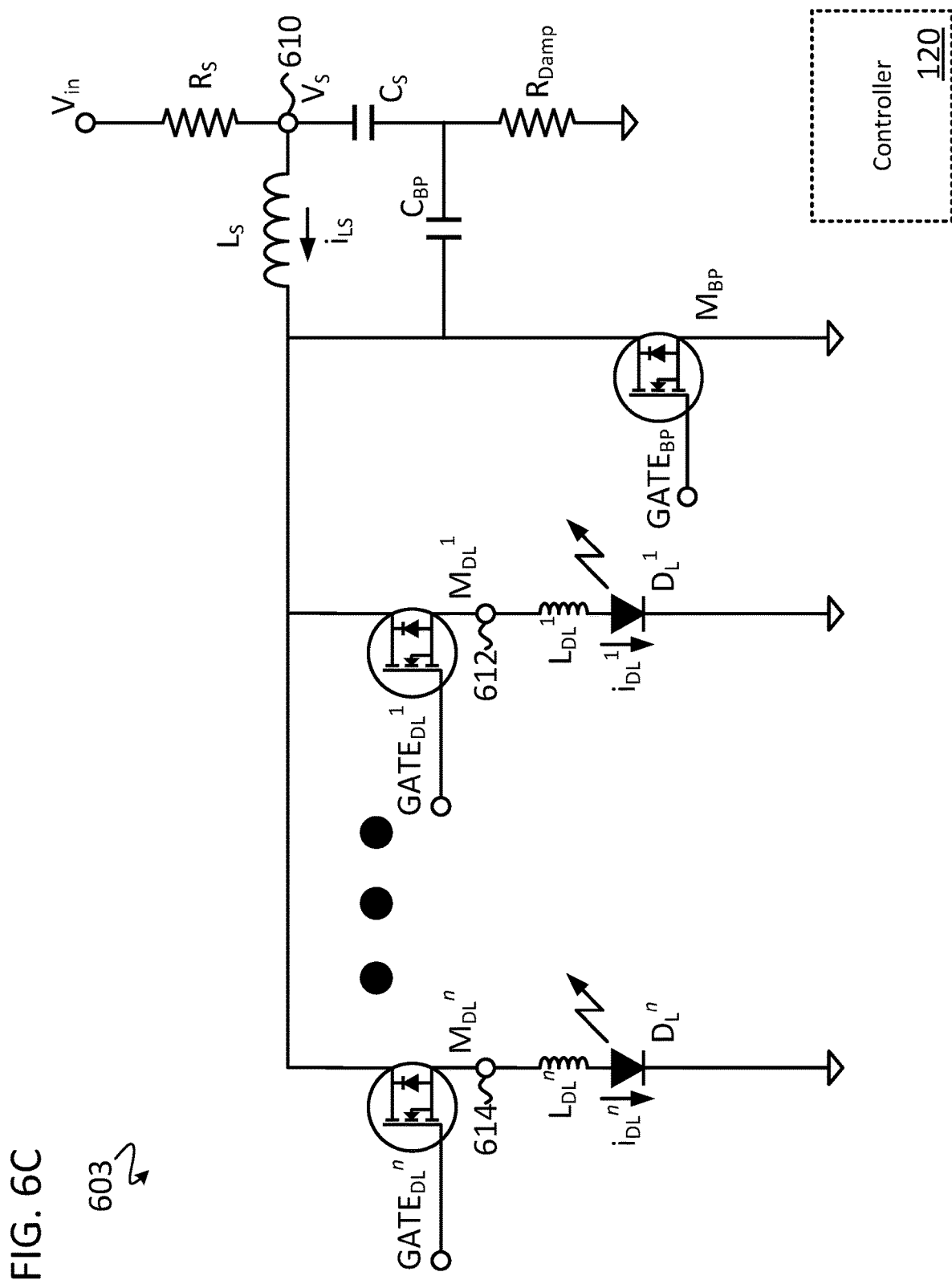

As shown in the simplified circuit schematic of the pulsed laser diode driver 601 of FIG. 6A, in some embodiments the first terminal of the bypass capacitor $C_{BP}$ is directly electrically connected to the second terminal of the inductor $L_S$ and to respective drain nodes of the laser diode switches $M_{DL}^1$-$M_{DL}^n$ and the bypass switch $M_{BP}$. In such embodiments, the second terminal of the bypass capacitor $C_{BP}$ is directly electrically connected to the bias voltage node. As shown in the simplified circuit schematic of the pulsed laser diode driver 602 of FIG. 6B, in some embodiments the first terminal of the bypass capacitor $C_{BP}$ is directly electrically connected to the source node of any of the laser diode switches ($M_{DL}^n$ is shown) and to the anode of the laser diode coupled to that laser diode switch ($D_L^n$ is shown). In such embodiments, the second terminal of the bypass capacitor $C_{BP}$ is directly electrically connected to the bias voltage node. In some embodiments, multiple bypass capacitors $C_{BP}$ may be used, each of the bypass capacitors being connected across a respective laser diode. As shown in the simplified circuit schematic of the pulsed laser diode driver 603 of FIG. 6C, in some embodiments the first terminal of the bypass capacitor $C_{BP}$ is directly electrically connected to the second terminal of the inductor $L_S$ and to respective drain nodes of the laser diode switches $M_{DL}^1$-$M_{DL}^n$ and the bypass switch $M_{BP}$. In such embodiments, the second terminal of the bypass capacitor $C_{BP}$ is directly electrically connected to the second terminal of the source capacitor $C_S$ and to the first terminal of the damping resistor $R_{Damp}$. As shown in the simplified circuit schematic of the pulsed laser diode driver 604 of FIG. 6D, in some embodiments the first terminal of the bypass capacitor $C_{BP}$ is directly electrically connected to the source node of any of the laser diode switches ($M_{DL}^1$ is shown) and to the anode of the laser diode coupled to that laser diode switch ($D_L^1$ is shown). In such embodiments, the second terminal of the bypass capacitor $C_{BP}$ is directly electrically connected to the second terminal of the source capacitor $C_S$ and to the first terminal of the damping resistor $R_{Damp}$. In some embodiments, multiple bypass capacitors $C_{BP}$ are be used, each of the bypass capacitors $C_{BP}$ having a first terminal that is directly electrically connected to a respective anode of each laser diode and a second terminal that is directly electrically connected to the second terminal of the source capacitor $C_S$ and to the first terminal of the damping resistor $R_S$.

In some embodiments, the controller 120 is operable to determine how many of the laser diodes $D_L^1$-$D_L^n$ are enabled simultaneously and to adjust a voltage level of the DC input voltage $V_{in}$ in accordance with that determination to supply a required amount of current (e.g., using a digitally adjustable voltage source (described below) controlled by a digital control signal from the controller 120).

FIGS. 7A-E are simplified circuit schematics of pulsed laser diode drivers 701-705 of a fifth general topology that is configured to drive a laser diode using a half-bridge configuration, in accordance with some embodiments. The pulsed laser diode drivers 701-704 each generally include the source resistor $R_S$, the source capacitor $C_S$, the damping resistor $R_{Damp}$, the inductor $L_S$, the bypass capacitor $C_{BP}$, the bypass switch $M_{BP}$, the laser diode $D_L$, and the laser diode switch $M_{DL}$. The pulsed laser diode driver 705 additionally includes two or more laser diodes $D_L^1$-$D_L^n$, rather than the single laser diode $D_L$, each of the two or more laser diodes $D_L^1$-$D_L^n$ having a respective parasitic inductance $L_{DL}^1$-$L_{DL}^n$, and respective current representation $i_{DL}^1$-$i_{DL}^n$. However, the pulsed laser diode driver 705 lacks independent control of the two or more laser diodes $D_L^1$-$D_L^n$.

Also shown is the controller 120, nodes 710, 712, the parasitic inductance $L_{DL}$ of the laser diode $D_L$, the DC input voltage $V_{in}$, the source voltage $V_S$ at the source capacitor $C_S$, the current $i_{LS}$ through the inductor $L_S$, the current $i_{DL}$ through the laser diode $D_L$, the currents $i_{DL}^1$-$i_{DL}^n$ through the two or more laser diodes $D_L^1$-$D_L^n$, the bypass switch gate driver signal $GATE_{BP}$, and the laser diode switch gate driver signal $GATE_{DL}$ of the laser diode switch $M_{DL}$.

Most of the electrical connections of the pulsed laser diode drivers 701-704 are similar to, or the same as those described with respect to the pulsed laser diode drivers 501-503. However, in contrast to the high-side configuration of the pulsed laser diode drivers 501-503, the drain node of the bypass switch $M_{BP}$ is directly electrically connected to the source node of the laser diode switch $M_{DL}$ and to the anode of the laser diode $D_L$. The source node of the bypass switch $M_{BP}$ is directly electrically connected to the bias voltage node. Thus, as shown in the simplified circuit schematics of the pulsed laser diode drivers 701-704, the laser diode $D_L$ may be driven by the half-bridge configuration of the bypass switch $M_{BP}$ and the laser diode switch $M_{DL}$. Topologies of the pulsed laser diode drivers 701-704 vary with respect to placement of the bypass capacitor $C_{BP}$.

Figure 7A:
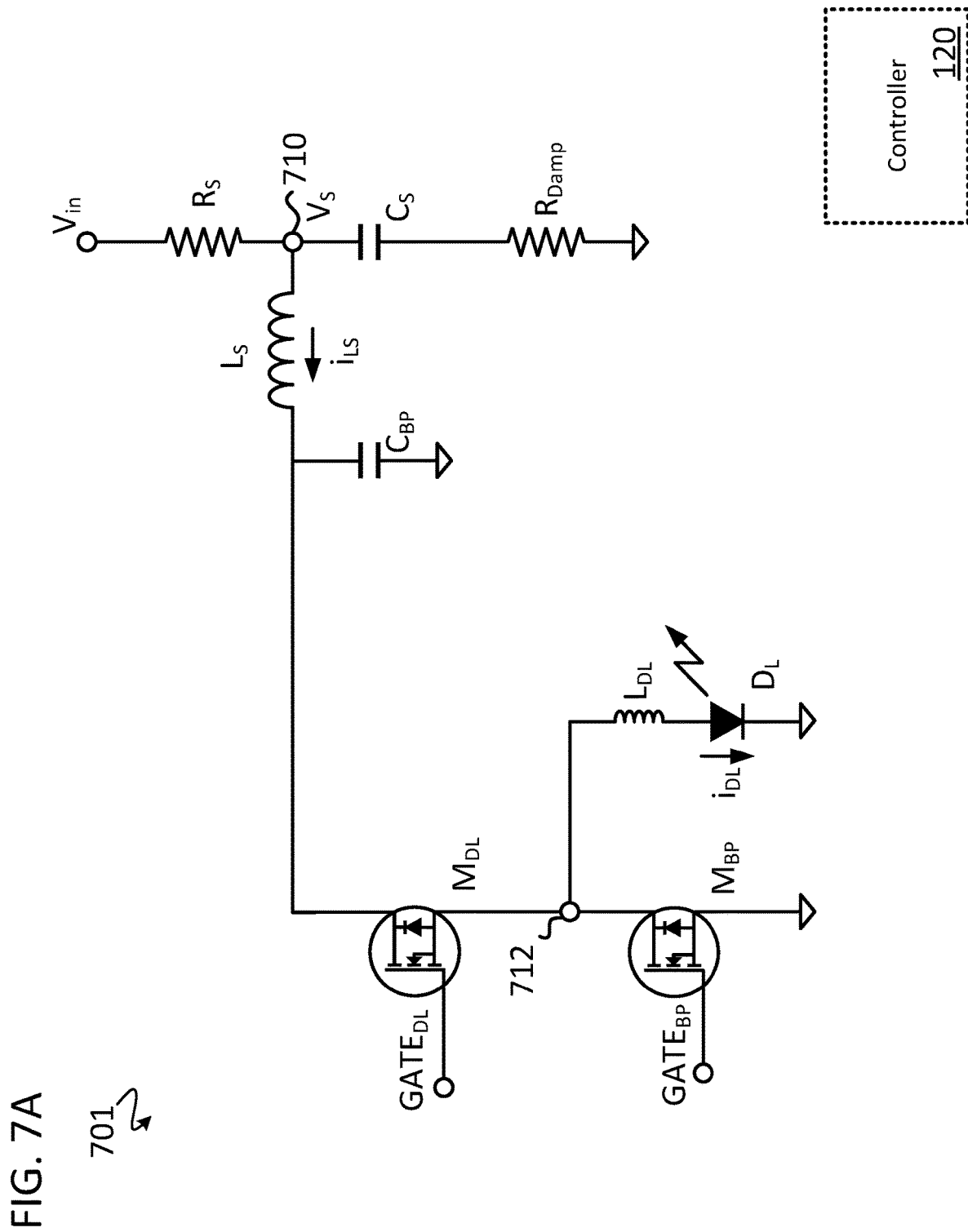
FIGS. 7A-7E are simplified circuit schematics of pulsed laser diode drivers of a fifth general topology, in accordance with some embodiments.
Figure 7B:
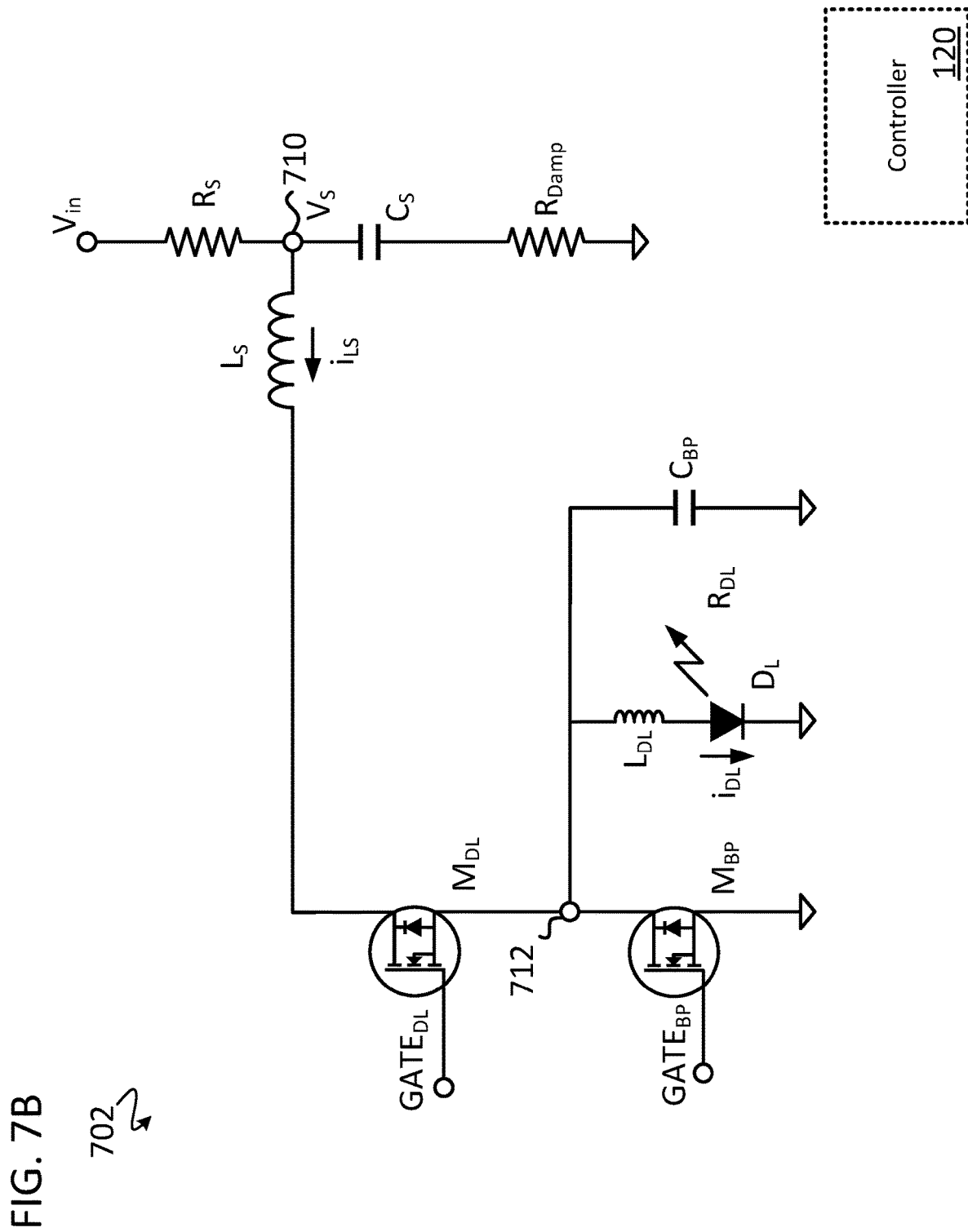
Figure 7C:
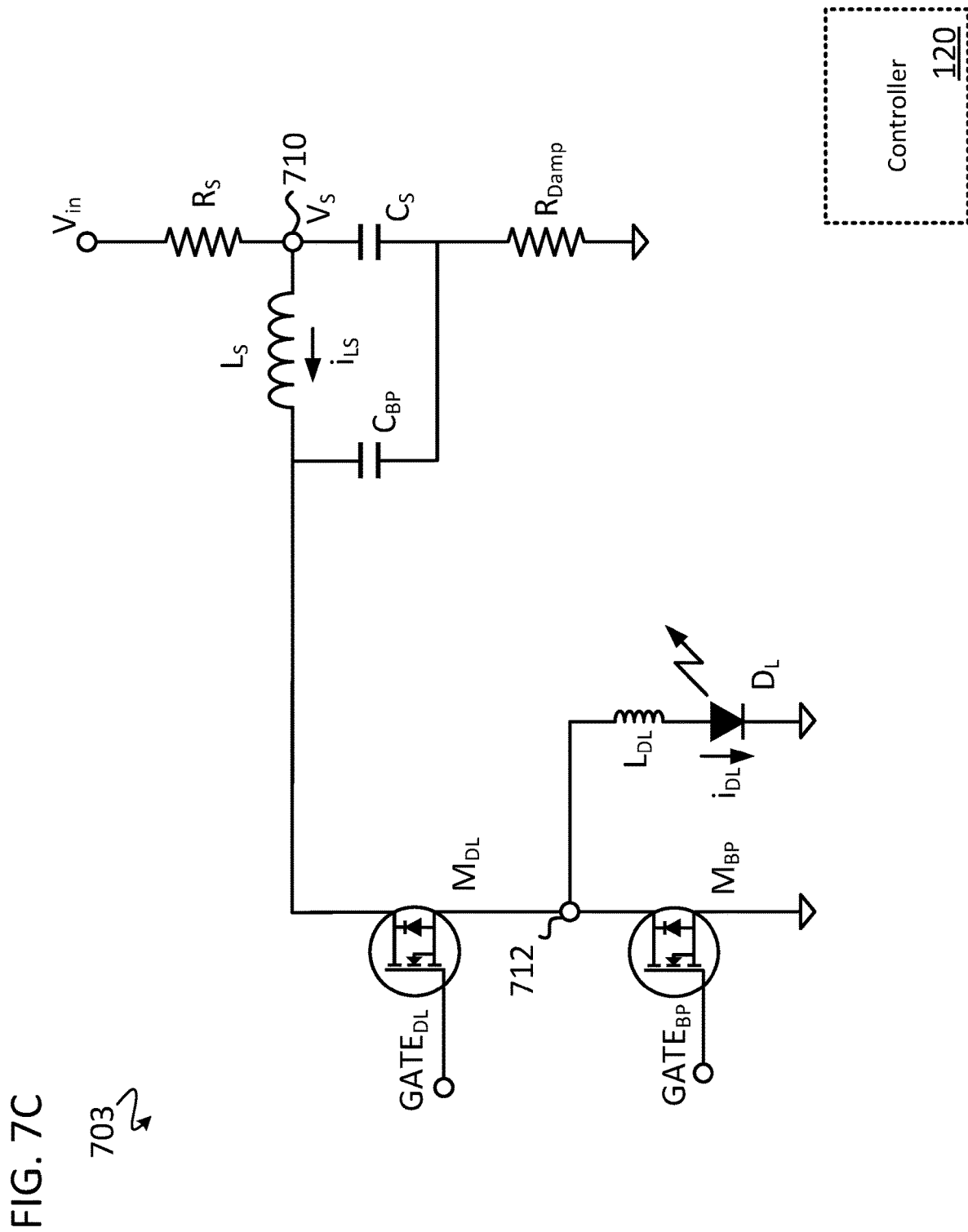
Figure 7D:
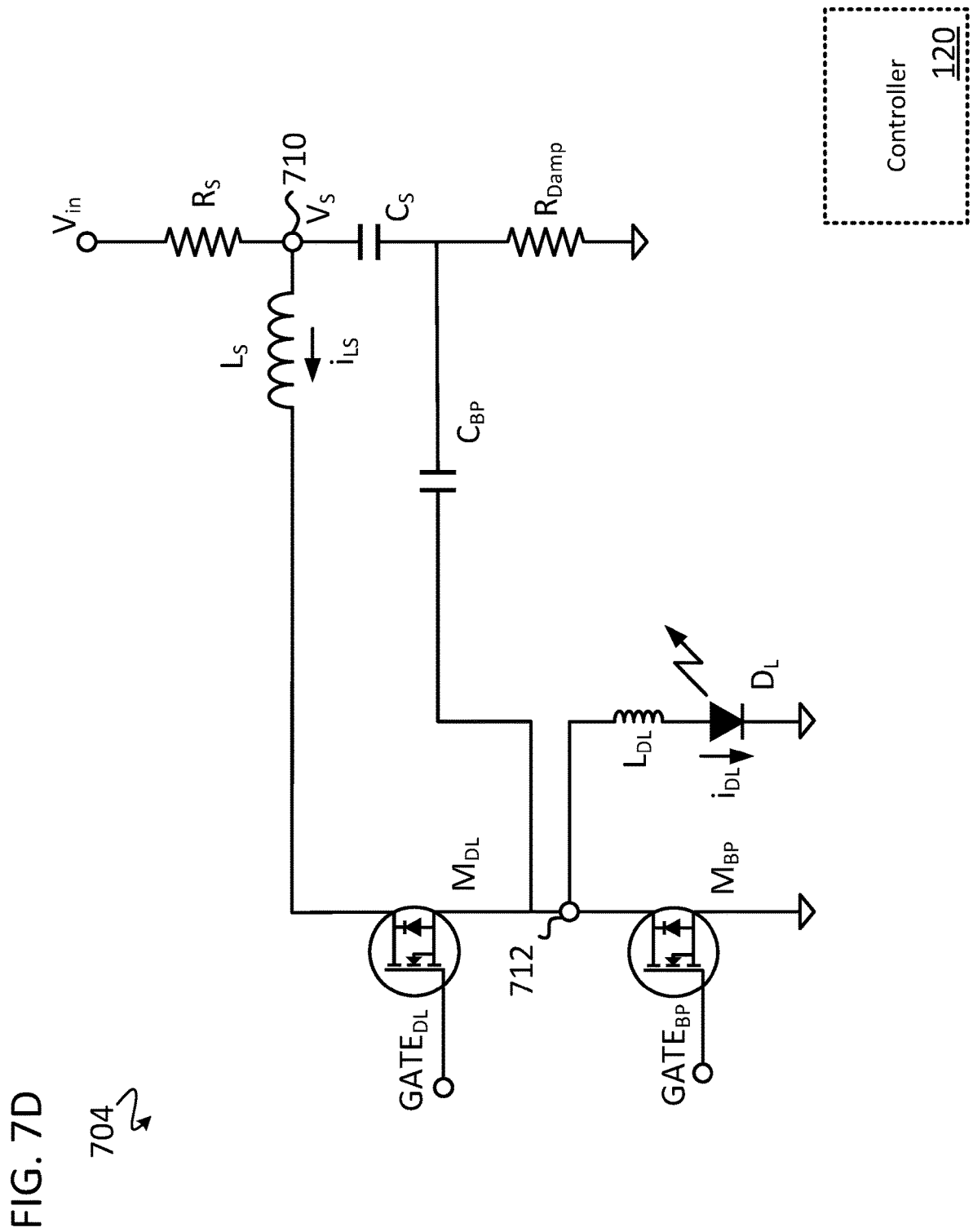

As shown in the simplified circuit schematic of the pulsed laser diode driver 701 of FIG. 7A, in some embodiments the first terminal of the bypass capacitor $C_{BP}$ is directly electrically connected to the second terminal of the inductor $L_S$ and to the drain node of the laser diode switch $M_{DL}$. In such embodiments, the second terminal of the bypass capacitor $C_{BP}$ is electrically connected to the bias voltage node. As shown in the simplified circuit schematic of the pulsed laser diode driver 702 of FIG. 7B, in some embodiments the first terminal of the bypass capacitor $C_{BP}$ is directly electrically connected to the source node of the laser diode switch $M_{DL}$, to the drain node of the bypass switch $M_{BP}$, and to the anode of the laser diode $D_L$. In such embodiments, the second terminal of the bypass capacitor $C_{BP}$ is directly electrically connected to the bias voltage node. As shown in the simplified circuit schematic of the pulsed laser diode driver 703 of FIG. 7C, in some embodiments the first terminal of the bypass capacitor $C_{BP}$ is directly electrically connected to the second terminal of the inductor $L_S$ and to the drain node of the laser diode switch $M_{DL}$. In such embodiments, the second terminal of the bypass capacitor $C_{BP}$ is directly electrically connected to the second terminal of the source capacitor $C_S$ and to the first terminal of the damping resistor $R_{Damp}$. As shown in the simplified circuit schematic of the pulsed laser diode driver 704 of FIG. 7D, in some embodiments the first terminal of the bypass capacitor $C_{BP}$ is directly electrically connected to the source node of the laser diode switch $M_{DL}$, the drain node of the bypass switch $M_{BP}$, and the anode of the laser diode $D_L$. In such embodiments, the second terminal of the bypass capacitor $C_{BP}$ is directly electrically connected to the second terminal of the source capacitor $C_S$ and to the first terminal of the damping resistor $R_{Damp}$.

Figure 7E:
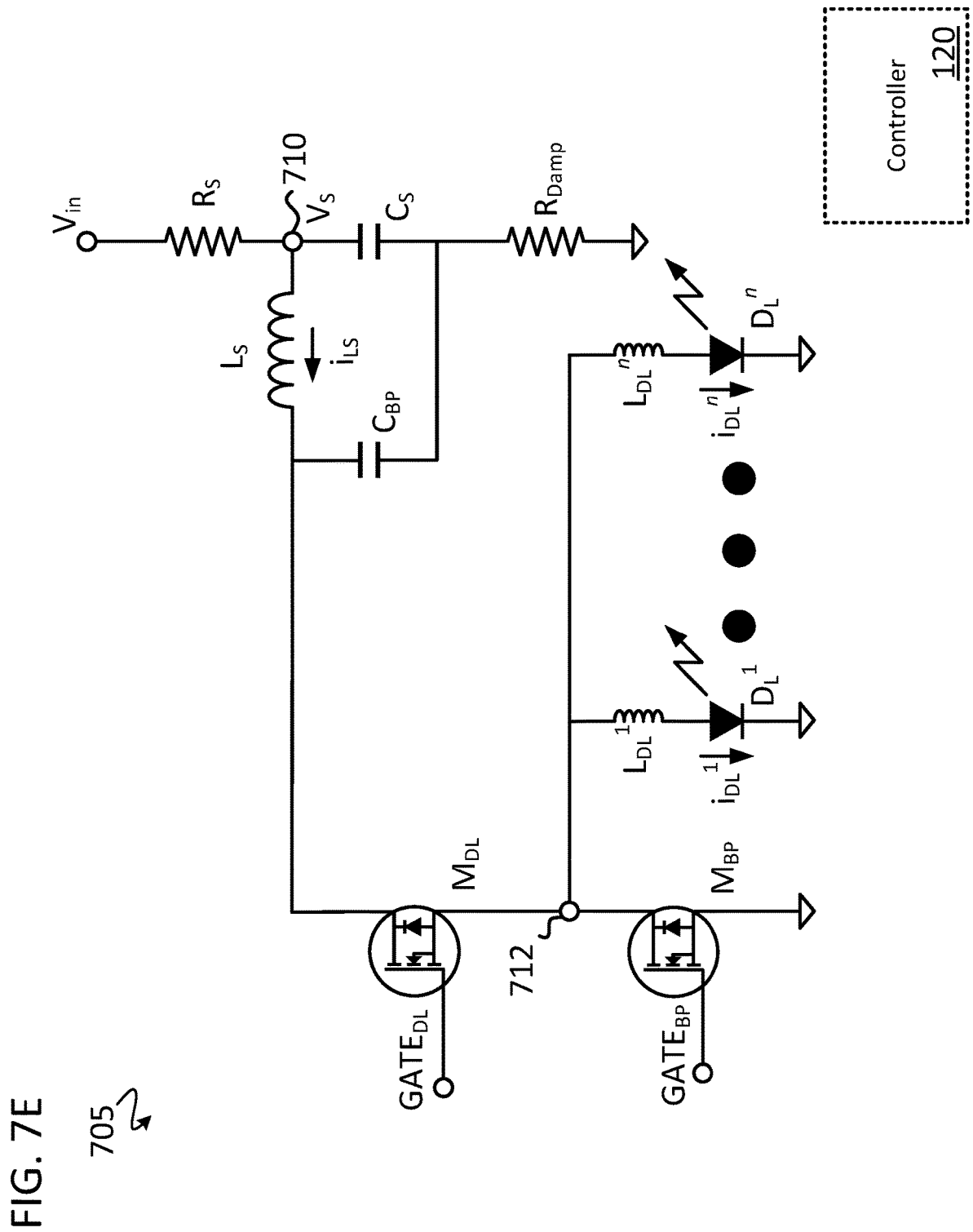

As shown in the simplified circuit schematic of the pulsed laser diode driver 705 of FIG. 7E, two or more laser diodes $D_L^1$-$D_L^n$ may be driven simultaneously by the half-bridge configuration of the bypass switch $M_{BP}$ and the laser diode switch $M_{DL}$. In the example shown, the first terminal of the bypass capacitor $C_{BP}$ is directly electrically connected to the second terminal of the inductor $L_S$ and the second terminal of the bypass capacitor $C_{BP}$ is directly electrically connected to the second terminal of the source capacitor $C_S$ and to the first terminal of the damping resistor $R_{Damp}$. However, other configurations of the bypass capacitor $C_{BP}$, such as those described with reference to FIGS. 7A-D may be used.

Figure 8A:
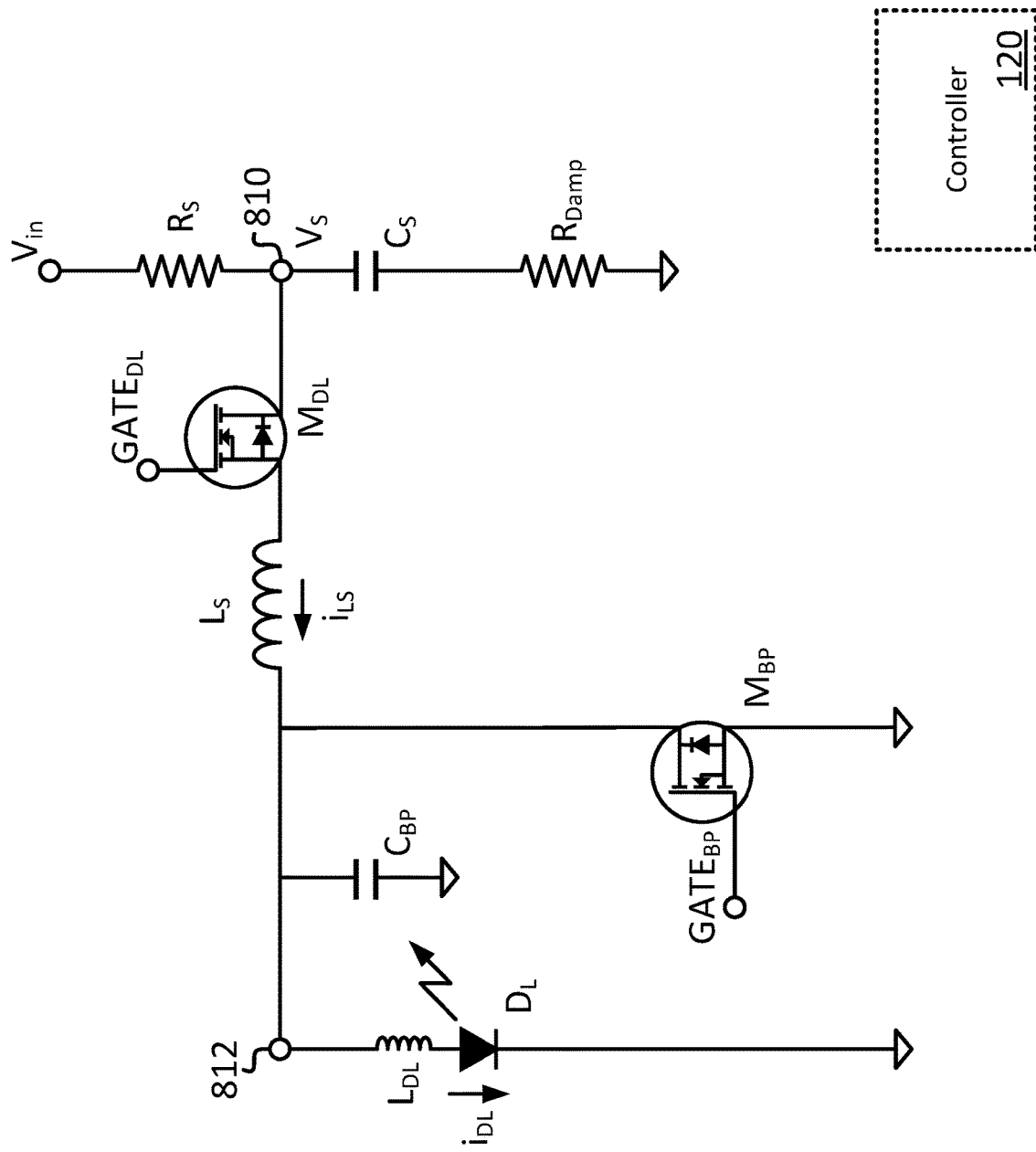
FIGS. 8A-8B are simplified circuit schematics of pulsed laser diode drivers of a sixth general topology, in accordance with some embodiments.
Figure 8B:
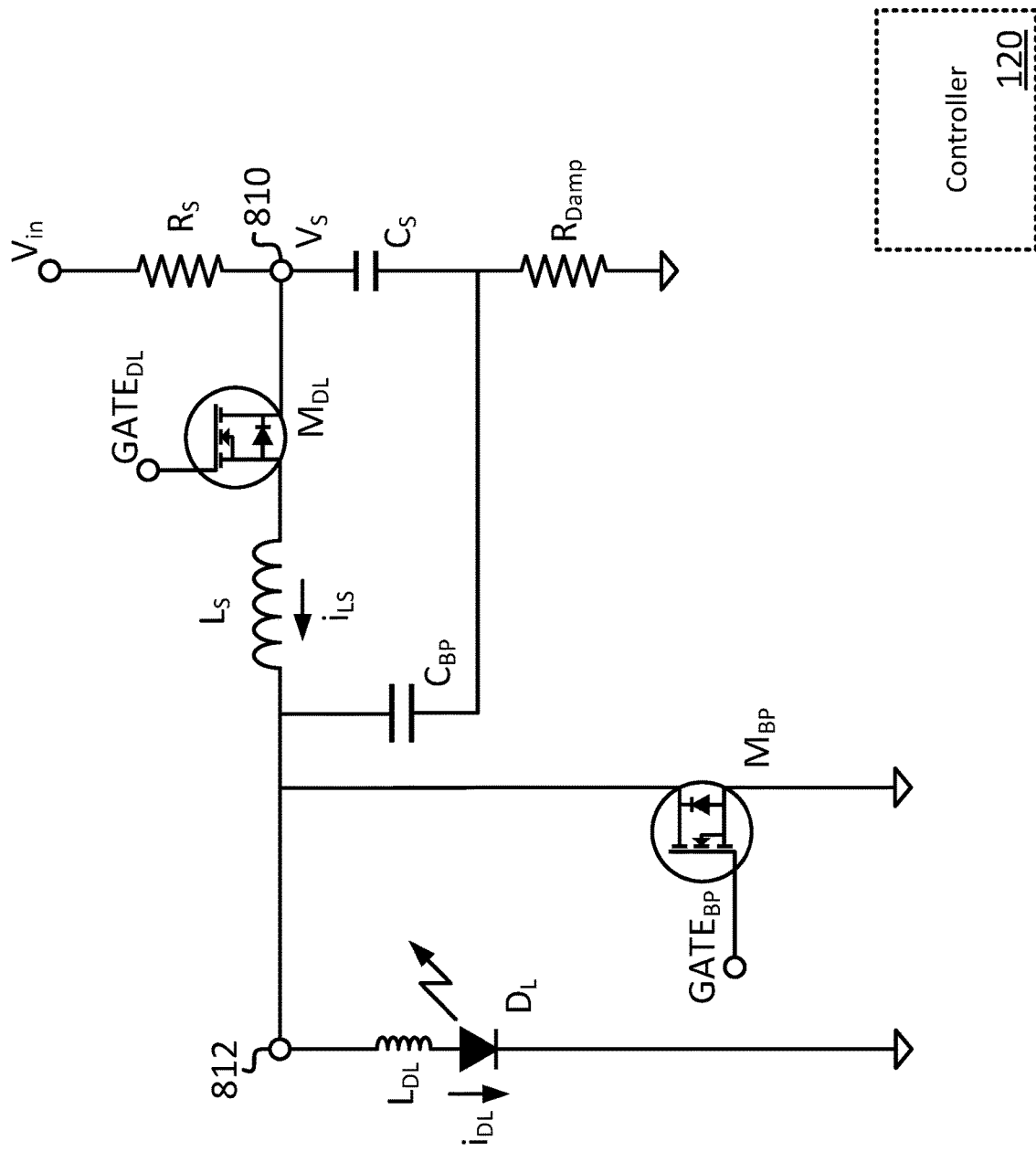

FIGS. 8A-B are simplified circuit schematics of pulsed laser diode drivers 801-802 of a sixth general topology that is configured to drive a laser diode using a high-side switch, in accordance with some embodiments. The pulsed laser diode drivers 801-802 generally include the source resistor $R_S$, the source capacitor $C_S$, the damping resistor $R_{Damp}$, the inductor $L_S$, the bypass capacitor $C_{BP}$, the laser diode $D_L$, the bypass switch $M_{BP}$, and the laser diode switch $M_{DL}$. Also shown is the controller 120, nodes 810, 812, the respective parasitic inductances $L_{DL}$ of the laser diode $D_L$, the DC input voltage $V_{in}$, the source voltage $V_S$ at the source capacitor $C_S$, the current $i_{LS}$ through the inductor $L_S$, the current $i_{DL}$ through the laser diodes $D_L$, the bypass switch gate driver signal $GATE_{BP}$, and the laser diode switch gate driver signal $GATE_{DL}$. Electrical connections of the pulsed laser diode driver 801 are similar to, or the same as those described with respect to the pulsed laser diode driver 101. The pulsed laser diode drivers 801-802 differ in that the drain node of the laser diode switch $M_{DL}$ is directly electrically connected to the second terminal of the source resistor $R_S$ and to the first terminal of the source capacitor $C_S$. The source node of the laser diode switch $M_{DL}$ is directly electrically connected to the first terminal of the inductor $L_S$. The anode of the laser diode $D_L$ is directly electrically connected to the second terminal of the inductor $L_S$ and the cathode of the laser diode $D_L$ is directly electrically connected to the bias voltage node. As shown, the pulsed laser diode drivers 801-802 are advantageously configured such that the laser diode switch $M_{DL}$ is electrically connected between the inductor $L_S$ and the source capacitor $C_S$. As a result, the drain node of the laser diode switch $M_{DL}$ does not receive a high voltage spike developed at the second terminal of the inductor $L_S$ when the bypass switch $M_{BP}$ is disabled to generate the high-current pulse through the laser diode $D_L$.

The pulsed laser diode drivers 801-802 differ in placement of the bypass capacitor $C_{BP}$. As shown in FIG. 8A, in some embodiments, the first terminal of the bypass capacitor $C_{BP}$ is directly electrically connected to the second terminal of the inductor $L_S$, to the anode of the laser diode $D_L$, and to the drain node of the bypass switch $M_{BP}$. In such embodiments, the second terminal of the bypass capacitor $C_{BP}$ is directly electrically connected to the bias voltage node. As shown in FIG. 8B, in some embodiments, the first terminal of the bypass capacitor $C_{BP}$ is directly electrically connected to the second terminal of the inductor $L_S$, to the anode of the laser diode $D_L$, and to the drain node of the bypass switch $M_{BP}$. In such embodiments, the second terminal of the bypass capacitor $C_{BP}$ is directly electrically connected to the second terminal of the source capacitor $C_S$ and to the first terminal of the damping resistor $R_{Damp}$.

In other embodiments, the respective positions of the inductor $L_S$ and the laser diode switch $M_{DL}$ in either of the pulsed laser diode drivers 801-802, can be exchanged such that the first terminal of the inductor $L_S$ is directly electrically connected to the first terminal of the source capacitor $C_S$, and the drain terminal of the laser diode switch $M_{DL}$ is directly electrically connected to the second terminal of the inductor $L_S$.

Figure 9A:
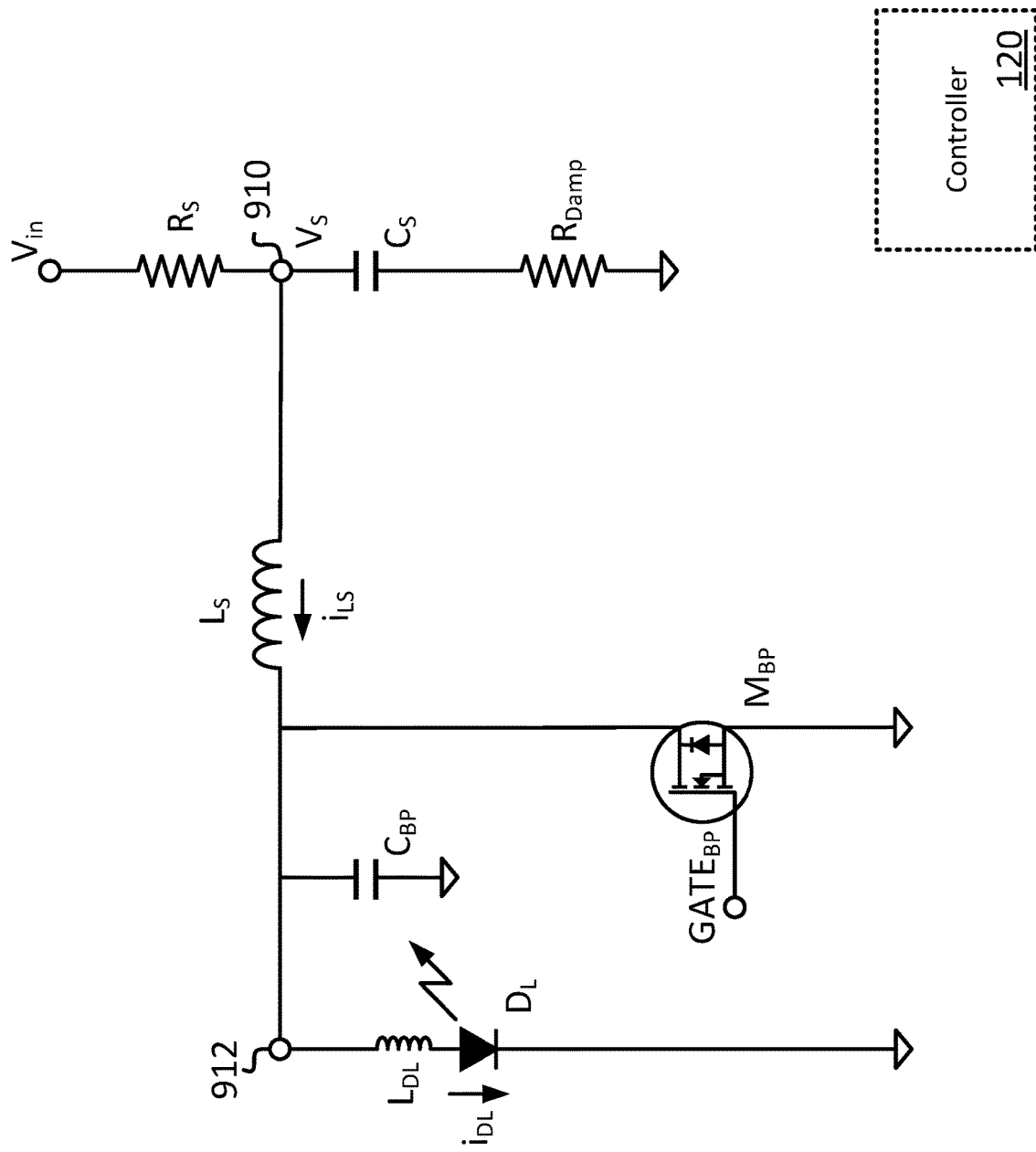
FIGS. 9A-9B are simplified circuit schematics of pulsed laser diode drivers of a seventh general topology, in accordance with some embodiments.
Figure 9B:
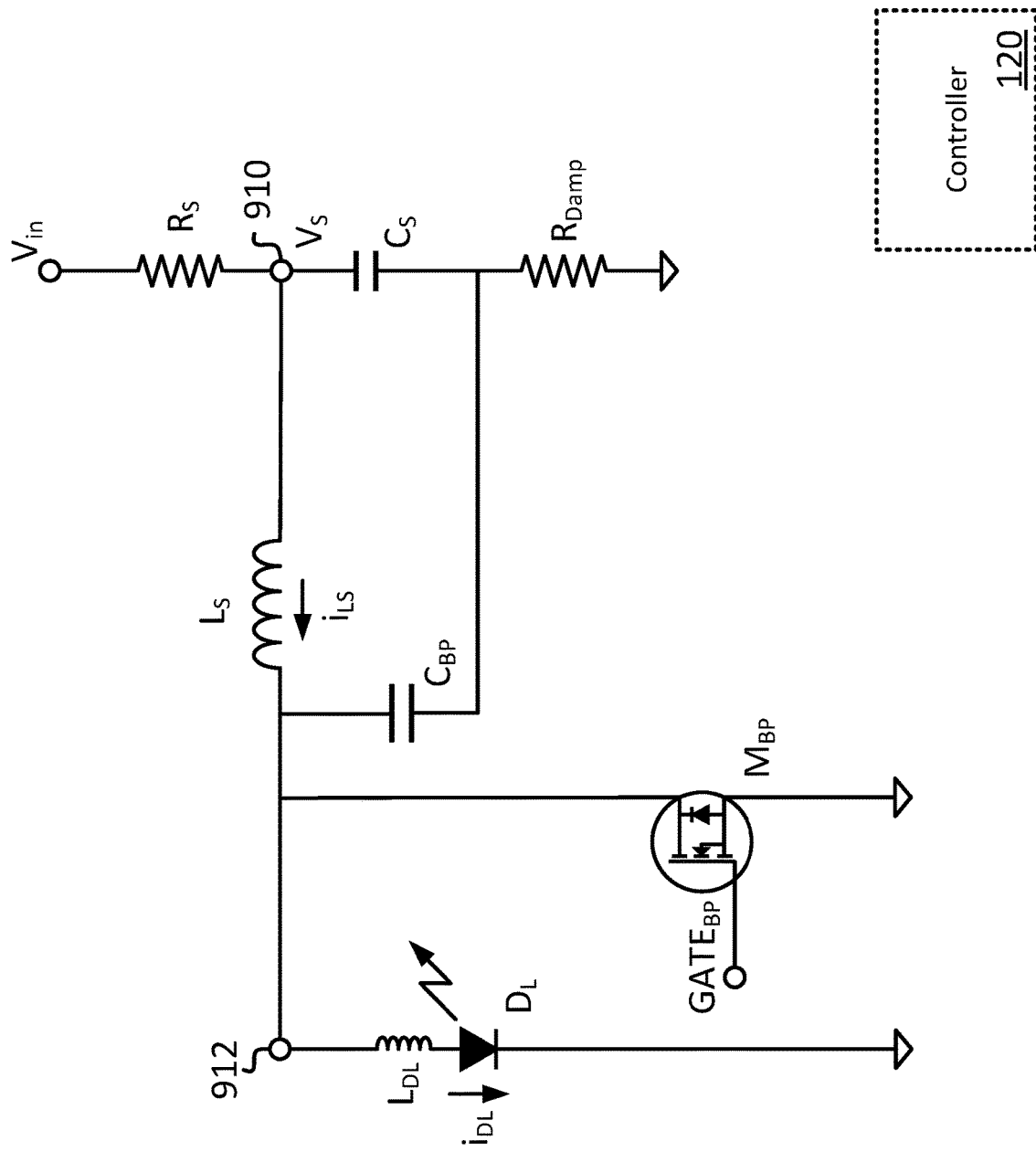

FIGS. 9A-B are simplified circuit schematics of pulsed laser diode drivers 901-902 of a seventh general topology that is configured to drive a laser diode using only a bypass switch, in accordance with some embodiments. The pulsed laser diode drivers 901-902 generally include the source resistor $R_S$, the source capacitor $C_S$, the damping resistor $R_{Damp}$, the inductor $L_S$, the bypass capacitor $C_{BP}$, the laser diode $D_L$, and the bypass switch $M_{BP}$. Also shown are nodes 910, 912, the respective parasitic inductances $L_{DL}$ of the laser diode $D_L$, the DC input voltage $V_{in}$, the source voltage $V_S$ at the source capacitor $C_S$, the current $i_{LS}$ through the inductor $L_S$, the current $i_{DL}$ through the laser diodes $D_L$, and the bypass switch gate driver signal $GATE_{BP}$. Electrical connections of the pulsed laser diode drivers 901-902 are similar to, or the same as, those described with respect to the pulsed laser diode driver 101. The pulsed laser diode drivers 901-902 differ in that the laser diode switch $M_{DL}$ is eliminated. The anode of the laser diode $D_L$ is directly electrically connected to the second terminal of the inductor $L_S$ and the cathode of the laser diode $D_L$ is directly electrically connected to the bias voltage node. In such embodiments, the voltage level of the DC input voltage $V_{in}$ is restricted to a voltage level that does not surpass the forward bias voltage of the laser diode $D_L$, thereby maintaining the laser diode $D_L$ in an OFF-state (i.e., not conducting) until a voltage higher than the forward bias voltage is developed at the second terminal of the inductor $L_S$ when current flow through the bypass switch is momentarily disabled.

The pulsed laser diode drivers 901-902 differ in placement of the bypass capacitor $C_{BP}$. As shown in FIG. 9A, in some embodiments, the first terminal of the bypass capacitor $C_{BP}$ is directly electrically connected to the second terminal of the inductor $L_S$, to the anode of the laser diode $D_L$, and to the drain node of the bypass switch $M_{BP}$. In such embodiments, the second terminal of the bypass capacitor $C_{BP}$ is directly electrically connected to the bias voltage node. As shown in FIG. 9B, in some embodiments, the first terminal of the bypass capacitor $C_{BP}$ is directly electrically connected to the second terminal of the inductor $L_S$, to the anode of the laser diode $D_L$, and to the drain node of the bypass switch $M_{BP}$. In such embodiments, the second terminal of the bypass capacitor $C_{BP}$ is directly electrically connected to the second terminal of the source capacitor $C_S$ and to the first terminal of the damping resistor $R_{Damp}$.

Embodiments of the pulsed laser diode drivers disclosed herein are additionally or alternatively operable to provide current pulses to devices other than laser diodes. For instance, embodiments of the pulsed laser diode drivers disclosed herein are operable to provide a current pulse to a light-emitting diode (i.e., a non-laser LED). Additionally, embodiments of the pulsed laser diode drivers disclosed herein are operable to provide a current pulse to another circuit or device, having no laser diode, that is configured to receive a current pulse for a purpose other than emitting light.

In some embodiments, two or more instances of the laser diode drivers disclosed herein are configured to drive respective laser diodes. For example, four instances of the pulsed laser diode driver 802 may be used to drive a laser diode package that includes four laser diodes. In such an embodiment, each of the laser diodes in the laser diode package is driven by an instance of the pulsed laser diode driver 802.

Figure 10A:
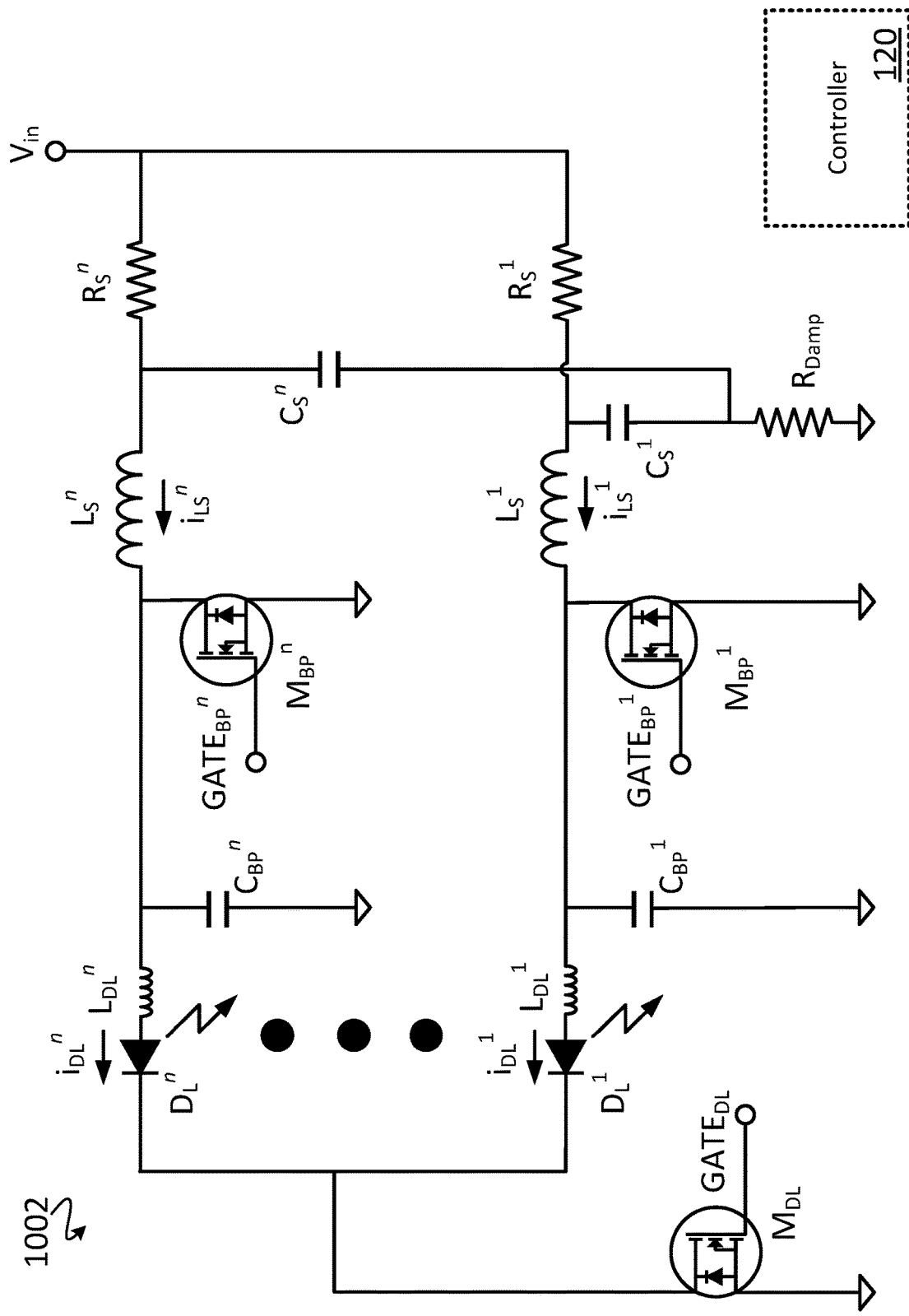
FIGS. 10A-10B are simplified circuit schematics of pulsed laser diode drivers of an eighth general topology, in accordance with some embodiments.
Figure 10B:
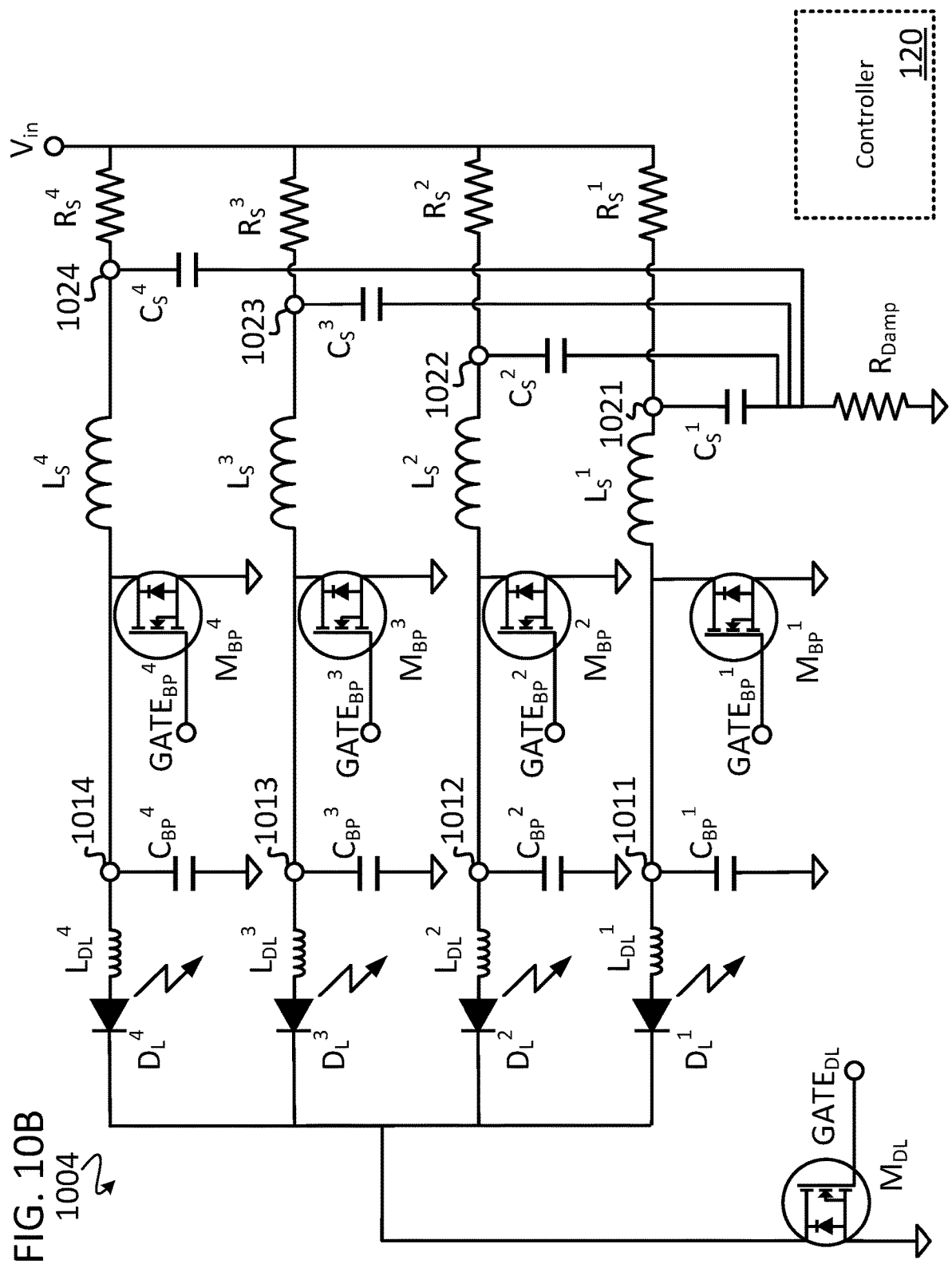

FIGS. 10A-10B are simplified circuit schematics of pulsed laser diode drivers 1002/1004 of an eighth general topology that is configured for multi-channel, individual control of multiple laser diodes, in accordance with some embodiments. The multi-channel pulsed laser diode driver 1002 shown in FIG. 10A is configured to independently drive n laser diodes where n is a number ranging from two to 128 or more. The multi-channel pulsed laser diode driver 1002 is operable to cause a pulse to be emitted from any individual laser diode of the multi-channel pulsed laser diode driver 1002 in isolation, or combined with one or more other pulses emitted from other laser diodes of the multi-channel pulsed laser diode driver 1002. The multi-channel pulsed laser diode driver 1002 generally includes n source resistors $Rs^1$ through $Rs^n$, n source capacitors $C_S^1$ through $C_S^n$, an optional damping resistor $R_{Damp}$, n inductors $Ls^1$ through $Ls^n$, n bypass switches $M_{BP}^1$ through $M_{BP}^n$, n bypass capacitors $C_{BP}^1$ through $C_{BP}^n$, n laser diodes $D_L^1$ through $D_L^n$, and a laser diode switch $M_{DL}$, coupled as shown. Also shown is the controller 120 discussed above, respective parasitic inductances $L_{DL}^1$ through $L_{DL}^n$ of the laser diodes $D_{DL}^1$ through $D_{DL}^n$, respective currents $i_{LS}^1$ through $i_{LS}^n$ of the inductors $Ls^1$ through $Ls^n$, respective currents $i_{DL}^1$ through $i_{DL}^n$ of the laser diodes $D_L^1$ through $D_L^n$, and the DC input voltage $V_{in}$. The damping resistor $R_{Damp}$ is used in some embodiments for current measurement purposes and can be omitted by connecting each of the source capacitors $C_S^1$ through $C_S^n$ to ground. In some embodiments, the bypass switches $M_{BP}^1$ through $M_{BP}^n$ and the laser diode switch $M_{DL}$ are each N-type FET switches and advantageously do not require bootstrap circuitry to drive the respective gates of those switches because of their respective low-side configurations.

The source resistor $Rs^1$, the source capacitor $C_S^1$, the inductor $Ls^1$, the bypass switch $M_{BP}^1$, the bypass capacitor $C_{BP}^1$, and the laser diode $D_L^1$ are associated with a first channel of the multi-channel pulsed laser diode driver 1002. Similarly, the source resistor $Rs^n$, the source capacitor $C_S^n$, the inductor $L_S^n$, the bypass switch $M_{BP}^n$, the bypass capacitor $C_{BP}^n$, and the laser diode $D_L^n$ are associated with an $n^{th}$ channel of the multi-channel pulsed laser diode driver 1002, where n is a number greater than one (e.g., two, three, four, eight, 16, 32, 64, 128, etc.). By controlling (e.g., by the controller 120) respective switch timings (i.e., an on/off duration) of the bypass switches $M_{BP}^1$ through $M_{BP}^n$ in conjunction with controlling a switch timing of the laser diode switch $M_{DL}$ each of the laser diodes $D_L^1$ through $D_L^n$ are advantageously independently controlled. Operation of each channel of the multi-channel pulsed laser diode driver 1002 is similar to, or the same as, operation of the pulsed laser diode driver 101 described with reference to FIG. 1A and the switching sequence 300 shown in FIG. 3. Because each of the bypass switches $M_{BP}^1$ through $M_{BP}^n$ and the laser diode switch $M_{DL}$ are configured as low-side switches (i.e., a source node of each aforementioned switch is directly electrically connected to ground), a gate control signal of those switches does not need to be level-shifted by bootstrap circuitry, thereby advantageously simplifying the design and reducing the cost of the multi-channel pulsed laser diode driver 1002 as compared to a laser diode driver circuit that requires bootstrap circuitry.

An example embodiment of a four-channel (i.e., n=4) multi-channel pulsed laser diode driver 1004 is shown in FIG. 10B. The multi-channel pulsed laser diode driver 1004 is operable to independently drive four laser diodes. That is, the multi-channel pulsed laser diode driver 1004 is operable to cause a pulse to be emitted from any individual laser diode of the multi-channel pulsed laser diode driver 1004 in isolation, or combined with one or more other pulses emitted from other laser diodes of the multi-channel pulsed laser diode driver 1004. The multi-channel pulsed laser diode driver 1004 generally includes four source resistors $Rs^1$ through $Rs^4$, four source capacitors $Cs^1$ through $Cs^4$, the optional damping resistor $R_{Damp}$, four inductors $Ls^1$ through $Ls^4$, four bypass switches $M_{BP}^1$ through $M_{BP}^4$, four bypass capacitors $C_{BP}^1$ through $C_{BP}^4$, four laser diodes $D_L^1$ through $D_L^4$, and the laser diode switch $M_{DL}$, directly electrically connected as shown. Also shown is the controller 120, respective parasitic inductances $L_{DL}^1$ through $L_{DL}^4$ of the laser diodes $D_L^1$ through $D_L^4$, the DC input voltage $V_{in}$, nodes 1011 through 1014, and nodes 1021 through 1024. The damping resistor $R_{Damp}$ is used in some embodiments for current measurement purposes and can be omitted by connecting each of the source capacitors $C_S^1$ through $C_S^4$ to ground. In some embodiments, the bypass capacitors $C_{BP}^1$ through $C_{BP}^4$ are connected to the cathodes of the laser diodes $D_L^1$ through $D_L^4$. In some embodiments, the bypass switches $M_{BP}^1$ through $M_{BP}^4$ and the laser diode switch $M_{DL}$ are each N-type FET switches and advantageously do not require boot-strap circuitry to drive the respective gates of those switches as described above.

The source resistor $Rs^1$, the source capacitor $C_S^1$, the inductor $Ls^1$, the bypass switch $M_{BP}^1$, the bypass capacitor $C_{BP}^1$, and the laser diode $D_L^1$ are associated with a first channel of the multi-channel pulsed laser diode driver 1004; the source resistor $Rs^2$, the source capacitor $C_S^2$, the inductor $Ls^2$, the bypass switch $M_{BP}^2$, the bypass capacitor $C_{BP}^2$, and the laser diode $D_L^2$ are associated with a second channel of the multi-channel pulsed laser diode driver 1004; the source resistor $Rs^3$, the source capacitor $C_S^3$, the inductor $Ls^3$, the bypass switch $M_{BP}^3$, the bypass capacitor $C_{BP}^3$, and the laser diode $D_L^3$ are associated with a third channel of the multi-channel pulsed laser diode driver 1004, and the source resistor $Rs^4$, the source capacitor $C_S^4$, the inductor $Ls^4$, the bypass switch $M_{BP}^4$, the bypass capacitor $C_{BP}^4$, and the laser diode $D_L^4$ are associated with a fourth channel of the multi-channel pulsed laser diode driver 1004. The laser diode switch $M_{DL}$ is associated with each of the channels of the multi-channel pulsed laser diode driver 1004.

As described above, each channel of the multi-channel pulsed laser diode driver 1004 has an associated source resistor, source capacitor, inductor, bypass switch, bypass capacitor, and laser diode. By controlling (e.g., by the controller 120) respective switch timings (i.e., an on/off duration) of the bypass switches $M_{BP}^1$ through $M_{BP}^4$ in conjunction with controlling a switch timing of the laser diode switch $M_{DL}$, each of the laser diodes $D_L^1$ through $D_L^4$ is advantageously independently controlled.

Operation of each channel of the multi-channel pulsed laser diode driver 1004 is similar to, or the same as operation of the pulsed laser diode driver 101 described with reference to FIG. 1A and the switching sequence 300 shown in FIG. 3. A channel of the multi-channel pulsed laser diode driver 1004 is selected for output by turning that channel's bypass switch off (e.g., by the controller 120) while the laser diode switch $M_{DL}$ is off such that the DC input voltage $V_{in}$ charges that channel's source capacitor to a desired voltage level to store energy in that source capacitor (e.g., step 301 of FIG. 3). After the desired voltage level is reached at the source capacitor, a selected channel's bypass switch is turned on (e.g., by the controller 120), such that current builds in that channel's inductor between that channel's bypass switch and that channel's source capacitor (e.g., step 302 of FIG. 3). If that channel's bypass switch is thereafter turned off for a short time and the laser diode switch $M_{DL}$ is turned on, that channel's inductor current will resonate with the anode capacitance of that channel's laser diode, thereby creating a voltage across that channel's laser diode that is higher than the DC input voltage $V_{in}$ and the developed current will be forced to flow through that channel's laser diode (e.g., step 303 of FIG. 3) to emit a laser pulse. In some embodiments, a discharge sequence similar to step 304 of FIG. 3 is performed, whereby both that channel's bypass switch and the laser diode switch $M_{DL}$ are turned on may then follow. By sequentially selecting each channel of the multi-channel pulsed laser diode driver 1004, that channel's laser diode can be independently pulsed. A channel of the multi-channel pulsed laser diode driver 1004 is unselected for output by leaving that channel's bypass switch on (e.g., by the controller 120) through each of the steps 301 through 305 shown in FIG. 3, thereby preventing the DC input voltage $V_{in}$ from charging that channel's source capacitor.

Figure 11:
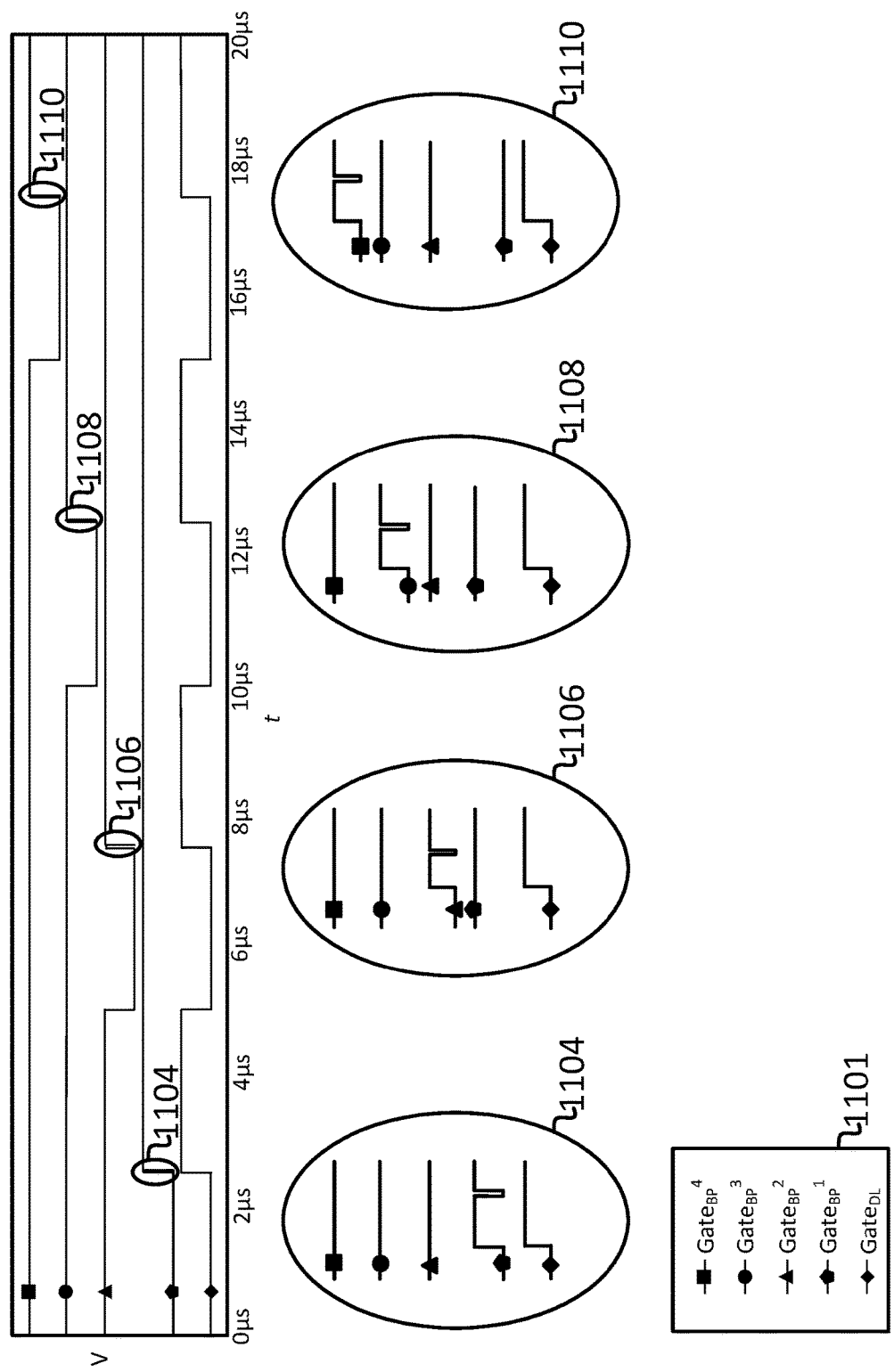
FIGS. 11-12 show simplified plots of signals related to operation of the pulsed laser diode driver shown in FIG. 10B, in accordance with some embodiments.

Simplified example waveforms 1102 of signals related to the operation of the multi-channel pulsed laser diode driver 1004 are shown in FIG. 11, in accordance with some embodiments. Also shown is a legend 1101 and expanded regions of interest 1104, 1106, 1108, and 1110 of the waveforms 1102.

As indicated by the legend 1101, the simplified waveforms 1102 of FIG. 11 include a laser diode switch gate driver signal $Gate_{DL}$, a first bypass switch gate driver signal $Gate_{BP}^1$, a second bypass switch gate driver signal $Gate_{BP}^2$, a third bypass switch gate driver signal $Gate_{BP}^3$ and a fourth bypass switch gate driver signal $Gate_{BP}^4$ over a 20 µs duration. With reference to FIG. 10B, the laser diode switch gate driver signal $Gate_{DL}$ is operable to control the laser diode switch $M_{DL}$, the first bypass switch gate driver signal $Gate_{BP}^1$ is operable to control the bypass switch $M_{BP}^1$, the second bypass switch gate driver signal $Gate_{BP}^2$ is operable to control the bypass switch $M_{BP}^2$, the third bypass switch gate driver signal $Gate_{BP}^3$ is operable to control the bypass switch $M_{BP}^3$, and the fourth bypass switch gate driver signal $Gate_{BP}^4$ is operable to control the bypass switch $M_{BP}^4$.

Each of the expanded regions of interest 1104, 1106, 1108, and 1110 illustrate a pre-flux interval of a selected channel during which an inductor current of that channel's inductor is ramping up, a very short pulse interval during which current through that channel's inductor is directed through that channel's laser diode, and a discharge interval in accordance with steps 301 through 305 described with reference to FIG. 3. Per the description above, the region of interest 1104 illustrates pulse generation for the first channel (i.e., laser diode $D_L^1$) of the multi-channel pulsed laser diode driver 1004, the region of interest 1106 illustrates pulse generation for the second channel (i.e., laser diode $D_L^2$) of the multi-channel pulsed laser diode driver 1004, the region of interest 1108 illustrates pulse generation for the third channel (i.e., laser diode $D_L^3$) of the multi-channel pulsed laser diode driver 1004, and the region of interest 1110 illustrates pulse generation for the fourth channel (i.e., laser diode $D_L^2$) of the multi-channel pulsed laser diode driver 1004.

Figure 12:
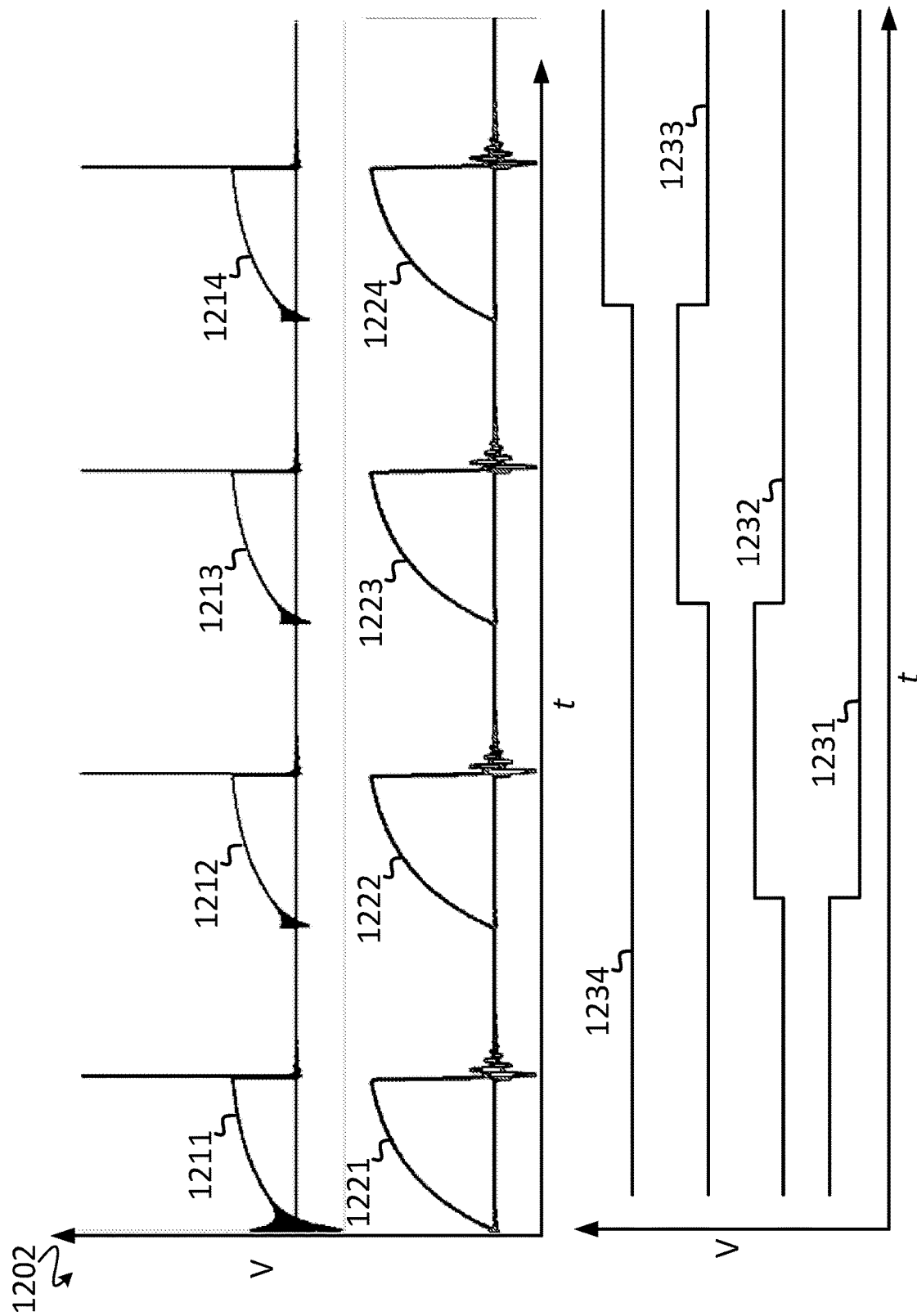

Additional simplified example waveforms 1202 of signals related to the operation of the multi-channel pulsed laser diode driver 1004 of FIG. 10B are shown in FIG. 12. The simplified example waveforms include waveforms 1211 through 1214 illustrating respective anode voltages of the laser diodes $D_L^1$ through $D_L^4$ at the nodes 1011 through 1014, and waveforms 1221 through 1224 illustrating respective voltages of the source capacitor $C_S^1$ through $C_S^4$ at the nodes 1021 through 1024. Also shown are waveforms 1231 through 1234 which illustrate when a respective channel of the multi-channel pulsed laser diode driver 1004 is enabled.

As shown, when a first channel of the multi-channel pulsed laser diode driver 1004 is enabled (illustrated by waveform 1231), an anode voltage 1211 at node 1011 of the laser diode $D_L^1$ rises in conjunction with a rising voltage at node 1021 of the source capacitor $C_S^1$. Upon enabling the laser diode switch $M_{DL}$ and momentarily disabling the bypass switch $M_{BP}^1$, current flows through the laser diode $D_L^1$, thereby emitting a laser pulse as described above. Similarly, when a second channel of the multi-channel pulsed laser diode driver 1004 is enabled (illustrated by waveform 1232), an anode voltage 1212 at node 1012 of the laser diode $D_L^2$ rises in conjunction with a rising voltage at node 1022 of the source capacitor $C_S^2$. Upon enabling the laser diode switch $M_{DL}$ and momentarily disabling the bypass switch $M_{BP}^2$, current flows through the laser diode $D_L^2$, thereby emitting a laser pulse as described above. Operation of the third and fourth channels of the multi-channel pulsed laser diode driver 1004 are similar.

A repetition rate of the multi-channel pulsed laser diode driver 1004, as well as each of the pulsed laser diode drivers described above, is limited by a charging time of each channel's source capacitor. The pulsed laser diode drivers described above create narrow (e.g., 1-5 nsec) high-current pulses (e.g., 40 amp) through a driven laser diode. The instantaneous power in the driven laser diode is therefore high (e.g., in the order of hundreds of watts). However, for many applications (e.g., Lidar), the duty cycle of the pulse is generally 0.01% or less to limit the total power dissipated in the laser diode which results in an upper limit to a repetition rate. In conventional laser diode driver applications, a resistor is used to charge storage (i.e., source) capacitors during each cycle. In such conventional solutions, an RC time constant of such charging circuits is typically not an issue because the duty cycle is so low. However, for applications that require a high repetition rate for laser pulses, the RC time constant of conventional charging circuits creates an undesirable limitation. In any of the embodiments disclosed herein, each source resistor of a given pulsed laser diode driver may be advantageously replaced by an actively controlled source switch that quickly charges an associated source capacitor. Activation of the source switch is synchronized with switching the one or more bypass switches and one or more laser diode switches of a given pulsed laser diode driver such that the source switch is enabled prior to a laser diode pulse generation interval. FIG. 13A through FIG. 13I provide examples of previously described laser diode drivers in which the respective source resistor $R_S$ has been replaced by an actively controlled source switch $M_S$ to rapidly charge the respective source capacitor $C_S$. In some embodiments, the actively controlled source switch is implemented as a P-type switch that advantageously does not require bootstrap circuitry. Respective actively controlled source switches $M_S$ shown in FIG. 13A through FIG. 13I are activated only during a pre-charge step (i.e., during step 301 as described with reference to FIG. 3), and thus prior to a pre-flux step (i.e., prior to step 302 as described with reference to FIG. 3).

Figure 13A:
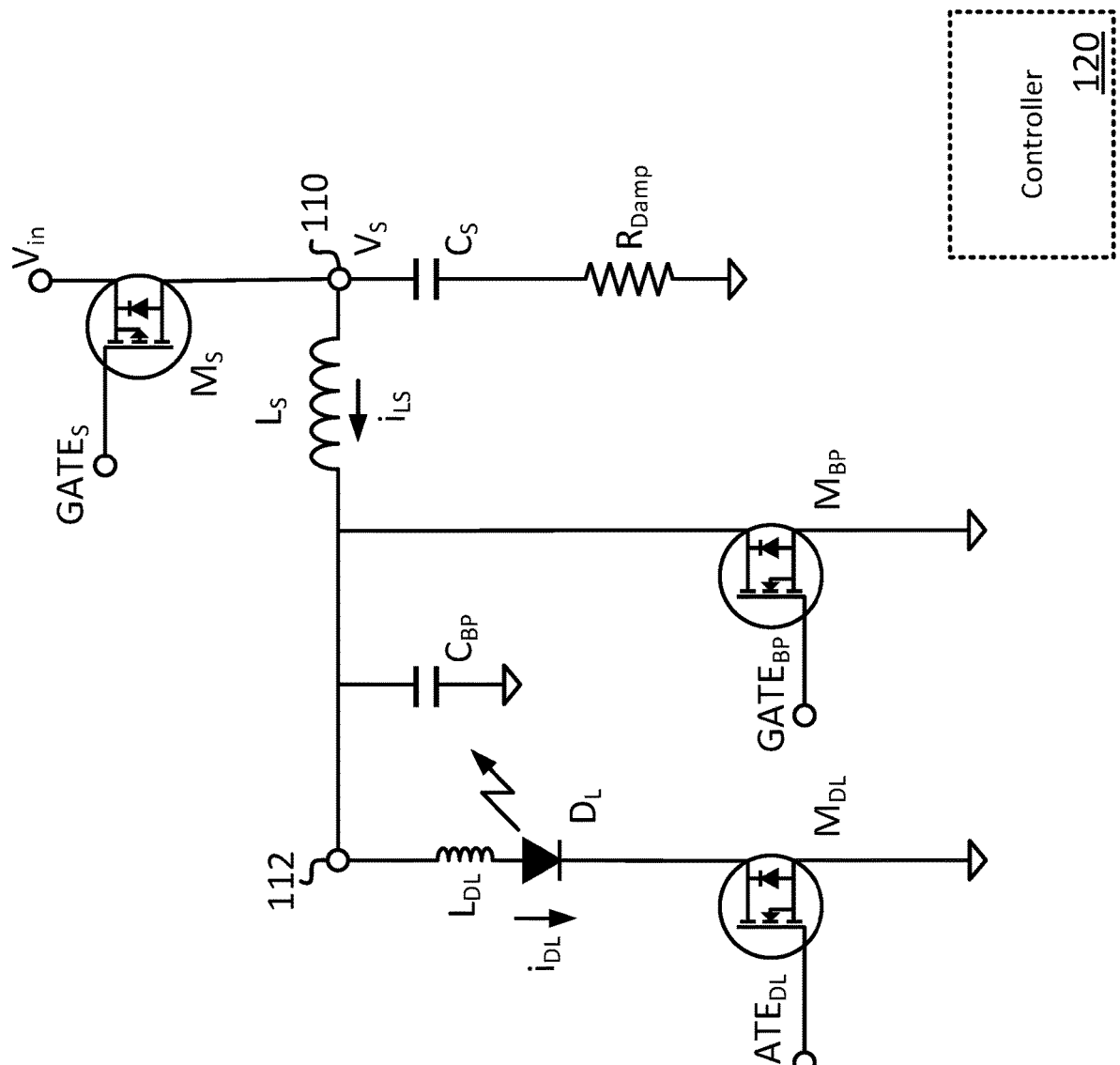
FIGS. 13A-13I are simplified circuit schematics of high-repetition-rate pulsed laser diode drivers, in accordance with some embodiments.

FIG. 13A shows a first example embodiment of a pulsed laser diode driver 1301 having all of the components, signals, and nodes described above with reference to the pulsed laser diode driver 101 of FIG. 1A, with the exception of the source resistor $R_S$ of FIG. 1A which has advantageously been replaced in FIG. 13A by an actively controlled (e.g., by the controller 120 using gate control signal $GATE_S$) source switch $M_S$ to rapidly charge the source capacitor $C_S$. In other example embodiments (not shown), the respective source resistors Rs of the pulsed laser diode driver 102 of FIG. 1B and the pulsed laser diode driver 103 of FIG. 1C are similarly replaced by a respective actively controlled source switch to rapidly charge the respective source capacitors $C_S$ of the laser diode drivers 102/103.

Figure 13B:
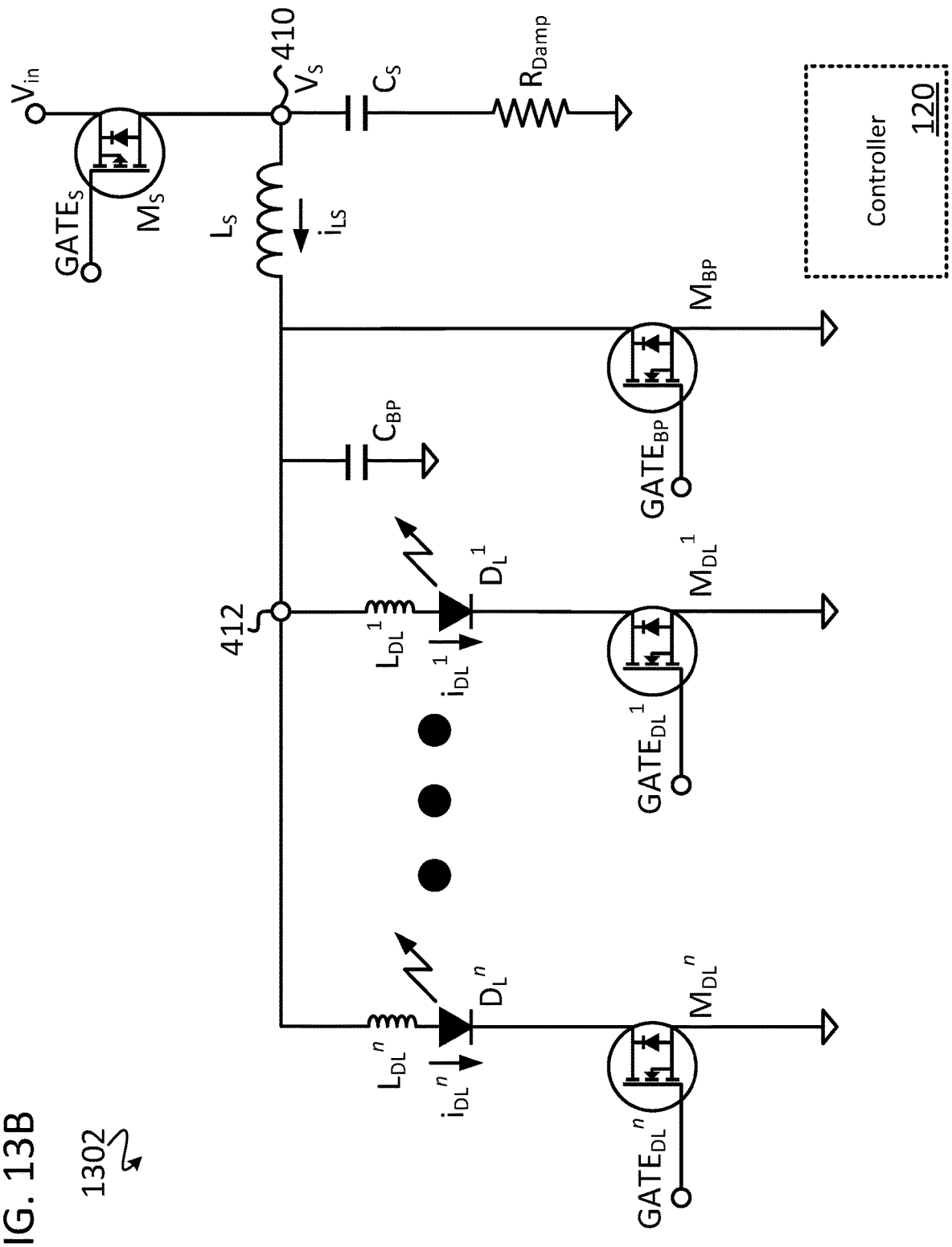

FIG. 13B shows a second example embodiment of a pulsed laser diode driver 1302 having all of the components, signals, and nodes described above with reference to the pulsed laser diode driver 401 of FIG. 4A, with the exception of the source resistor Rs of FIG. 4A which has advantageously been replaced in FIG. 13B by an actively controlled (e.g., by the controller 120 using gate control signal $GATE_S$) source switch $M_S$ to rapidly charge the source capacitor $C_S$. In other example embodiments (not shown), the respective source resistors Rs of the pulsed laser diode driver 402 of FIG. 4B, the pulsed laser diode driver 403 of FIG. 4C, and the pulsed laser diode driver 404 of FIG. 4D are similarly replaced by a respective actively controlled source switch to rapidly charge the respective source capacitors $C_S$ of the laser diode drivers 402/403/404.

Figure 5D:
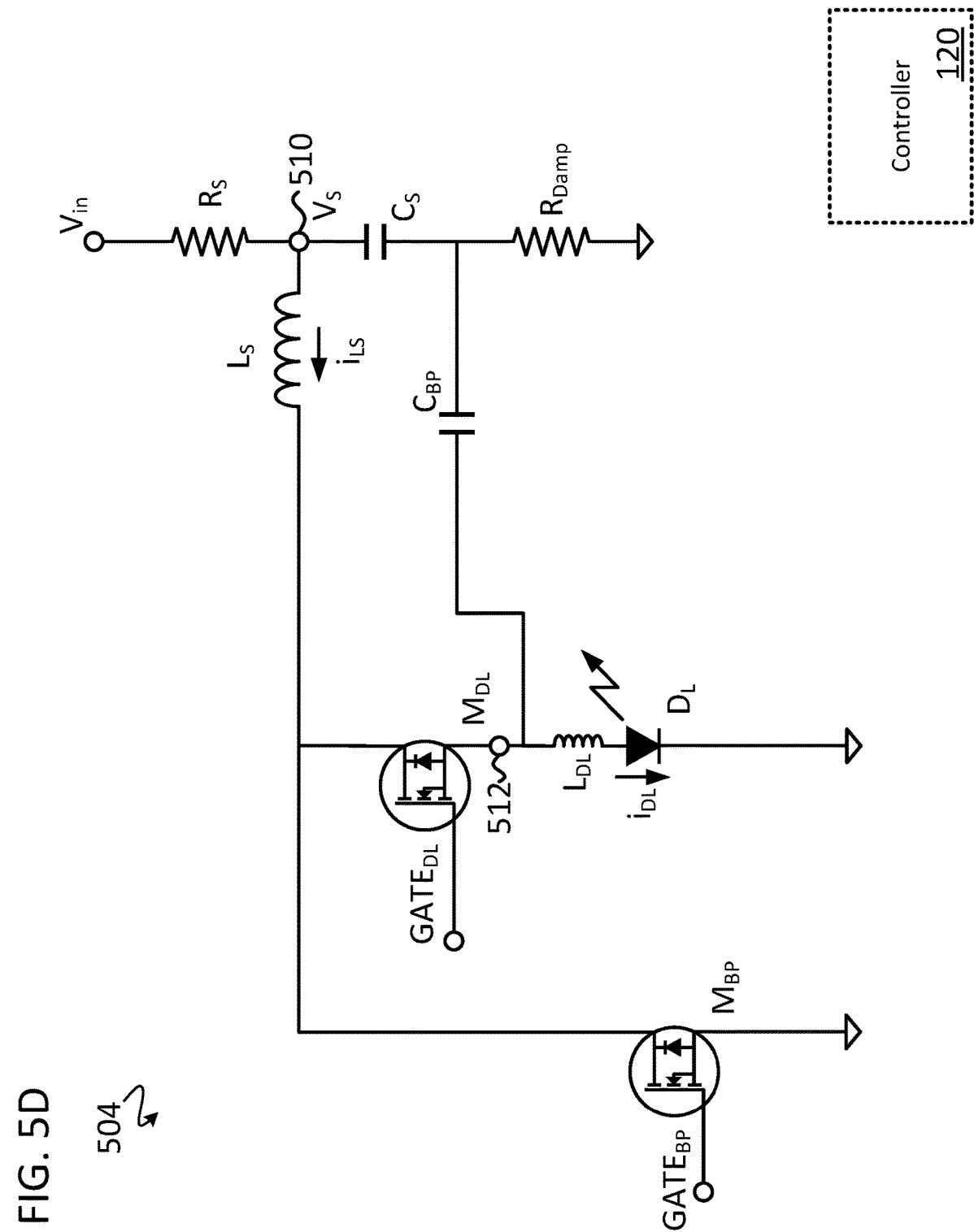
Figure 13C:
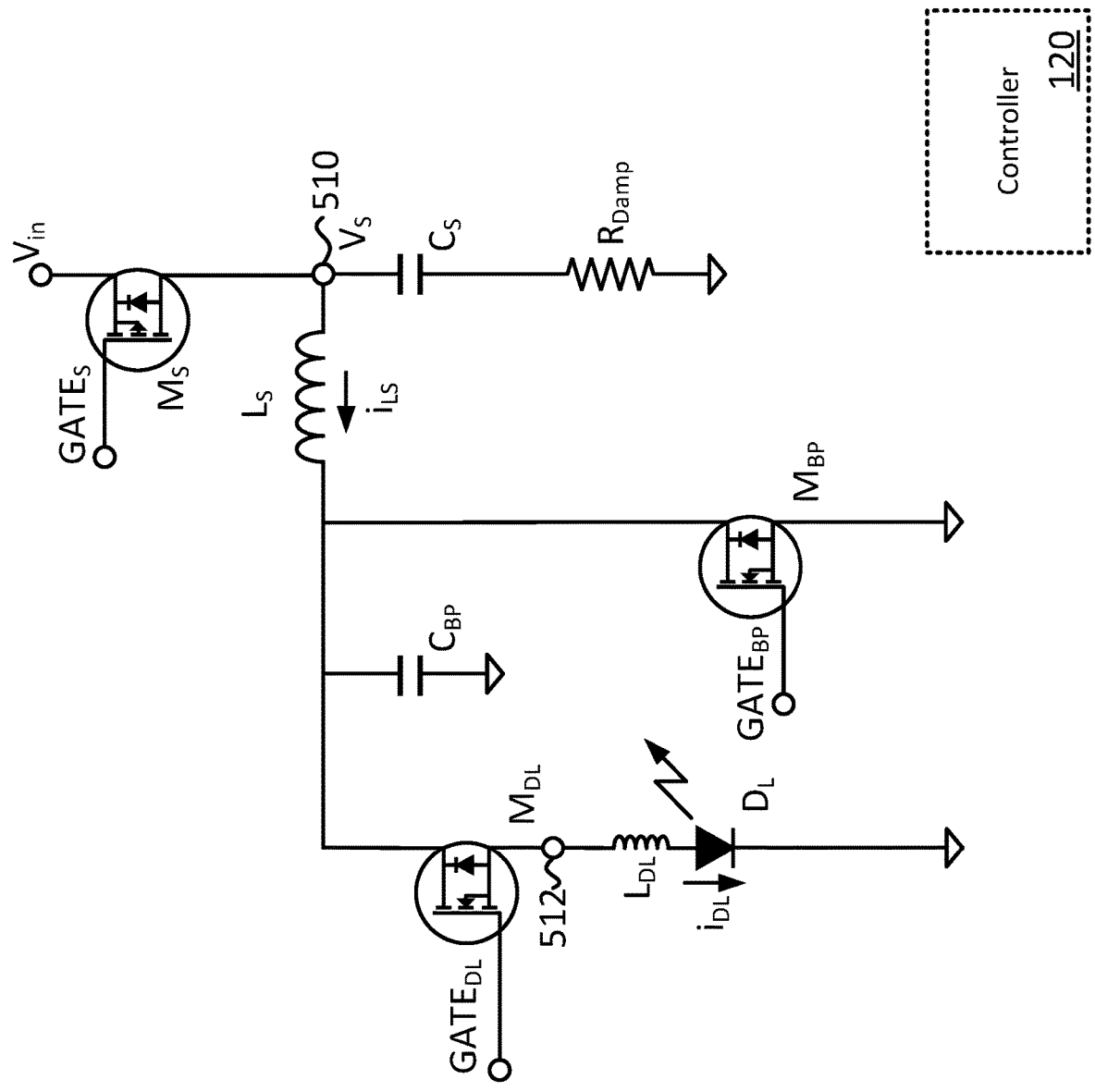

FIG. 13C shows a third example embodiment of a pulsed laser diode driver 1303 having all of the components, signals, and nodes described above with reference to the pulsed laser diode driver 501 of FIG. 5A, with the exception of the source resistor Rs of FIG. 5A which has advantageously been replaced in FIG. 13C by an actively controlled (e.g., by the controller 120 using gate control signal $GATE_S$) source switch $M_S$ to rapidly charge the source capacitor $C_S$. In other example embodiments (not shown), the respective source resistors Rs of the pulsed laser diode driver 502 of FIG. 5B, the pulsed laser diode driver 503 of FIG. 5C, and the pulsed laser diode driver 504 of FIG. 5D are similarly replaced by a respective actively controlled source switch to rapidly charge the respective source capacitors $C_S$ of the laser diode drivers 502/503/504.

Figure 6D:
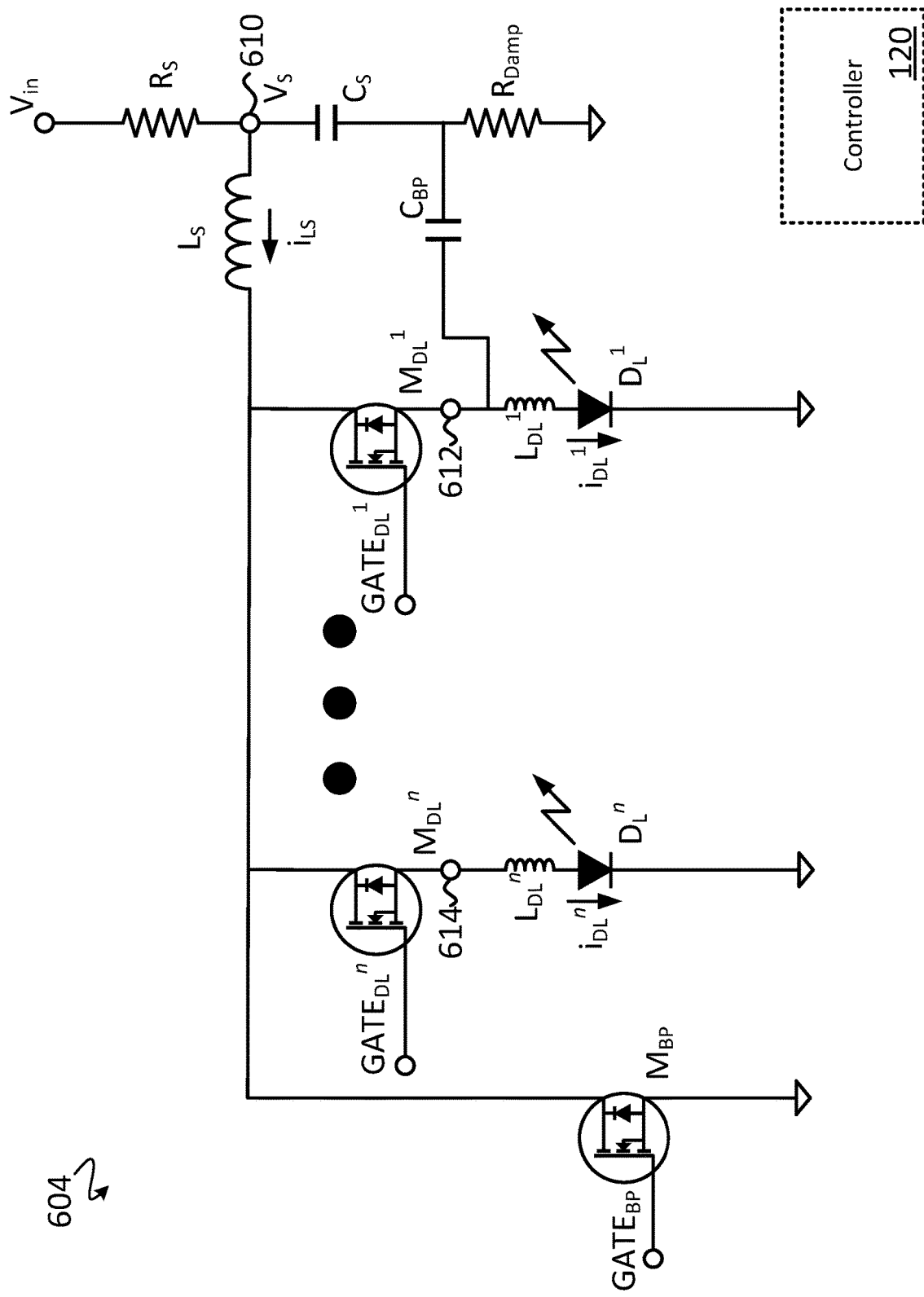
Figure 13D:
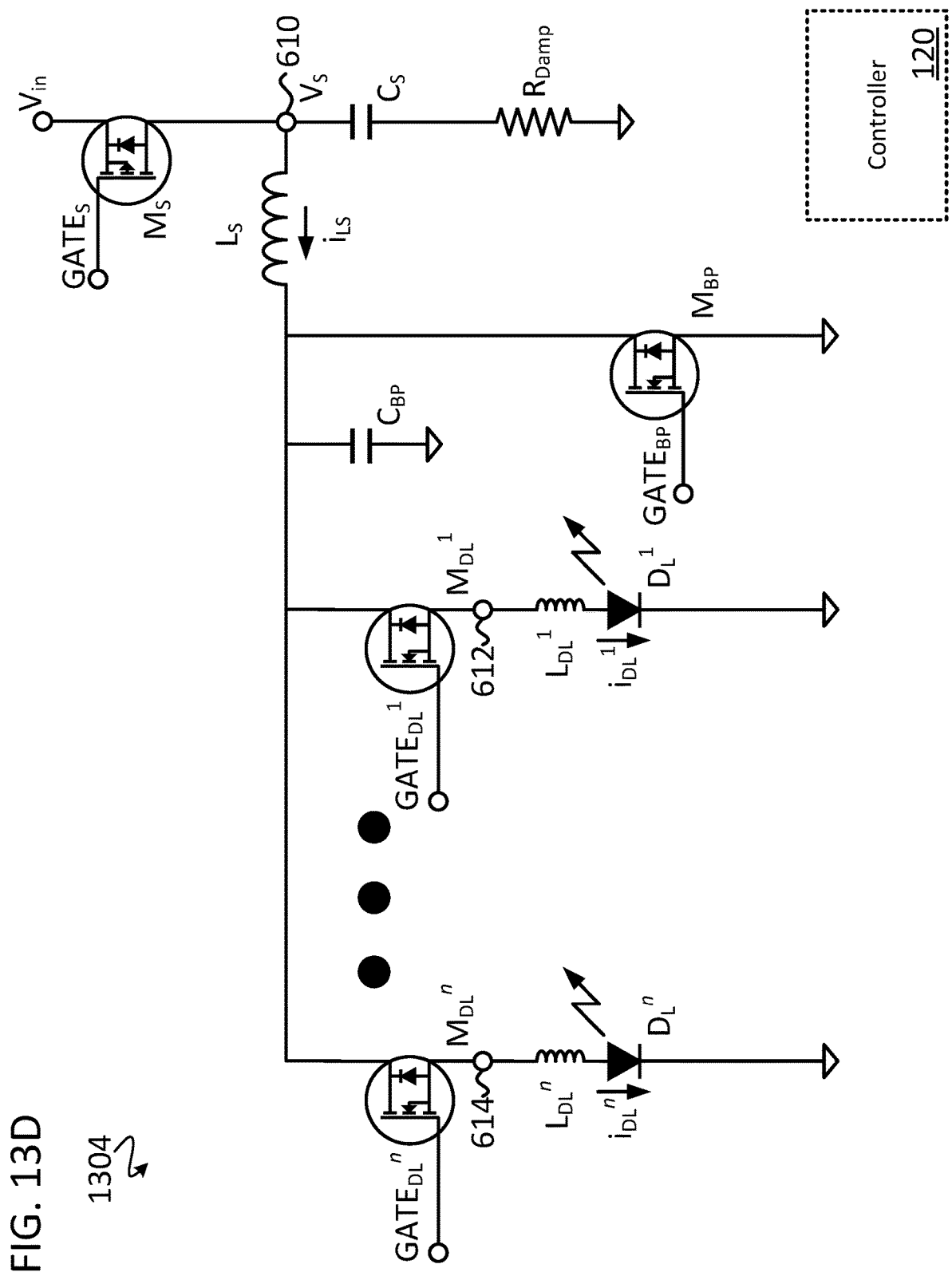

FIG. 13D shows a fourth example embodiment of a pulsed laser diode driver 1304 having all of the components, signals, and nodes described above with reference to the pulsed laser diode driver 601 of FIG. 6A, with the exception of the source resistor Rs of FIG. 6A which has advantageously been replaced in FIG. 13D by an actively controlled (e.g., by the controller 120 using gate control signal $GATE_S$) source switch $M_S$ to rapidly charge the source capacitor $C_S$. In other example embodiments (not shown), the respective source resistors Rs of the pulsed laser diode driver 602 of FIG. 6B, the pulsed laser diode driver 603 of FIG. 6C, and the pulsed laser diode driver 604 of FIG. 6D are similarly replaced by a respective actively controlled source switch to rapidly charge the respective source capacitors $C_S$ of the laser diode drivers 602/603/604.

Figure 13E:
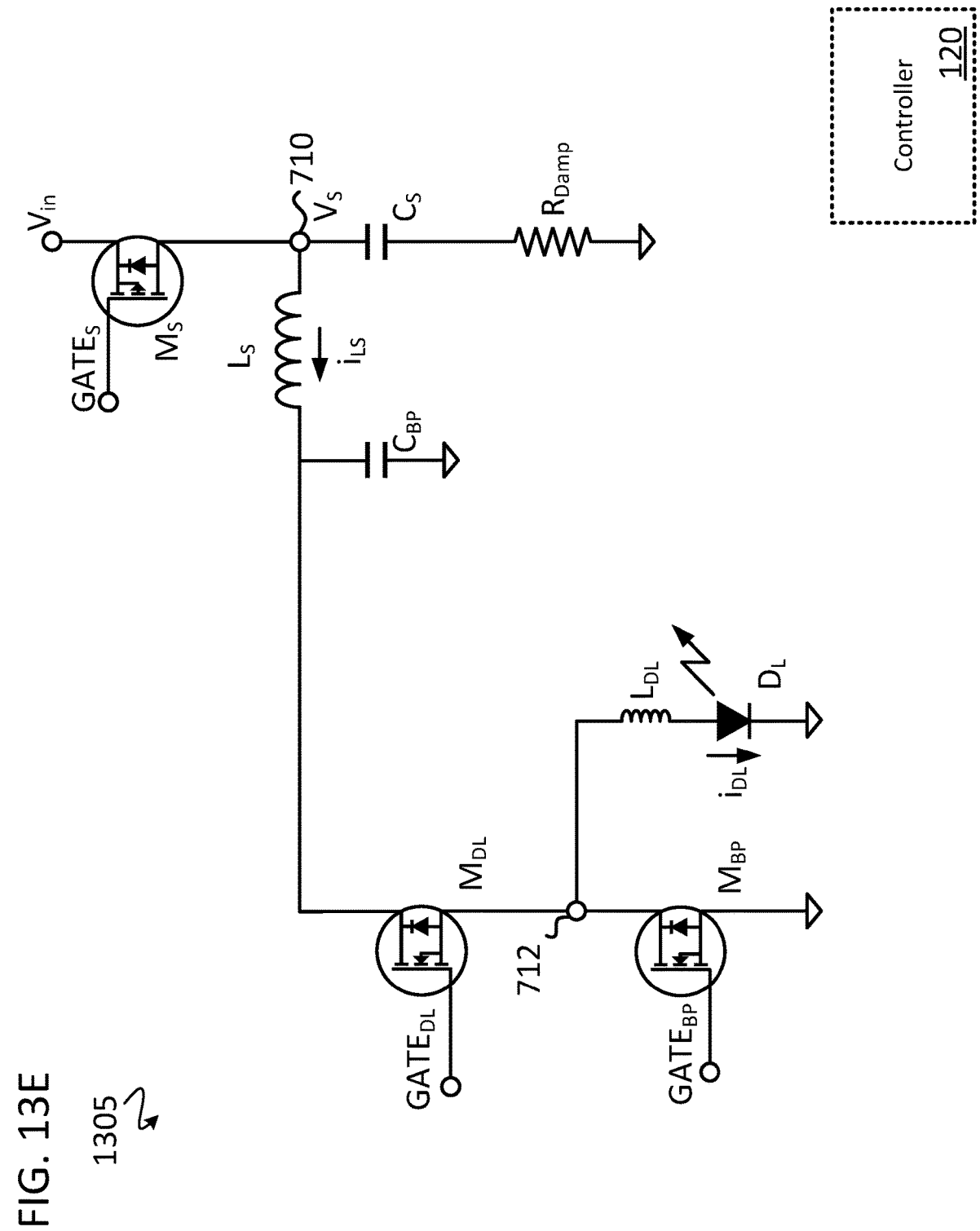

FIG. 13E shows a fifth example embodiment of a pulsed laser diode driver 1305 having all of the components, signals, and nodes described above with reference to the pulsed laser diode driver 701 of FIG. 7A, with the exception of the source resistor Rs of FIG. 7A which has advantageously been replaced in FIG. 13E by an actively controlled (e.g., by the controller 120 using gate control signal $GATE_S$) source switch $M_S$ to rapidly charge the source capacitor $C_S$. In other example embodiments (not shown), the respective source resistors Rs of the pulsed laser diode driver 702 of FIG. 7B, the pulsed laser diode driver 703 of FIG. 7C, the pulsed laser diode driver 704 of FIG. 7D, and the pulsed laser diode driver 705 of FIG. 7E are similarly replaced by a respective actively controlled source switch to rapidly charge the respective source capacitors $C_S$ of the laser diode drivers 702/703/704/705.

Figure 13F:
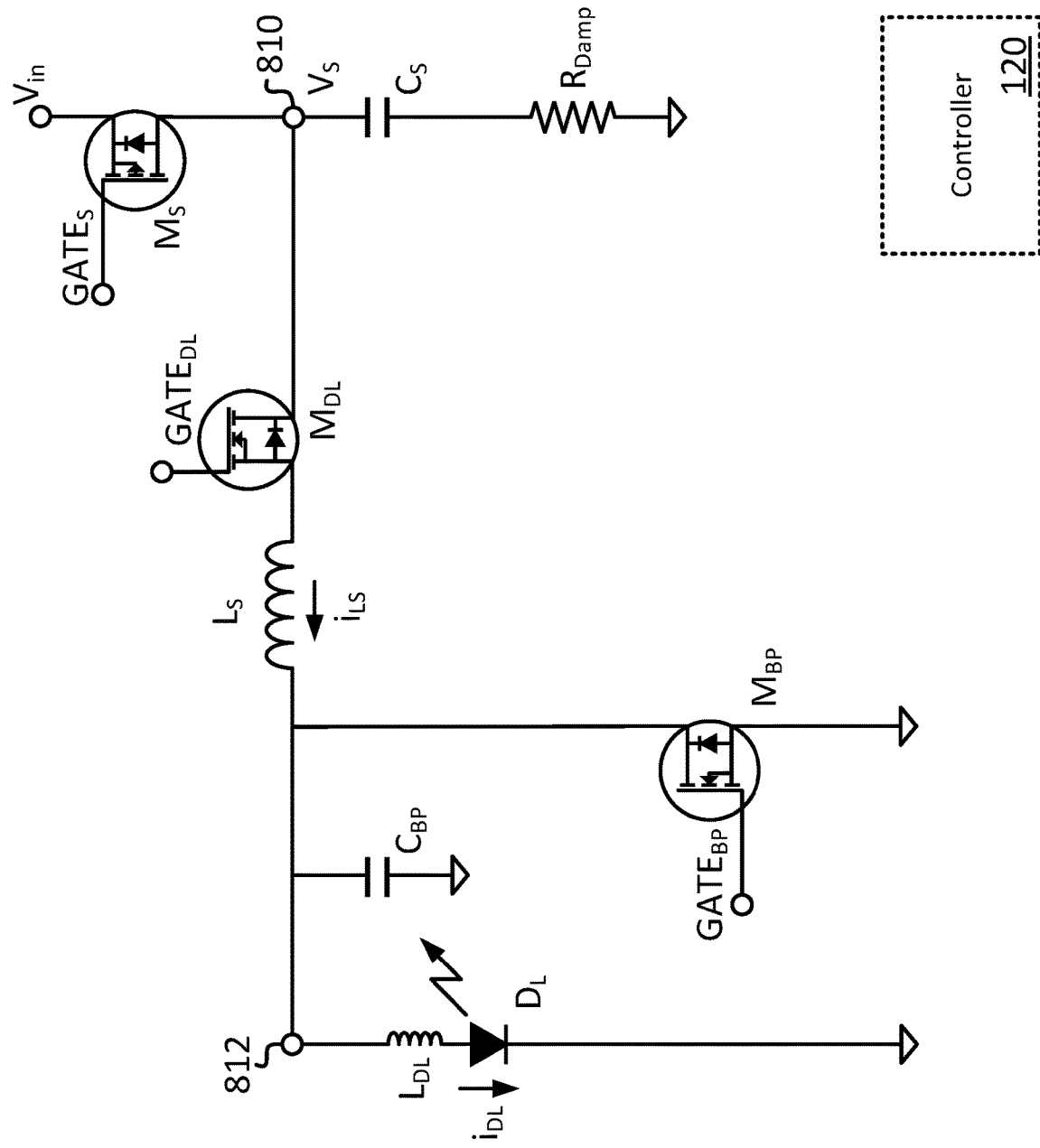

FIG. 13F shows a sixth example embodiment of a pulsed laser diode driver 1306 having all of the components, signals, and nodes described above with reference to the pulsed laser diode driver 801 of FIG. 8A, with the exception of the source resistor Rs of FIG. 8A which has advantageously been replaced in FIG. 13F by an actively controlled (e.g., by the controller 120 using gate control signal $GATE_S$) source switch $M_S$ to rapidly charge the source capacitor $C_S$. In other example embodiments (not shown), the source resistor Rs of the pulsed laser diode driver 802 of FIG. 8B is similarly replaced by an actively controlled source switch to rapidly charge the source capacitor $C_S$ of the pulsed laser diode driver 802.

Figure 13G:
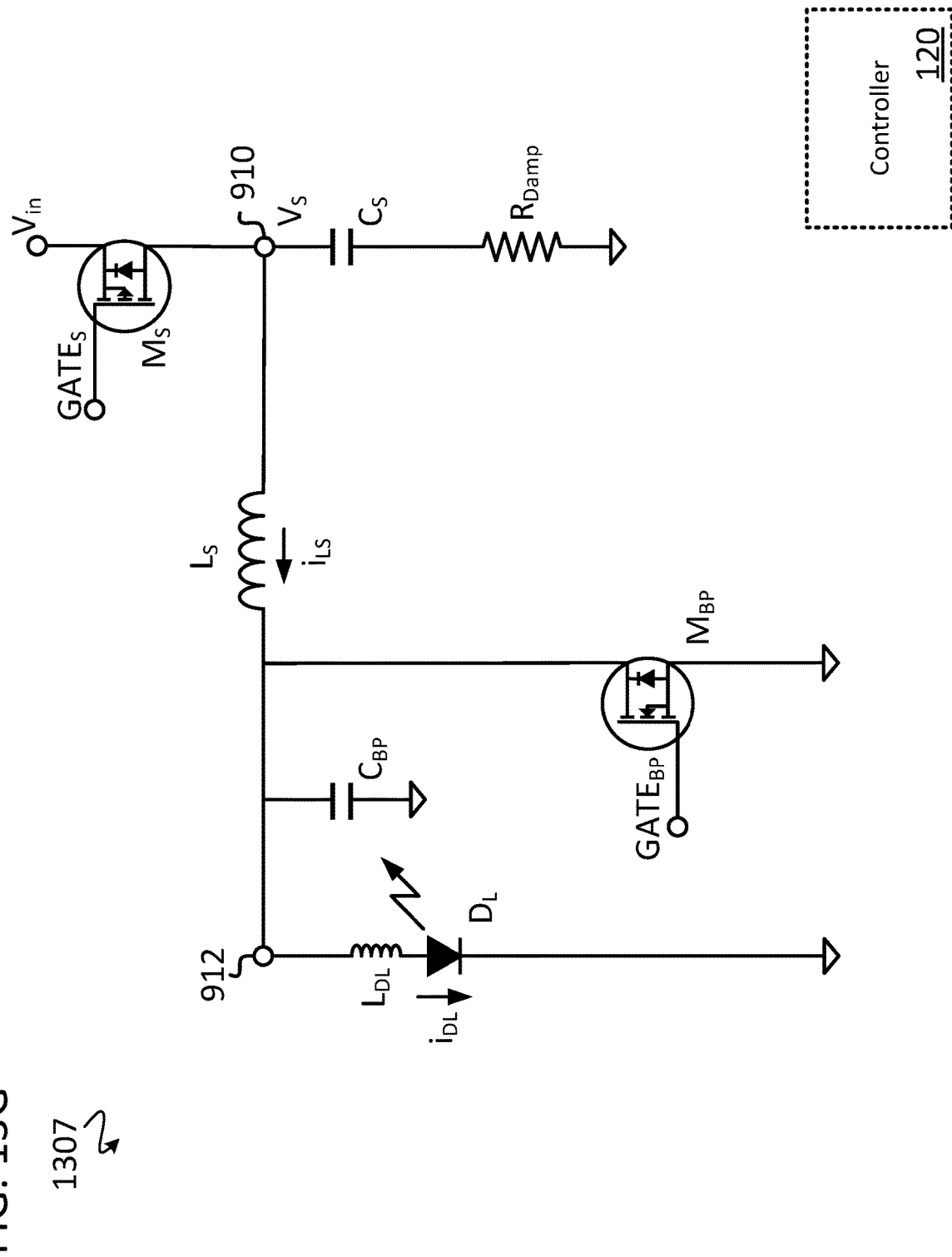

FIG. 13G shows a seventh example embodiment of a pulsed laser diode driver 1307 having all of the components, signals, and nodes described above with reference to the pulsed laser diode driver 901 of FIG. 9A, with the exception of the source resistor Rs of FIG. 9A which has advantageously been replaced in FIG. 13G by an actively controlled (e.g., by the controller 120 using gate control signal $GATE_S$) source switch $M_S$ to rapidly charge the source capacitor $C_S$. In other example embodiments (not shown), the source resistor Rs of the laser diode driver 902 of FIG. 9B is similarly replaced by an actively controlled source switch to rapidly charge the source capacitor $C_S$ of the laser diode driver 902.

Figure 13H:
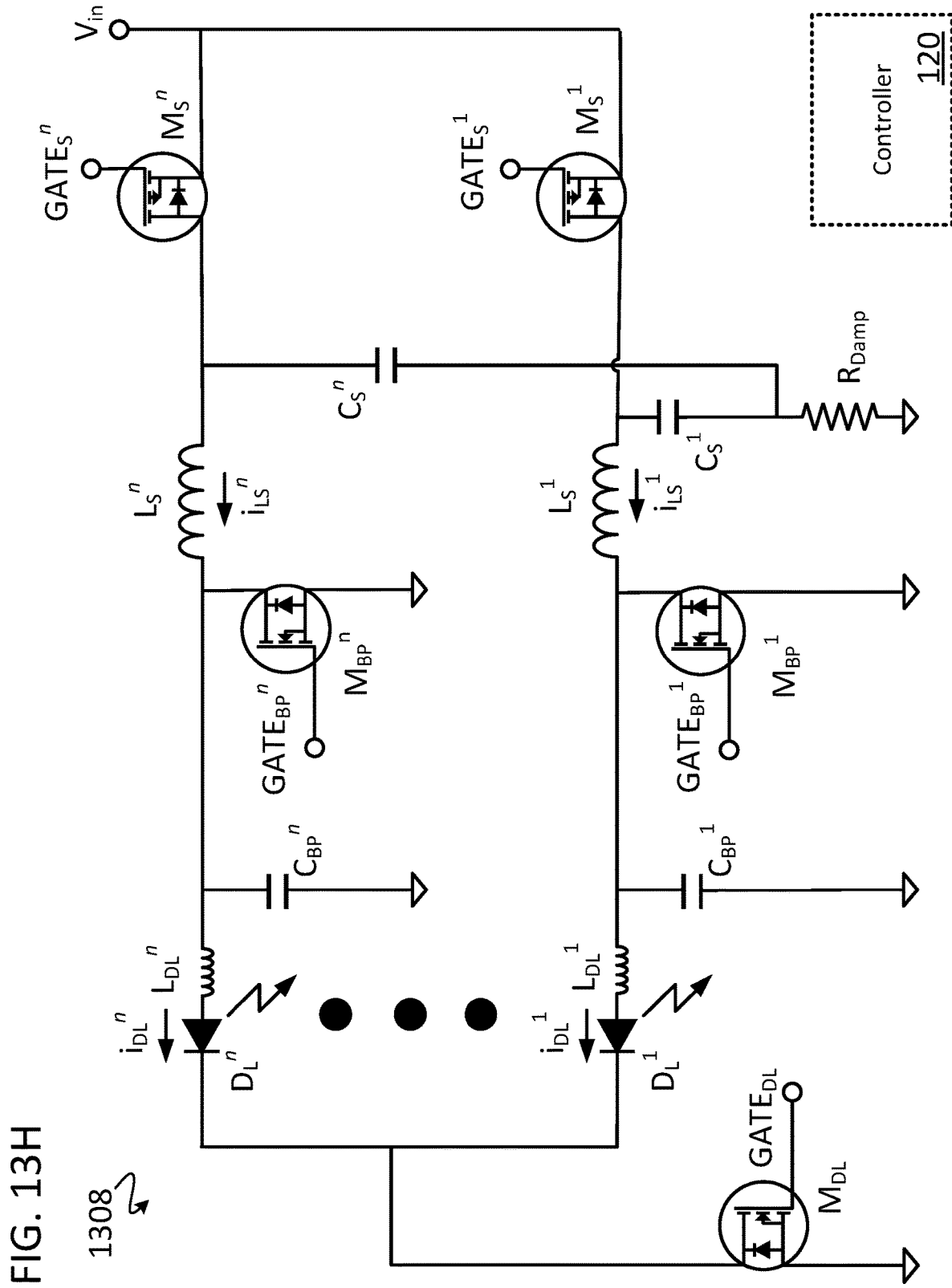

FIG. 13H shows an eighth example embodiment of a pulsed laser diode driver 1308 having all of the components, signals, and nodes described above with reference to the multi-channel pulsed laser diode driver 1002 of FIG. 10A, with the exception of the source resistors $R_S^1$ though $R_S^n$ of FIG. 10A which have advantageously been replaced in FIG. 13H by respective actively controlled (e.g., by the controller 120 using gate control signals $GATE_S^1$ through $GATE_S^n$) source switches $M_S^1$ through $M_S^n$ to rapidly charge the source capacitors $C_S^1$ through $C_S^n$.

Figure 13I:
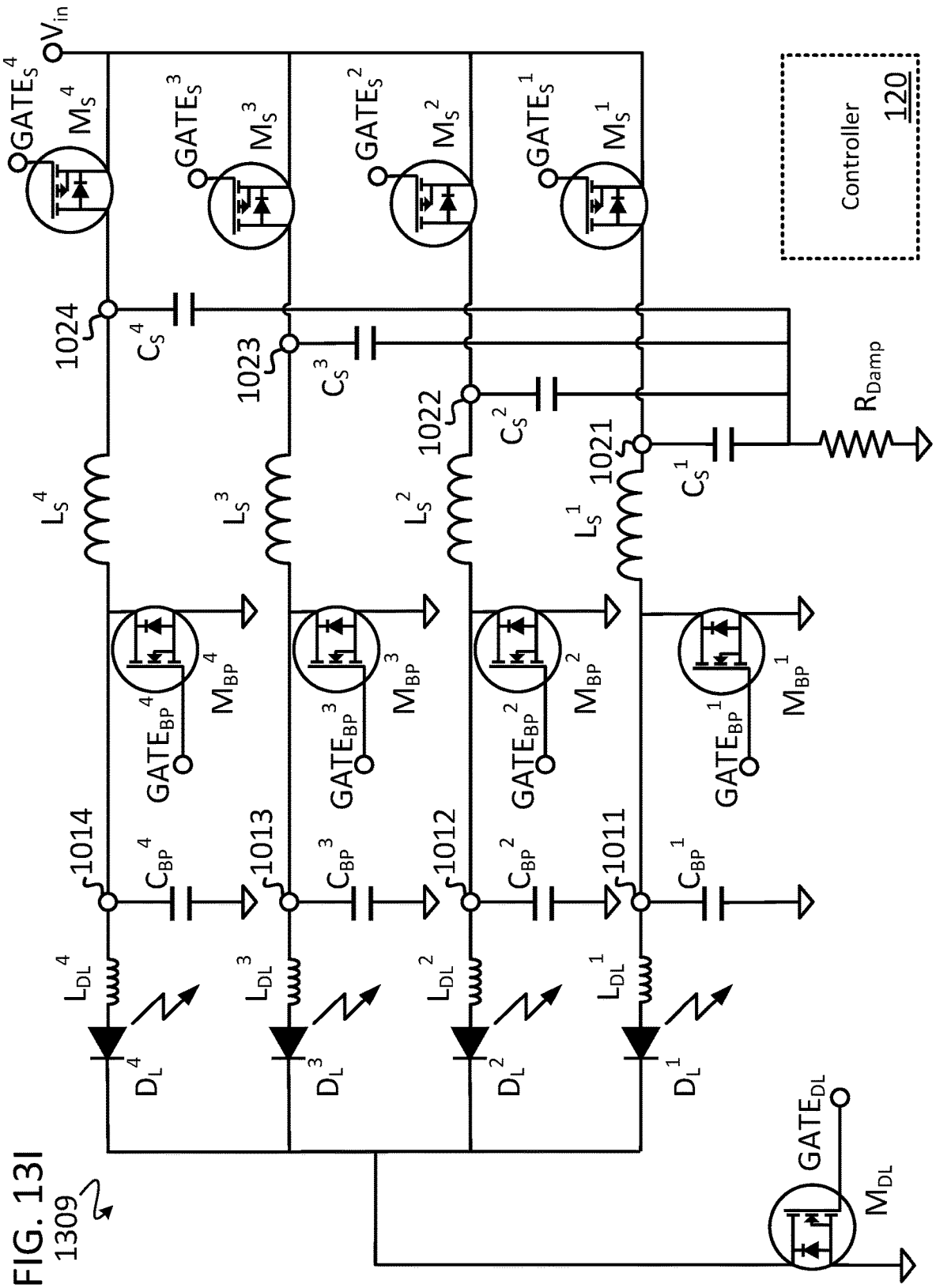

FIG. 13I shows a ninth example embodiment of a pulsed laser diode driver 1309 having all of the components, signals, and nodes described above with reference to the multi-channel pulsed laser diode driver 1004 of FIG. 10B, with the exception of the source resistors $R_S^1$ through $R_S^4$ of FIG. 10B which have advantageously been replaced in FIG. 13I by respective actively controlled (e.g., by the controller 120 using gate control signals $GATE_S^1$ through $GATE_S^4$)

source switches $M_S^1$ through $M_S^4$ to rapidly charge the source capacitors $C_S^1$ through $C_S^4$.

Figure 14:
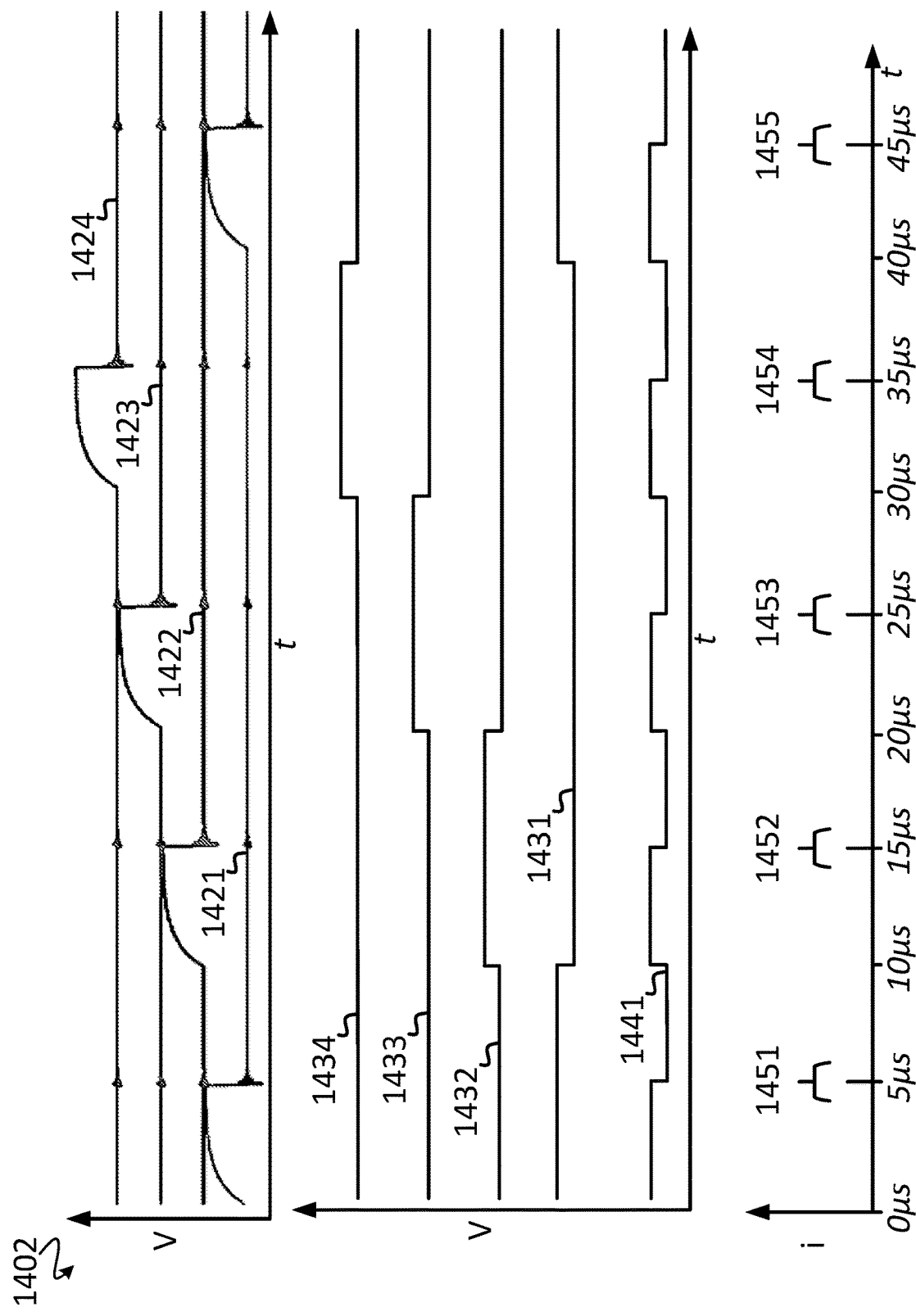
FIG. 14 shows simplified plots of signals related to operation of the pulsed laser diode driver shown in FIG. 13I, in accordance with some embodiments.

Simplified example waveforms 1402 of signals related to the operation of the multi-channel pulsed laser diode driver 1309 of FIG. 13I are shown in FIG. 14, in accordance with some embodiments. The simplified example waveforms 1402 include waveforms 1421 through 1424 illustrating respective voltages across the source capacitor $C_S^1$ through $C_S^4$ at nodes 1021 through 1024 of FIG. 13I, respectively. Also shown are waveforms 1431 through 1434 which illustrate when a respective channel of the multi-channel pulsed laser diode driver 1309 is enabled, a clock signal 1441, and high-current pulses 1451 through 1455. As shown, the multi-channel pulsed laser diode driver 1309 is operable to emit a high-current pulse 1451 through 1455 to drive a respective laser diode $D_L^1$ through $D_L^4$, a pulse being emitted every 10 μs. The examples shown in FIGS. 13A-13I are merely select examples of pulsed laser diode driver circuits configured to advantageously use a source switch (i.e., $M_S$) for rapid charging of a source capacitor (i.e., $C_S$). In some embodiments, any of the pulsed laser diode drivers 101-103, 401-404, 501-504, 601-604, 701-705, 801-802, 901-902, 1002-1004 are configured to use a source switch (i.e., $M_S$) instead of a source resistor (i.e., $R_S$) to rapidly charge a source capacitor (i.e., $C_S$).

Figure 15:
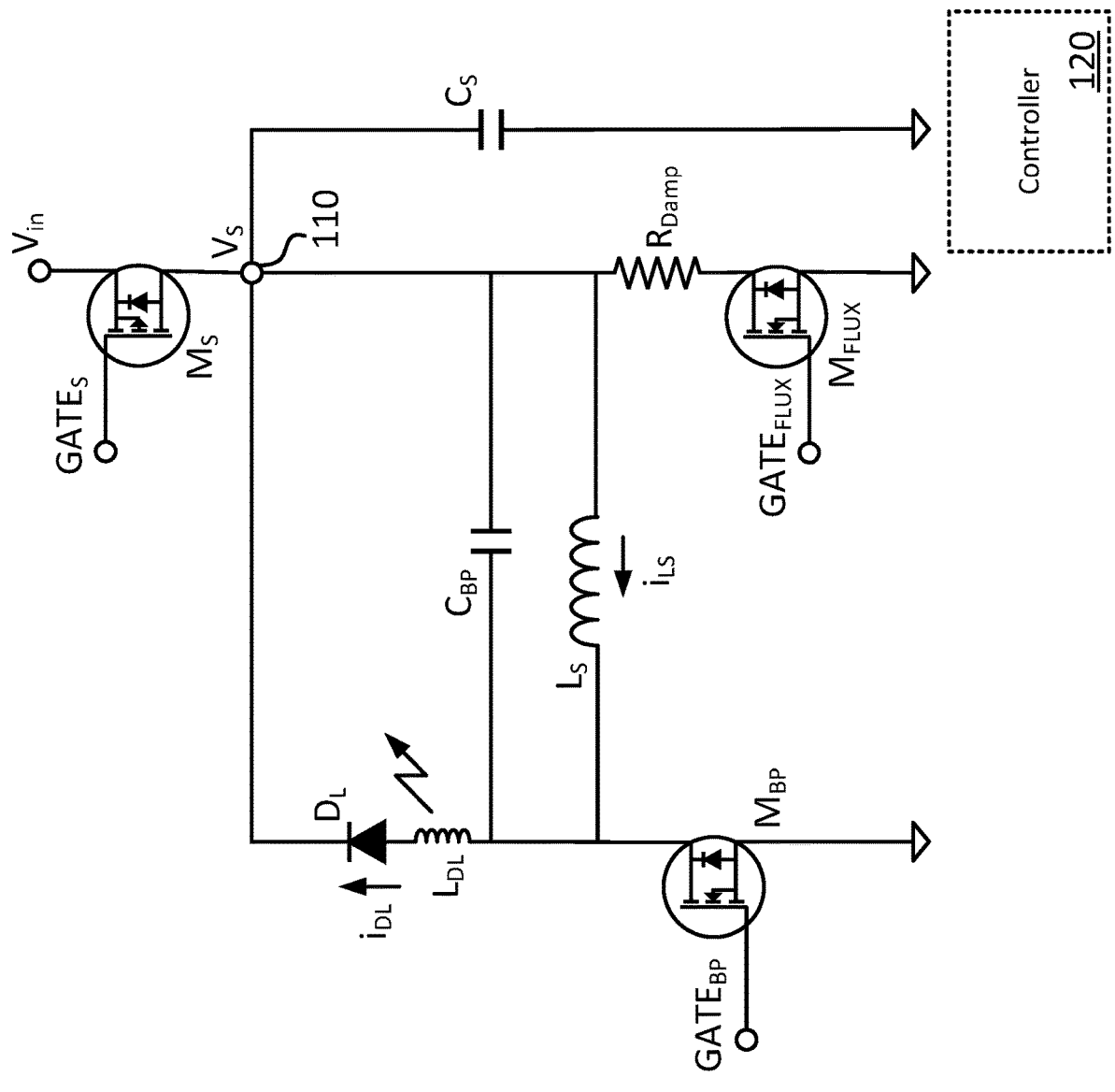
FIG. 15 shows a simplified circuit schematic of a pulsed laser diode driver of a ninth general topology, in accordance with some embodiments.

FIG. 15 shows a simplified circuit schematic of a pulsed laser diode driver 1501 of a ninth general topology, in accordance with some embodiments. The pulsed laser diode driver 1501 generally includes a source switch $M_S$, a source capacitor $C_S$, a damping resistor $R_{Damp}$, an inductor $L_S$, a bypass capacitor $C_{BP}$, a laser diode $D_L$, a bypass switch $M_{BP}$, and a flux switch $M_{FLUX}$. The flux switch $M_{FLUX}$ is configured as a low-side switch. Also shown is the controller 120, node 110, a parasitic inductance $L_{DL}$ of the laser diode $D_L$, a DC input voltage $V_{in}$, a source voltage $V_s$ at the source capacitor $C_S$, a current $i_{LS}$ through the inductor $L_S$, a current $i_{DL}$ through the laser diode $D_L$, a bypass switch gate driver signal $GATE_{BP}$, and a flux switch gate driver signal $GATE_{FLUX}$.

As shown in FIG. 15, a first terminal of the source switch $M_S$ is directly electrically connected to the DC input voltage $V_{in}$. In other embodiments (not shown), the source switch $M_S$ may be replaced with a source resistor $R_S$. A second terminal of the source switch $M_S$ is directly electrically connected to a first terminal of the source capacitor $C_S$. A second terminal of the source capacitor $C_S$ is directly electrically connected to a bias voltage node such as ground. The second terminal of the source switch $M_S$ is directly electrically connected to a cathode of the laser diode $D_L$, a first terminal of the damping resistor $R_{Damp}$, a first terminal of the bypass capacitor $C_{BP}$, and a first terminal of the inductor $L_S$. A second terminal of the damping resistor $R_{Damp}$ is directly electrically connected to a first terminal of the flux switch $M_{FLUX}$, and a second terminal of the flux switch $M_{FLUX}$ is directly electrically connected to a bias voltage node such as ground. An anode of the laser diode $D_L$ is directly electrically connected to a second terminal of the bypass capacitor $C_{BP}$, a second terminal of the inductor $L_S$, and to a first terminal of the bypass switch $M_{BP}$. A second terminal of the bypass switch $M_{BP}$ is directly electrically connected to a bias voltage node such as ground.

The bypass switch $M_{BP}$ is configured to receive the bypass switch gate driver signal $GATE_{BP}$ at a gate node (e.g., from the controller 120), the bypass switch gate driver signal $GATE_{BP}$ being operable to turn the bypass switch $M_{BP}$ on or off based on a voltage level of the bypass switch gate driver signal $GATE_{BP}$. The source switch $M_S$ is configured to receive the source switch gate driver signal $GATE_S$ at a gate node (e.g., from the controller 120), the source switch gate driver signal $GATE_S$ being operable to turn the source switch $M_S$ on or off based on a voltage level of the source switch gate driver signal $GATE_S$. Similarly, the flux switch $M_{FLUX}$ is configured to receive the flux switch gate driver signal $GATE_{FLUX}$ at a gate node (e.g., from the controller 120), the flux switch gate driver signal $GATE_{FLUX}$ being operable to turn the flux switch $M_{FLUX}$ on or off based on a voltage level of the flux switch gate driver signal $GATE_{FLUX}$. Any or all of the bypass switch $M_{BP}$, the source switch $M_S$, and/or the flux switch $M_{FLUX}$ can be implemented as N-type switches or P-type switches. In some embodiments, the bypass switch $M_{BP}$, the source switch $M_S$, and/or the flux switch $M_{FLUX}$ are implemented as Silicon-based or Silicon-Carbide-based field-effect transistors (FETs).

In some embodiments, the pulsed laser diode driver 1501 is configured to receive the DC input voltage $V_{in}$ having a voltage range from about 10V to 20V, which is advantageously lower than an input voltage used by many conventional pulsed laser diode drivers. The inductor $L_S$ is a physical component added to the pulsed laser diode driver 1501 (i.e., as opposed to a representation of a parasitic inductance caused by components or interconnections such as bond wires). Similarly, the bypass capacitor $C_{BP}$ is a physical component added to the pulsed laser diode driver 1501 (i.e., as opposed to a representation of a parasitic capacitance). One advantage of using physical inductor and capacitor components rather than using parasitic inductances and capacitances is that values of the inductor $L_S$ and the bypass capacitor $C_{BP}$ can be easily modified by a designer or even an end-user. By comparison, conventional designs that rely on parasitic reactances may require re-design and/or re-layout to change an operating parameter.

As disclosed herein, values of the DC input voltage $V_{in}$, the inductance of the inductor $L_S$, the capacitance of the source capacitor $C_S$, the resistance of the damping resistor $R_{Damp}$, and the capacitance of the bypass capacitor $C_{BP}$ can advantageously be selected ("tuned") to achieve a desired operation of the pulsed laser diode driver 1501 (e.g., a charge time, a pulse width, a pulse voltage, a pulse current). For example, a pulse width of the current $i_{DL}$ flowing through the laser diode $D_L$ can be tuned by adjusting the capacitance value of the bypass capacitor $C_{BP}$. A peak current level of the pulse of current $i_{DL}$ flowing through the laser diode $D_L$ can be tuned by adjusting the source voltage $V_s$ on the supply capacitor $C_S$. A capacitance value of the source capacitor $C_S$ can be tuned to adjust a timing delay of the high-current pulse and an upper range of the current $i_{DL}$ through the laser diode $D_L$. Resistance values of the damping resistor $R_{Damp}$ are dependent on the capacitance value of the supply capacitor $C_S$ and can be tuned within a range of values such that at a lower resistance, a lower frequency resonance of the pulsed laser diode drivers disclosed herein is underdamped (e.g., at about $R_{Damp}$=0.1 Ohm), or is critically damped (e.g., at about $R_{Damp}$=0.4 Ohm). The damping resistor $R_{Damp}$ is operable to prevent current of the generated resonant waveform from becoming negative which could thereby enable a body diode of the bypass switch $M_{BP}$ or the flux switch $M_{FLUX}$. Although a resulting maximum current level of the current $i_{DL}$ through the laser diode $D_L$ is lower for the critically damped case, the current level can be easily adjusted by raising the voltage level of the DC input voltage $V_{in}$.

In some embodiments, the DC input voltage $V_{in}$ is about 15V, the inductance of the inductor $L_S$ is about 6 nH, the capacitance of the source capacitor $C_S$ is about 100 nF, the resistance of the damping resistor $R_{Damp}$ is about 0.1 Ohm, and the capacitance of the bypass capacitor $C_{BP}$ is about 1 nF. In some embodiments, a voltage at the first terminal of the damping resistor $R_{Damp}$ is received by the controller 120 to provide an indication of a current flow through the damping resistor $R_{Damp}$.

Typical resonant driver designs often require a damping resistor to minimize ringing duration. However, the added damping resistor $R_{Damp}$ dissipates power which may lower the overall power efficiency of the design as compared to a resonant driver that does not have a damping resistor. Thus, in some embodiments, the pulsed laser diode driver 1501 advantageously allows current to flow through the damping resistor $R_{Damp}$ during portions of a switching sequence (e.g., the switching sequence 300) in which the damping resistor $R_{Damp}$ critically damps ringing, and prevents current from flowing through the damping resistor $R_{Damp}$ during portions of the switching sequence when the damping resistor $R_{Damp}$ is not needed to damp ringing. The pulsed laser diode driver 1501 allows current to flow through the damping resistor $R_{Damp}$ by enabling the flux switch $M_{FLUX}$ and prevents current from flowing through the damping resistor $R_{Damp}$ by disabling the flux switch $M_{FLUX}$. Such dynamic control of current flow through the damping resistor $R_{Damp}$ advantageously increases an overall power efficiency of the pulsed laser diode driver 1501 as compared to a pulsed laser diode driver circuit that allows current to flow through a damping resistor for the entirety of a switching sequence.

During operation, the source capacitor $C_S$ is discharged through the inductor $L_S$ by the bypass switch $M_{BP}$. This configuration provides a maximum peak current through the laser diode $L_{DL}$ but requires the series damping resistor $R_{Damp}$ to prevent the waveform from ringing for a long duration. Until the ringing stops and the voltage and current are zero, the bypass switch $M_{BP}$ cannot be turned off. Unfortunately, the damping resistor $R_{Damp}$ dissipates power as long as current flows through the damping resistor $R_{Damp}$. Thus, the pulsed laser diode driver 1501 advantageously provides an optimal power efficiency by preventing current from flowing through the damping resistor $R_{Damp}$ during an initial precharge step (e.g., step 301 of FIG. 3), a preflux step (e.g., step 302 of FIG. 3), and a pulse generation step (e.g., step 303 of FIG. 3) of a switching sequence (e.g., the switching sequence 300 of FIG. 3). However, current is allowed, by the flux switch $M_{FLUX}$, to flow through the damping resistor $R_{Damp}$ after the high-current pulse has been generated (e.g., at step 303 of FIG. 3) to remove remaining ringing by critically damping the RLC network of the pulsed laser diode driver 1501.

During the precharge step (e.g., step 301 of FIG. 3), the preflux step (e.g., step 302 of FIG. 3), and the pulse generation step (e.g., step 303 of FIG. 3) of the switching sequence (e.g., the switching sequence 300 of FIG. 3), the flux switch $M_{FLUX}$ is disabled, thereby creating an undamped LC network. However, after pulse generation, the flux switch $M_{FLUX}$ is enabled and the damping resistor $R_{Damp}$ creates a parallel RLC network to critically damp ringing and thereby provide a maximum power efficiency and fast recovery of the pulsed laser diode driver 1501 to start a next switching sequence.

Figure 16A:
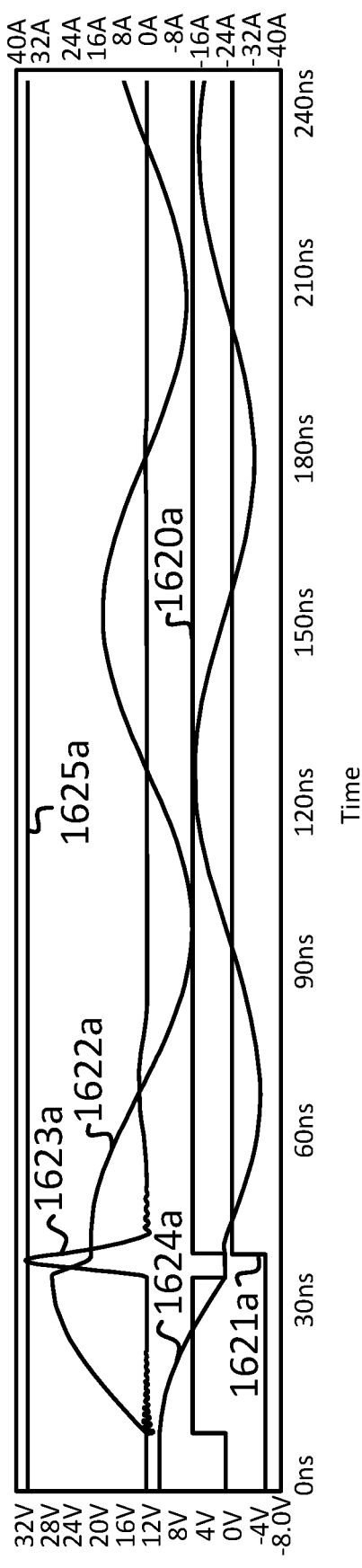
FIGS. 16A-16B show simplified plots of signals related to operation of the pulsed laser diode driver shown in FIG. 15, in accordance with some embodiments.
Figure 16B:
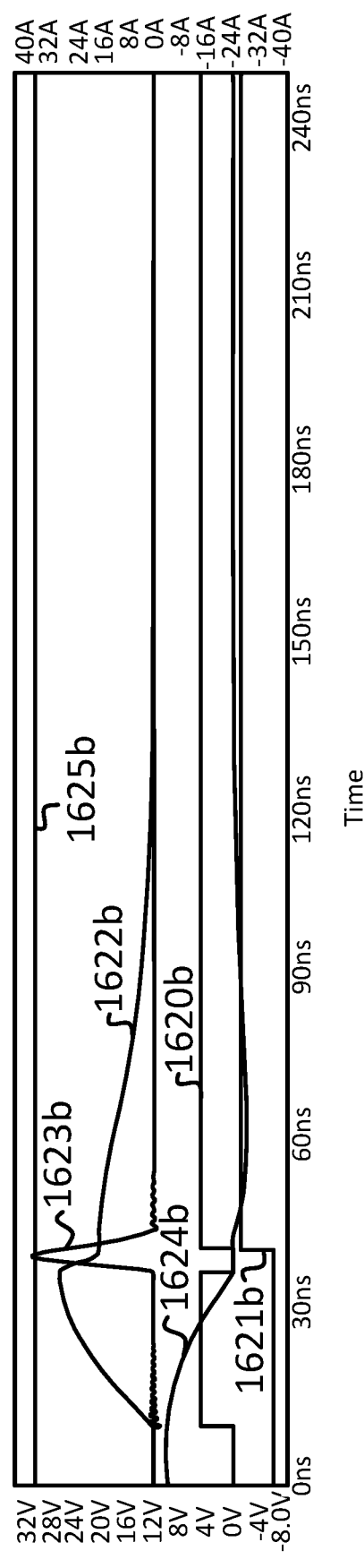

For example, FIGS. 16A-16B show simplified plots, 1620a-b, 1621a-b, 1622a-b, 1623a-b, 1624a-b, and 1625a-b, of signals related to operation of the pulsed laser diode driver 1501 shown in FIG. 15, in accordance with some embodiments. In particular, FIG. 16A illustrates operation of the pulsed laser diode driver 1501 when a damping resistor (i.e., the damping resistor $R_{Damp}$) underdamps ringing of the pulsed laser diode driver 1501. In comparison, FIG. 16B illustrates operation of the pulsed laser diode driver 1501 when a damping resistor (i.e., the damping resistor $R_{Damp}$) is used to critically damp ringing of the pulsed laser diode driver 1501.

With reference to FIGS. 16A-16B, the simplified plots illustrate voltage plots of the bypass switch gate driver signal $GATE_{BP}$ 1620a-b, voltage plots of the flux switch gate driver signal $GATE_{FLUX}$ 1621a-b, current plots of the current $i_{LS}$ through the inductor $L_S$ 1622a-b, current plots of the current $i_{DL}$ through the laser diode $D_L$ 1623a-b, voltage plots of the source voltage $V_S$ 1624a-b at the source capacitor $C_S$, and voltage and current plots 1625a-b of a voltage and current source used to establish a plot scale, all over the same duration of time. Details of these signals are described below. The voltage plots of the bypass switch gate driver signal $GATE_{BP}$ 1620a-b and the flux switch gate driver signal $GATE_{FLUX}$ 1621a-b have been level-shifted for readability, but are, in actuality, low voltage inputs. Additionally, the voltage plots of the bypass switch gate driver signal $GATE_{BP}$ 1620a-b and the flux switch gate driver signal $GATE_{FLUX}$ 1621a-b assume that the flux switch $M_{FLUX}$ and the bypass switch $M_{BP}$ are NFET devices. However, if PFET devices are used instead, the polarity of the bypass switch gate driver signal $GATE_{BP}$ 1620a-b and the flux switch gate driver signal $GATE_{FLUX}$ 1621a-b are inverted.

In the example shown in FIG. 16A, with reference to FIG. 15, a resistance value of 10 Ohms is used for the damping resistor $R_{Damp}$ of the pulsed laser diode driver 1501 in which $L_S$=6 nH, and $C_{BP}$=1 nF, and $L_{DL}$ is about 1 nH. As expected, the waveforms 1622a and 1624a are very underdamped as shown by prolonged oscillations (i.e., "ringing"). As is known in the art, for a parallel RLC circuit, the damping coefficient d is expressed as:

$$d = \frac{1}{2R} \times \sqrt{\frac{L}{C}}. \qquad \text{(Equation 1)}$$

Thus, if a critically damped waveform is desired, an optimal resistance R value of the damping resistor $R_{Damp}$ can be determined by setting the damping coefficient din Equation 1 to a value of d=1 and solving Equation 1 for R using the values mentioned above. In the example shown in FIG. 16B, a resistance value of 0.175 Ohms is used for the damping resistor $R_{Damp}$ of the pulsed laser diode driver 1501. As expected, the waveforms 1622b and 1624b are thereby critically damped as shown by the absence of prolonged oscillations (i.e., "ringing").

In some embodiments, the damping resistor $R_{Damp}$ can be eliminated by using a weak switch having an on-resistance Rdson that is about the desired resistance value determined using Equation 1. In such embodiments, if adjustment of the resistance value is desired, a segmented FET can be used to thereby allow the on-resistance Rdson to be modified to match the damping resistance required.

Additionally, although it would initially appear that placing the source capacitor $C_S$ in series with the laser diode $D_L$ would raise the required anode voltage to pulse the laser diode $D_L$, the voltage and current of the source capacitor $C_S$ are 90-degrees out of phase with one another. As shown by waveforms 1624a-b, because the current pulse (i.e., 1623a-b) through the laser diode $D_L$ is advantageously aligned with a peak current amplitude, voltage at the source capacitor $C_S$ at that time is zero due to the 90-degree phase shift. In some embodiments, a beginning of the high-current pulse could be determined by sensing when the source voltage $V_S$ at the source capacitor $C_S$ is at zero, at which point the high-current pulse through the laser diode $D_L$ should begin.

For some applications, the amplitude of a high-current pulse delivered by a resonant circuit such as any of those disclosed herein may need to be adjusted in amplitude from pulse-to-pulse. Thus, in some embodiments, any of the pulsed laser drivers disclosed herein are advantageously operable to configure an amplitude of the high-current pulse delivered to one or more laser diodes on a pulse-to-pulse basis.

Figure 17:
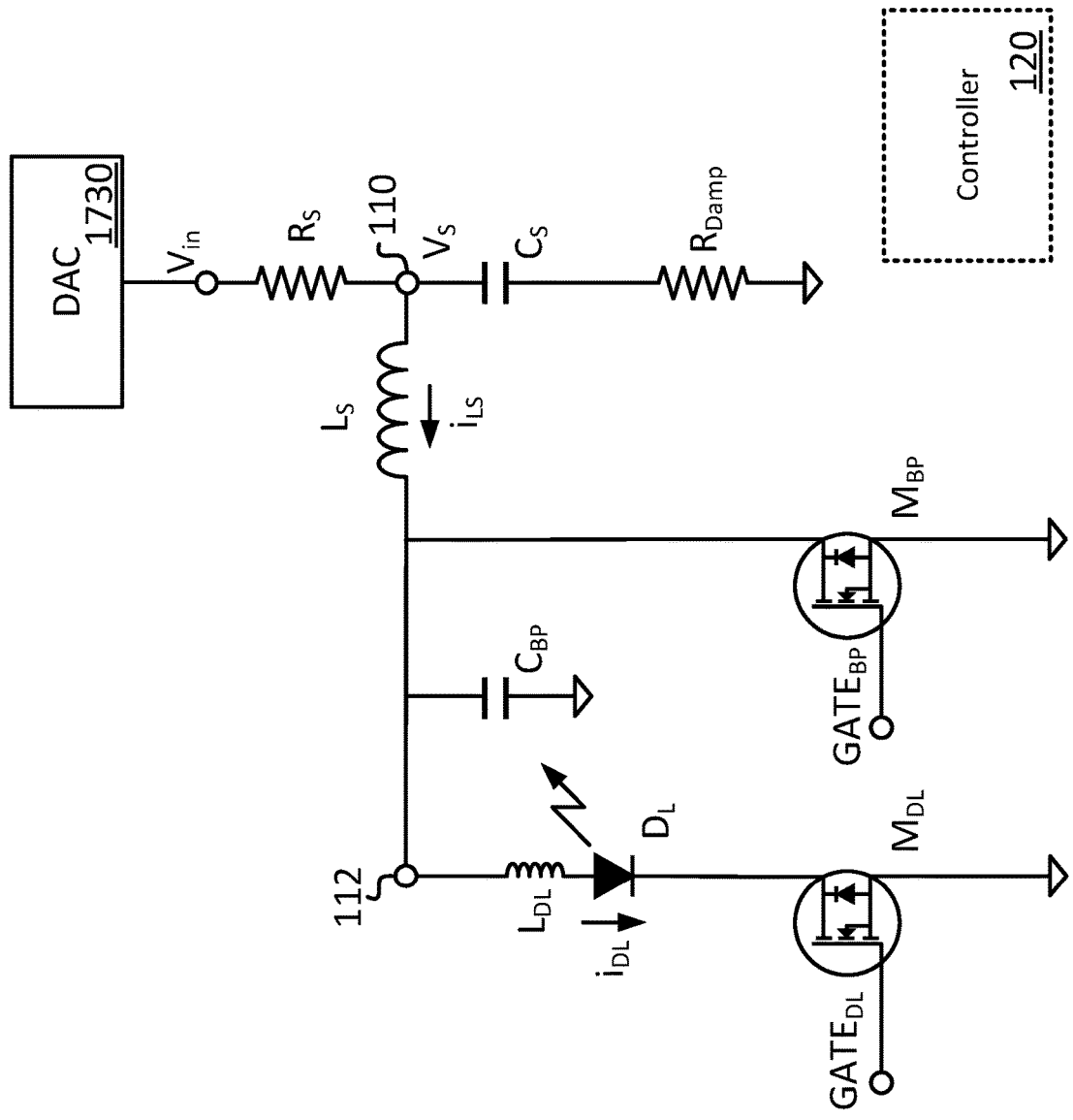
FIGS. 17, 18, 19, and 20 are simplified circuit schematics of pulsed laser diode drivers having an adjustable DC input voltage, in accordance with some embodiments.
Figure 18:
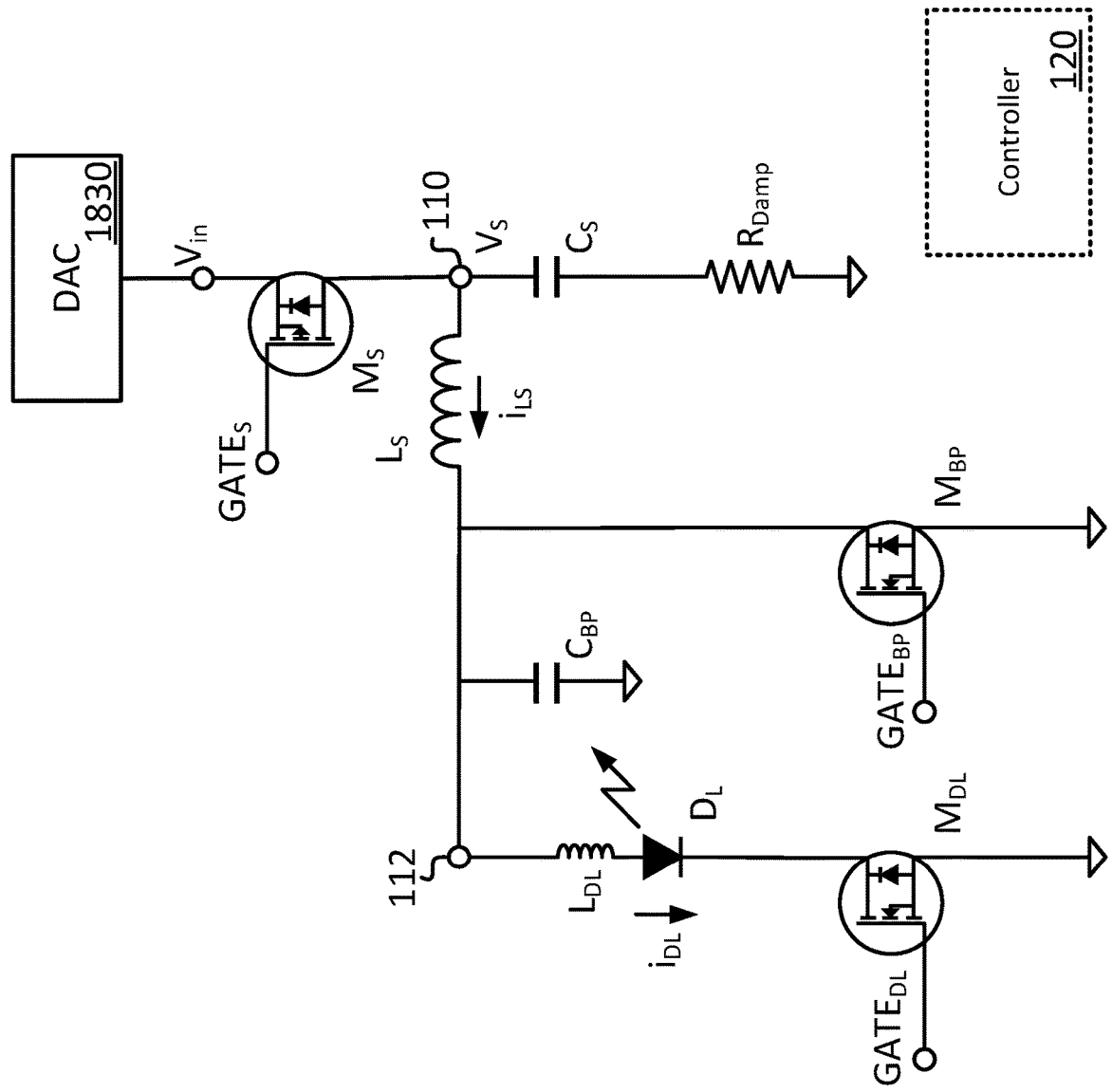
Figure 19:
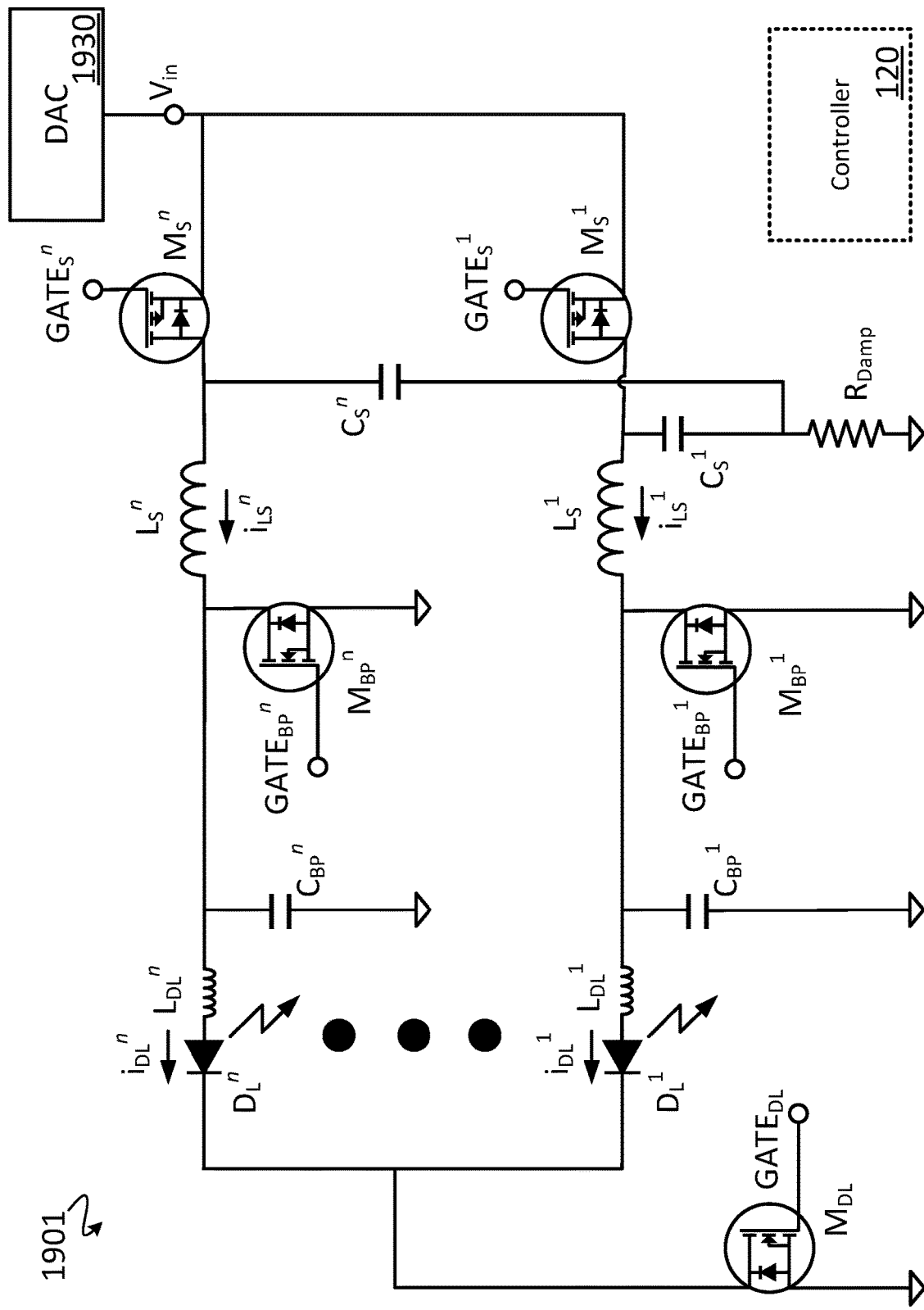
Figure 20:
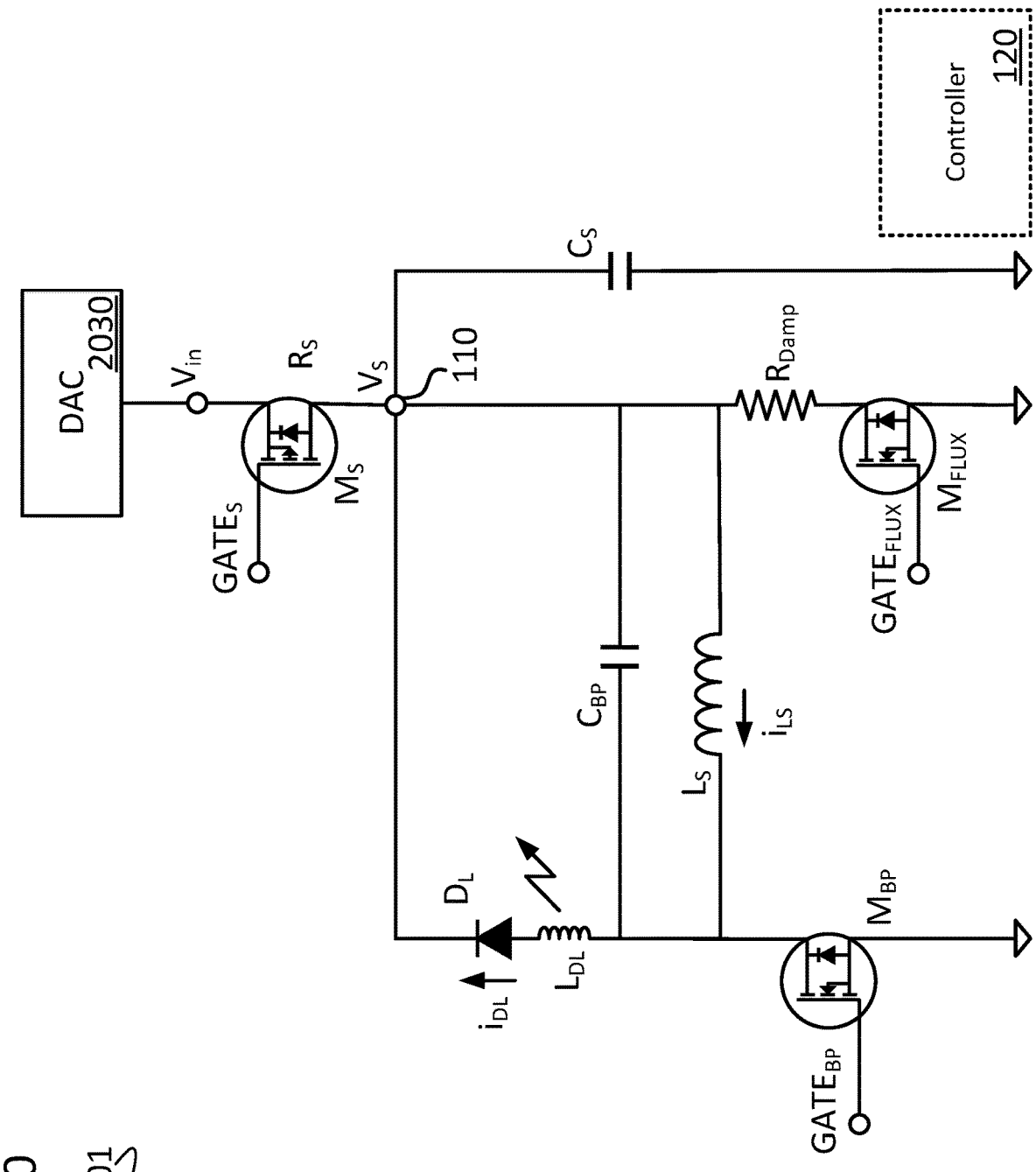

As shown in FIG. 17, FIG. 18, FIG. 19, and FIG. 20, the DC input voltage $V_{in}$ is advantageously provided by an adjustable voltage supply (i.e., a digital-to-analog converter (DAC)). In some embodiments, an output voltage level of the adjustable voltage supply is set using the controller 120. For example, FIG. 17 illustrates a pulsed laser diode driver circuit 1701 that is the same as the pulsed laser diode driver 101 shown in FIG. 1A with the exception that the DC input voltage $V_{in}$ is generated by a DAC 1730. FIG. 18 illustrates a pulsed laser diode driver circuit 1801 that is the same as the pulsed laser diode driver 1301 shown in FIG. 13A with the exception that the DC input voltage $V_{in}$ is generated by a DAC 1830. FIG. 19 illustrates a pulsed laser diode driver circuit 1901 that is the same as the pulsed laser diode driver 1308 shown in FIG. 13H with the exception that the DC input voltage $V_{in}$ is generated by a DAC 1930. FIG. 20 illustrates a pulsed laser diode driver circuit 2001 that is the same as the pulsed laser diode driver 1501 shown in FIG. 15 with the exception that the DC input voltage $V_{in}$ is generated by a DAC 2030. The examples shown in FIG. 17, FIG. 18, FIG. 19, and FIG. 20 are merely select examples of pulsed laser diode driver circuits configured to receive a DC input voltage from an adjustable voltage source (e.g., a DAC or a different adjustable voltage source as is known in the art). In some embodiments, any of the pulsed laser diode drivers 101-103, 401-404, 501-504, 601-604, 701-705, 801-802, 901-902, 1002-1004, 1301-1309, and/or 1501 are configured to receive the DC input voltage $V_{in}$ from an adjustable voltage source such as a DAC.

Use of an adjustable voltage supply, such as a DAC, to provide the DC input voltage $V_{in}$ to the pulsed laser diode driver circuits disclosed herein is possible because of the advantageously low input voltage requirements for such embodiments. In some embodiments, the adjustable voltage supply is clocked such that the adjustable voltage supply charges the source capacitor $C_S$ described herein only during a first portion of a clock period (e.g., a positive portion). As such, the value of the DC input voltage $V_{in}$ and a current amplitude of the high-current pulse delivered to the laser diode(s) disclosed herein may be advantageously varied between consecutive high-current pulses through the laser diode(s).

Figure 21A:
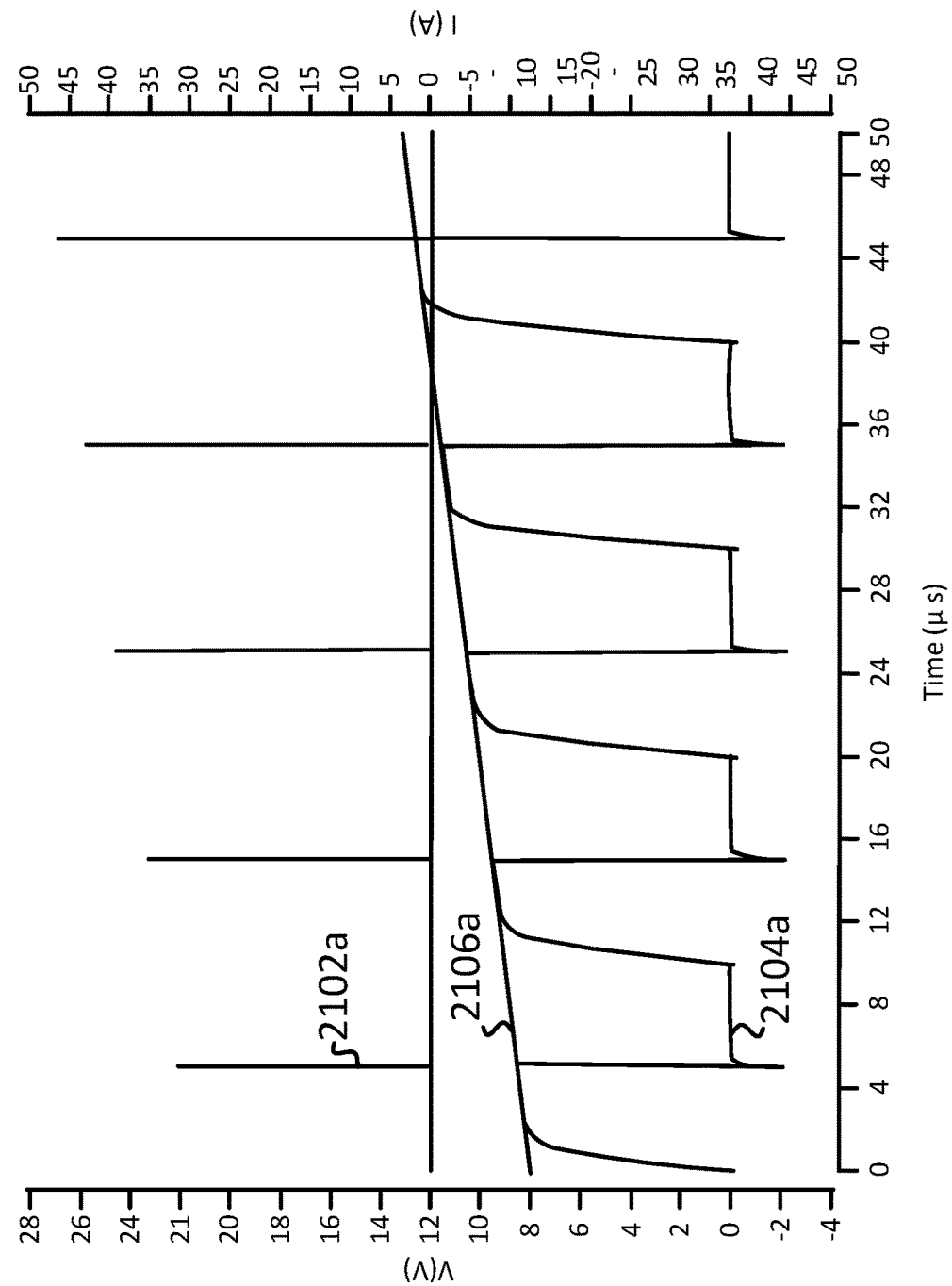
FIGS. 21A-21B are simplified plots of signals related to operation of the pulsed laser diode drivers shown in FIGS. 17, 18, 19, and 20.
Figure 21B:
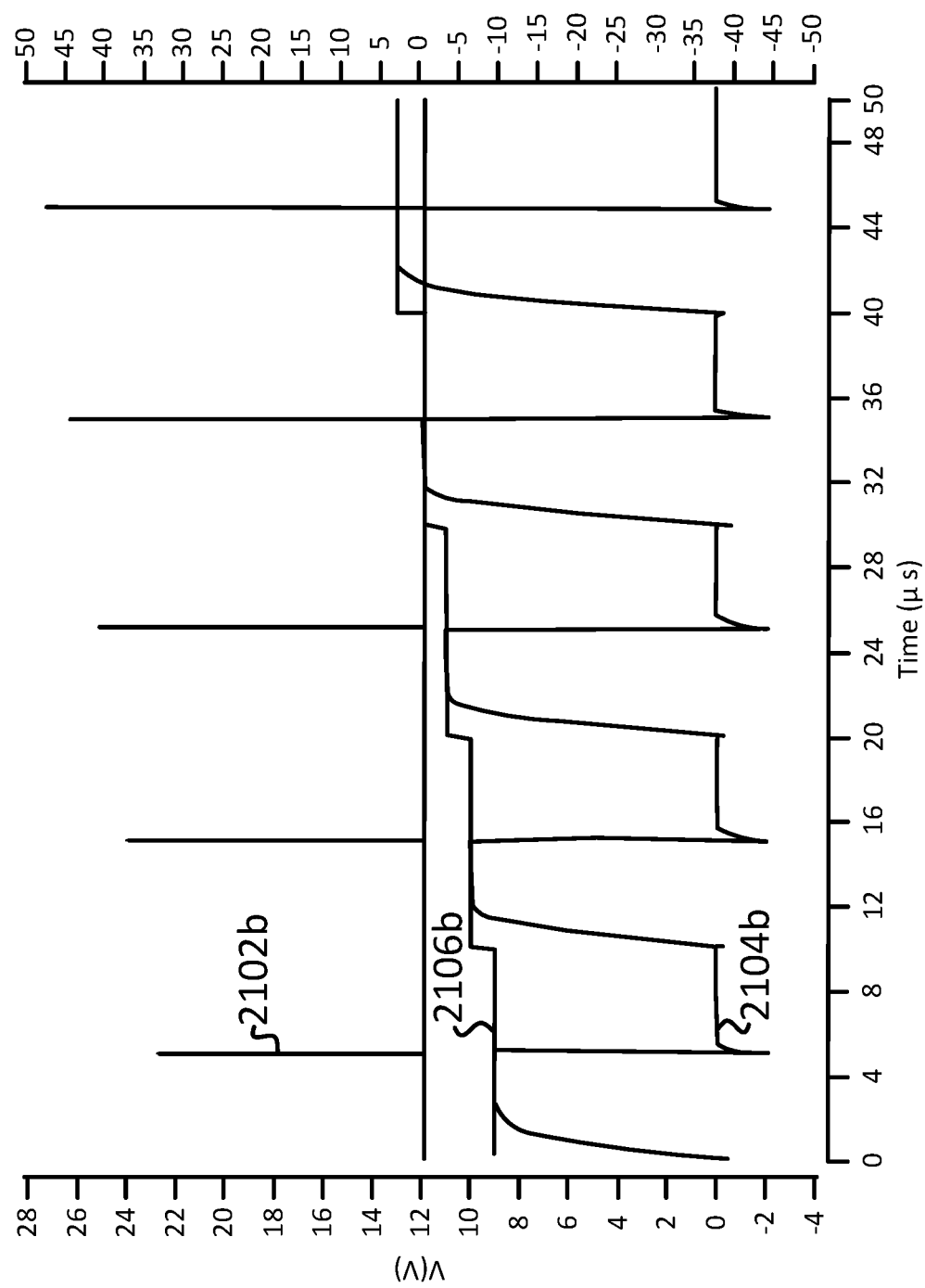

FIGS. 21A-21B show simplified plots, 2102a-b, 2104a-b, 2106a-b, of signals related to operation of the pulsed laser diode drivers shown in FIGS. 17, 18, 19, and 20, in accordance with some embodiments.

FIG. 21A includes examples of high-current pulses 2102a (i.e., through the laser diode(s) $D_L$), a source voltage $V_s$ at the source capacitor $C_S$ 2106a, and a linearly varying supply voltage 2106a of a variable input voltage supply (e.g., a DAC) that provides the DC input voltage $V_{in}$. As shown, a current amplitude of the high-current pulses 2102a is advantageously varied from pulse to pulse.

FIG. 21B includes examples of high-current pulses 2102b (i.e., through the laser diode(s) $D_L$), a source voltage $V_s$ at the source capacitor $C_S$ 2106b, and a stepped supply voltage of a variable input voltage supply (e.g., a DAC) that provides the DC input voltage $V_{in}$. As shown, a current amplitude of the high-current pulses 2102b is advantageously varied from pulse to pulse. Although an output voltage transition of the variable input voltage supply is fast, change in the source voltage level $V_S$ at the source capacitor $C_S$ 2106b is limited by the time constant of the source capacitor $C_S$ and an on-resistance of an input switch (e.g., the source switch $M_S$ described above) or an input resistor (e.g., the source resistor $R_S$ described above).

Figure 22A:
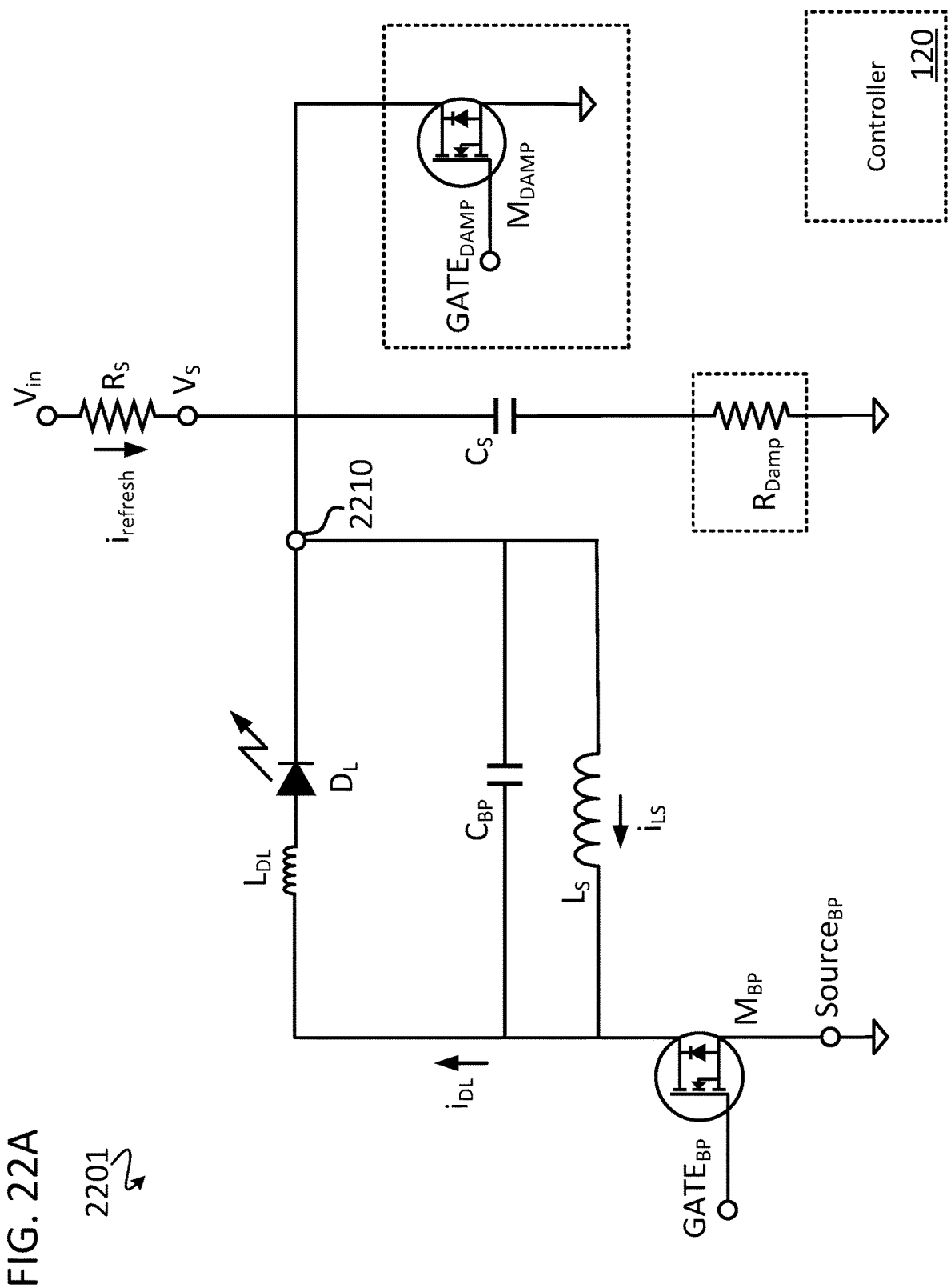
FIGS. 22A-22C are simplified circuit schematics of pulsed laser diode drivers of a tenth general topology, in accordance with some embodiments.

In some embodiments, high-current pulses to drive a laser diode may be advantageously produced using a single switch, such as a FET, thereby reducing an overall part count, size, and complexity of a design as compared to designs that require more than one switch. For example, FIG. 22A shows a simplified circuit schematic of a pulsed laser diode driver 2201 of a tenth general topology, in accordance with some embodiments. The pulsed laser diode driver 2201 generally includes the source resistor $R_S$, the optional controller 120, a source capacitor $C_S$, an inductor $L_S$, a bypass capacitor $C_{BP}$, a laser diode $D_L$, and a bypass switch $M_{BP}$. Also shown is an optional damping resistor $R_{Damp}$, an optional damping switch $M_{DAMP}$, a refresh current $i_{Refresh}$, a node 2210, a parasitic inductance $L_{DL}$ of the laser diode $D_L$, a DC input voltage $V_{in}$, a source voltage $V_S$ at the source capacitor $C_S$, a current $i_{LS}$ through the inductor $L_S$, a current $i_{DL}$ through the laser diode $D_L$, a bypass switch gate driver signal $GATE_{BP}$, and a damping switch gate driver signal $GATE_{DAMP}$. Either or both of the bypass switch $M_{BP}$ and/or the damping switch $M_{DAMP}$ can be implemented as N-type switches or P-type switches. In some embodiments, the bypass switch $M_{BP}$ and/or the damping switch $M_{DAMP}$ are implemented as Silicon-based, or Silicon-Carbide-based field-effect transistors (FETs).

Because the pulsed laser diode driver 2201 advantageously requires only one switch (i.e., the damping switch $M_{DAMP}$ is optional), printed circuit board layout considerations for the pulsed laser diode driver 2201, especially when reducing parasitic inductances, is simplified as compared to printed circuit board layout considerations for designs having two switches. This is because the single switch ($M_{BP}$) can be placed in close proximity to other components of the design, such as the laser diode $D_L$. Additionally, the laser diode switch $M_{DL}$ used in other designs described above must handle considerably more current than the optional damping switch $M_{DAMP}$ must handle. This is because the optional damping switch $M_{DAMP}$ just has to drain residual charge from the source capacitor $C_S$ as compared to handling a high current pulse that travels through the laser diode $D_L$. Thus, even in embodiments disclosed herein that include the optional damping switch $M_{DAMP}$, size and design complexities of the laser diode driver are advantageously reduced as compared to pulsed laser diode drivers that require two larger switches such as the bypass switch $M_{BP}$ and the laser diode driver switch $D_{DL}$.

As shown in FIG. 22A, a first terminal of the source capacitor $C_S$ is configured to receive the refresh current $i_{Refresh}$ from the DC input voltage $V_{in}$ to charge the source capacitor $C_S$. The first terminal of the source capacitor $C_S$ is directly electrically connected to a cathode (first terminal) of the laser diode $D_L$, a first terminal of the bypass capacitor $C_{BP}$, and a first terminal of the inductor $L_S$. A second terminal of the source capacitor $C_S$ is electrically coupled to a bias voltage node such as ground. An anode (second terminal) of the laser diode $D_L$ is directly electrically connected to a second terminal of the bypass capacitor $C_{BP}$, a second terminal of the inductor $L_S$, and to a drain node of the bypass switch $M_{BP}$. A source node of the bypass switch $M_{BP}$ is directly electrically connected to a bias voltage node such as ground.

In some embodiments, the pulsed laser diode driver 2201 includes the optional damping resistor $R_{Damp}$. In such embodiments, the second terminal of the source capacitor is electrically coupled to ground through the optional damping resistor $R_{Damp}$. Resistance values of the optional damping resistor $R_{Damp}$ are dependent on the capacitance value of the supply capacitor $C_S$ and can be tuned within a range of values such that at a lower resistance, a lower frequency resonance of the pulsed laser diode drivers disclosed herein is underdamped (e.g., at about $R_{Damp}$=0.1 Ohm), or is critically damped (e.g., at about $R_{Damp}$=0.4 Ohm). The optional damping resistor $R_{Damp}$ is operable to prevent current of the generated resonant waveform from becoming negative which could thereby enable a body diode of the bypass switch $M_{BP}$.

In other embodiments, the pulsed laser diode driver 2201 includes the optional damping switch $M_{DAMP}$. In such embodiments, the first terminal of the source capacitor $C_S$ is directly electrically connected to a drain node of the optional damping switch $M_{DAMP}$. A source node of the optional damping switch $M_{DAMP}$ is directly electrically connected to ground. As was described above, at discharge step 304 of a switching cycle described with reference to FIG. 3, charge stored at the source capacitor $C_S$ is drained before any switches that control current through the laser diodes are transitioned to an OFF-state to advantageously eliminate high-voltage spikes that could damage or destroy components of the pulsed laser diode driver 2201. Thus, in some embodiments, after pulse emission, the damping switch $M_{DAMP}$ is configured to receive the damping switch gate driver signal $GATE_{DAMP}$ at a gate node (e.g., from the controller 120) to rapidly discharge any remaining charge at the source capacitor $C_S$. During the precharge step (e.g., step 301 of FIG. 3), the preflux step (e.g., step 302 of FIG. 3), and the pulse generation step (e.g., step 303 of FIG. 3) of the switching sequence (e.g., the switching sequence 300 of FIG. 3), the damping switch $M_{DAMP}$ is disabled, thereby creating an undamped LC network. However, after pulse generation, the damping switch $M_{DAMP}$ is enabled to advantageously provide fast recovery of the pulsed laser diode driver 2201 to start a next switching sequence.

Control of the bypass switch $M_{BP}$ using the bypass switch gate driver signal $GATE_{BP}$ is similar to, or the same as, that described with reference to the pulsed laser diode driver 101 and the steps 301 through 305 described with reference to FIG. 3. The bypass switch $M_{BP}$ is configured to receive the bypass switch gate driver signal $GATE_{BP}$ at a gate node (e.g., from the controller 120), the bypass switch gate driver signal $GATE_{BP}$ being operable to turn the bypass switch $M_{BP}$ on or off based on a voltage level of the bypass switch gate driver signal $GATE_{BP}$. However, a laser diode switch, such as the laser diode switch $M_{DL}$ is advantageously not needed to control a current flow through the laser diode $D_L$ of the pulsed laser diode driver 2201 because the laser diode $D_L$ is reverse biased during the precharge and preflux stages.

Although it would initially appear that placing the source capacitor $C_S$ in series with the laser diode $D_L$ would raise the required anode voltage to pulse the laser diode $D_L$, the voltage and current of the source capacitor $C_S$ are 90-degrees out of phase with one another. As was shown by waveforms 1624$a$-$b$ in FIG. 16A and FIG. 16B, because the current pulse (i.e., 1623$a$-$b$) through the laser diode $D_L$ is advanta-geously aligned with a peak current amplitude, voltage at the source capacitor $C_S$ at that time is zero due to the 90-degree phase shift. In some embodiments, a beginning of the high-current pulse could be determined by sensing when the source voltage $V_S$ at the source capacitor $C_S$ is at zero, at which point the high-current pulse through the laser diode $D_L$ should begin.

In some embodiments, the pulsed laser diode driver 2201 is configured to receive the DC input voltage $V_{in}$ having a voltage range from about 10V to 20V, which is advantageously lower than an input voltage used by many conventional pulsed laser diode drivers. The inductor $L_S$ is a physical component added to the pulsed laser diode driver 2201 (i.e., as opposed to a representation of a parasitic inductance caused by components or interconnections such as bond wires). Similarly, the bypass capacitor $C_{BP}$ is a physical component added to the pulsed laser diode driver 2201 (i.e., as opposed to a representation of a parasitic capacitance). One advantage of using physical inductor and capacitor components rather than using parasitic inductances and capacitances is that values of the inductor $L_S$ and the bypass capacitor $C_{BP}$ can be easily modified by a designer or even an end-user. By comparison, conventional designs that rely on parasitic reactances may require re-design and/or re-layout to change an operating parameter.

To elaborate, values of the DC input voltage $V_{in}$, the inductance of the inductor $L_S$, the capacitance of the source capacitor $C_S$, the resistance of the optional damping resistor $R_{Damp}$, and the capacitance of the bypass capacitor $C_{BP}$ can advantageously be selected ("tuned") to achieve a desired operation of the pulsed laser diode driver 2201 (e.g., a charge time, a pulse width, a pulse voltage, a pulse current). For example, a pulse width of the current $i_{DL}$ flowing through the laser diode $D_L$ can be tuned by adjusting the capacitance value of the bypass capacitor $C_{BP}$. A peak current level of the pulse of current $i_{DL}$ flowing through the laser diode $D_L$ can be tuned by adjusting the source voltage $V_S$ on the source capacitor $C_S$. A capacitance value of the source capacitor $C_S$ can be tuned to adjust a timing delay of the high-current pulse and an upper range of the current $i_{DL}$ through the laser diode $D_L$.

In some embodiments, the DC input voltage Vin is about 10 V-20 V, the inductance of the inductor $L_S$ is about 4 nH-8 nH, the capacitance of the source capacitor $C_S$ is about 80 nF-120 nF, the resistance of the optional damping resistor $R_{Damp}$ is about 0.08 Ohm-0.5 Ohm, and the capacitance of the bypass capacitor $C_{BP}$ is about 0.8 nF-1.2 nF. In some embodiments, a voltage at the first terminal of the optional damping resistor $R_{Damp}$ is received by the controller 120 to provide an indication of a current flow through the damping resistor $R_{Damp}$.

Figure 22B:
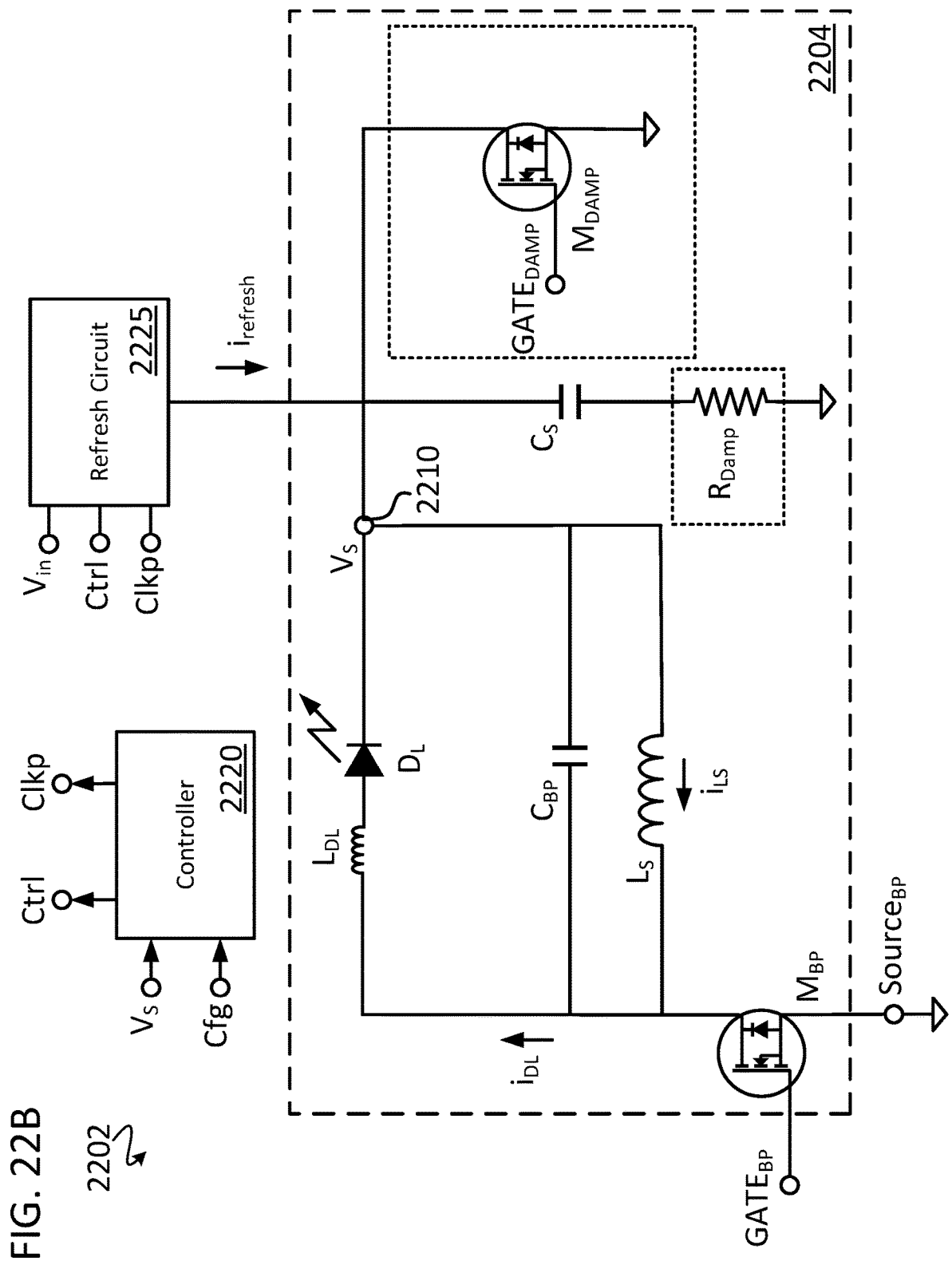

FIG. 22B provides an example of a laser diode driver that has an actively controlled refresh circuit, in accordance with some embodiments. FIG. 22B shows an example embodiment of a pulsed laser diode driver 2202 having all of the components, signals, and nodes described above with reference to the pulsed laser diode driver 2201 of FIG. 22A, with the exception of the source resistor $R_S$ of FIG. 22A which has advantageously been replaced in FIG. 22B by an optional refresh circuit 2225 to rapidly charge the source capacitor $C_S$ to a desired or required voltage level. Additionally, the optional controller 120 has been replaced by an optional controller 2220. In some embodiments, the damping switch $M_{DAMP}$ is integrated within the refresh circuit 2225.

The refresh circuit 2225 controls a current amplitude of the refresh current $i_{Refresh}$ in response to a charge level ($V_S$)

of the source capacitor $C_S$ using internal threshold voltages and/or switch groupings. The amplitude of the refresh current $i_{Refresh}$ in turn controls how quickly or slowly the source capacitor $C_S$ is charged, or "refreshed". While it is often desirable that the source capacitor $C_S$ be charged as quickly as possible, such rapid charging may result in undesirable voltage overshoot at the source capacitor $C_S$. Thus, one role of the refresh circuit 2225 is to optimize a charge rate of the source capacitor $C_S$ while at the same time preventing voltage overshoot. The charge rate of the source capacitor $C_S$ may be optimized by the refresh circuit 2225. For example, in some embodiments, the controller 2220 is operable to configure the refresh circuit 2225 using a fixed configuration setting, or to adaptively configure the refresh circuit 2225 between one or more pulse emissions of one or more laser diodes. In some embodiments, the controller 2220 may transmit a control signal Ctrl to the refresh circuit 2225 that includes high-level information, such as an indication of a maximum target voltage $V_{max}$ that the source capacitor $C_S$ should be charged to, and a specified pulse repetition frequency for the laser diode driver circuit. In such embodiments, the refresh circuit 2225 uses the high-level information included in the control signal Ctrl to configure threshold voltages and switch groupings internally to achieve the maximum target voltage $V_{max}$ without overshoot and to achieve the specified pulse repetition frequency. In other embodiments, the controller 2220 determines low-level configuration settings for the refresh circuit 2225, such as specific voltage levels for the threshold voltages and specific switch groupings, and transmits such low-level configuration settings to the refresh circuit 2225 to configure the refresh circuit 2225. In such embodiments, the controller 2220 may determine, based on a measured charge-rate of the source capacitor $C_S$, that an achieved pulse repetition frequency of the pulsed laser diode driver circuit is not equal to the specified pulse repetition frequency and may accordingly transmit updated low-level configuration settings to the refresh circuit 2225 to change one or more of the voltage levels of the threshold voltages and/or to change the specific switch groupings. Similarly, in some embodiments, the controller 2220 may determine, based on a measured or compared voltage amplitude of the source voltage $V_S$, that voltage overshoot has occurred at the source capacitor $C_S$ and may accordingly transmit updated low-level configuration settings to the refresh circuit 2225 to change one or more of the voltage levels of the threshold voltages and/or to change the specific switch groupings.

A clocking signal clkp, generated by the controller 2220, is received at the refresh circuit 2225. The clocking signal clkp functions as an enable signal for the refresh circuit 2225 such that the refresh circuit 2225 only charges the source capacitor $C_S$ during appropriate portions of a laser pulse emission cycle that were described above with reference to FIG. 3.

In some embodiments, the refresh circuit 2225 or the controller 2220 may select the initial or ongoing voltage levels of the threshold voltages and/or the switch groupings based on using determined or specified information about the particular source capacitor or source capacitors used within the pulsed laser diode driver circuit, and/or an on-resistance of the switches within the refresh circuit 2225 as an input to an RC time-constant equation, T=RC, as is known in the art.

In other embodiments, the refresh circuit 2225 itself is operable to determine, based on a measured charge-rate of the source capacitor $C_S$, that the pulse repetition frequency of the pulsed laser diode driver circuit is not equal to the specified pulse repetition frequency and to accordingly change one or more of the voltage levels of the threshold voltages and/or to change the specific switch groupings to control an amplitude of the refresh current $i_{Refresh}$. Similarly, in some embodiments, the refresh circuit 2225 may determine, based on a measured or compared voltage amplitude of the source voltage $V_S$, that a voltage overshoot has occurred at the source capacitor $C_S$ and may accordingly change one or more of the voltage levels of the threshold voltages and/or change the specific switch groupings.

The DC input voltage $V_{in}$ may be a fixed voltage from a fixed voltage source or may be a voltage from a variable voltage source, such as from a digital-to-analog converter (DAC) (not shown). A voltage level of the DC input voltage $V_{in}$ may be set by the fixed or variable voltage source in accordance with a desired amplitude of a laser pulse emitted by the respective pulsed laser diode driver. The voltage level of the DC input voltage $V_{in}$ may remain fixed during operation of the pulsed laser diode driver or may vary pulse-to-pulse. In other embodiments, the refresh circuit 2225 receives a fixed DC input voltage $V_{in}$ and acts as a variable voltage source to charge one or more source capacitors $C_S$ to a desired voltage level in accordance with a desired amplitude of a laser pulse emitted by the respective pulsed laser diode driver. Details of the refresh circuit 2225 and the controller 2220 are further detailed in U.S. patent application Ser. No. 17/653,349, filed Mar. 3, 2022, all of which is incorporated by reference herein in entirety for all purposes.

Figure 22C:
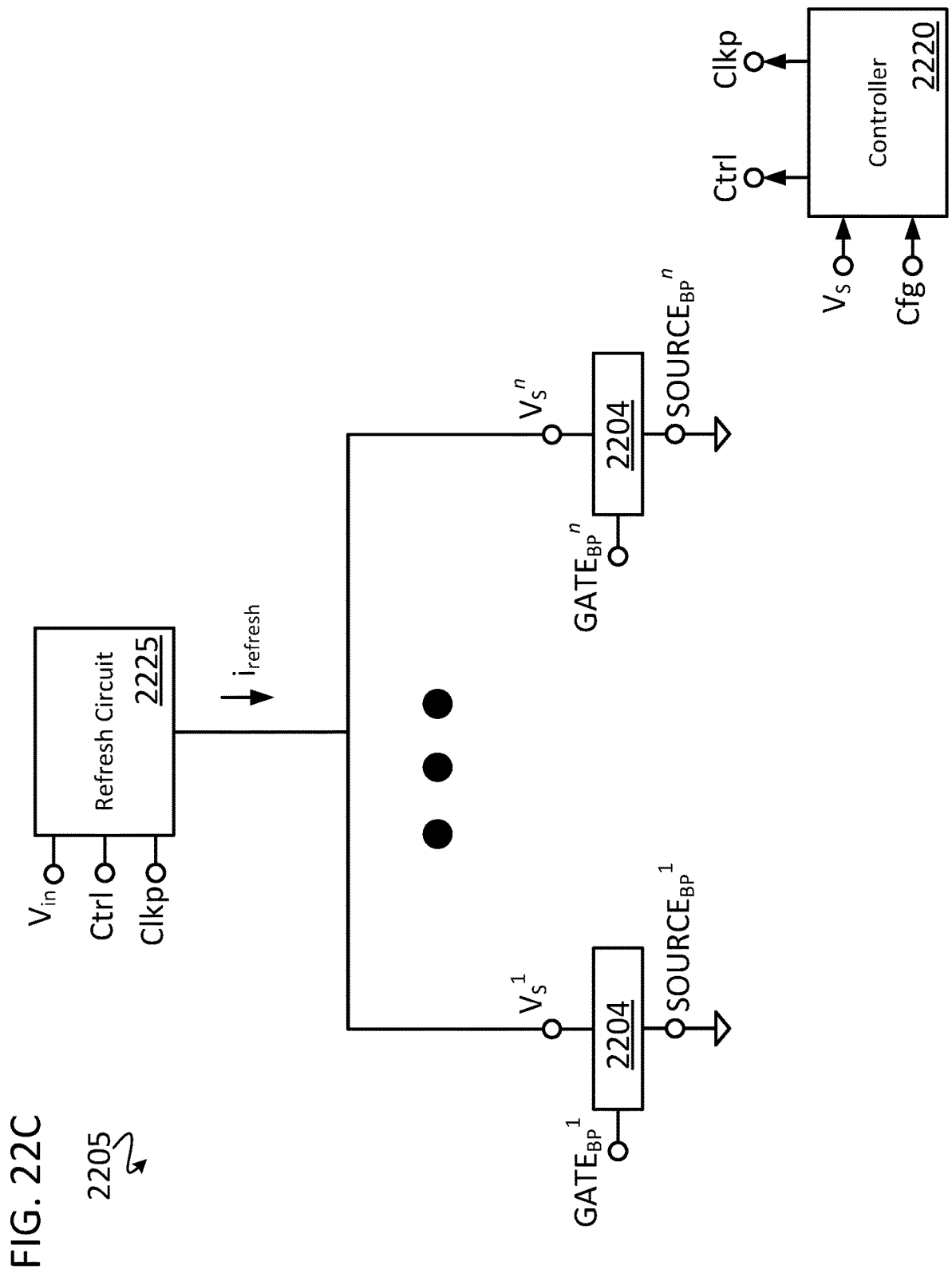

FIG. 22C provides an example of a multi-channel laser diode driver 2205 that includes two or more of the laser diode driver modules 2204 that were shown in FIG. 22B, in accordance with some embodiments. The multi-channel pulsed laser diode driver 2205 is configured to independently drive n laser diodes where n is a number ranging from two to 128 or more. The multi-channel pulsed laser diode driver 2205 is operable to cause a pulse to be emitted from any individual laser diode of the multi-channel pulsed laser diode driver 2205 in isolation or combined with one or more other pulses emitted from other laser diodes of the multi-channel pulsed laser diode driver 2205.

In the example shown, the pulsed laser diode driver circuit 2205 includes the refresh circuit 2225 introduced in FIG. 22B to provide the refresh current $i_{refresh}$ to n laser diode driver modules 2204, where n is an integer number of laser diode driver modules (e.g., 2, 4, 8, 16, 32, etc.). Each of the n laser diode driver modules 2204 implements the laser diode driver module 2204 shown in FIG. 22B and control of each of the laser diode driver modules 2204, e.g., by the optional controller 2220, is the same as, or is similar to, control of the laser diode driver 2201 that was described with reference to FIG. 22A. As such, the laser diode driver 2205 is advantageously operable to drive two or more individual laser diodes.

Figure 23A:
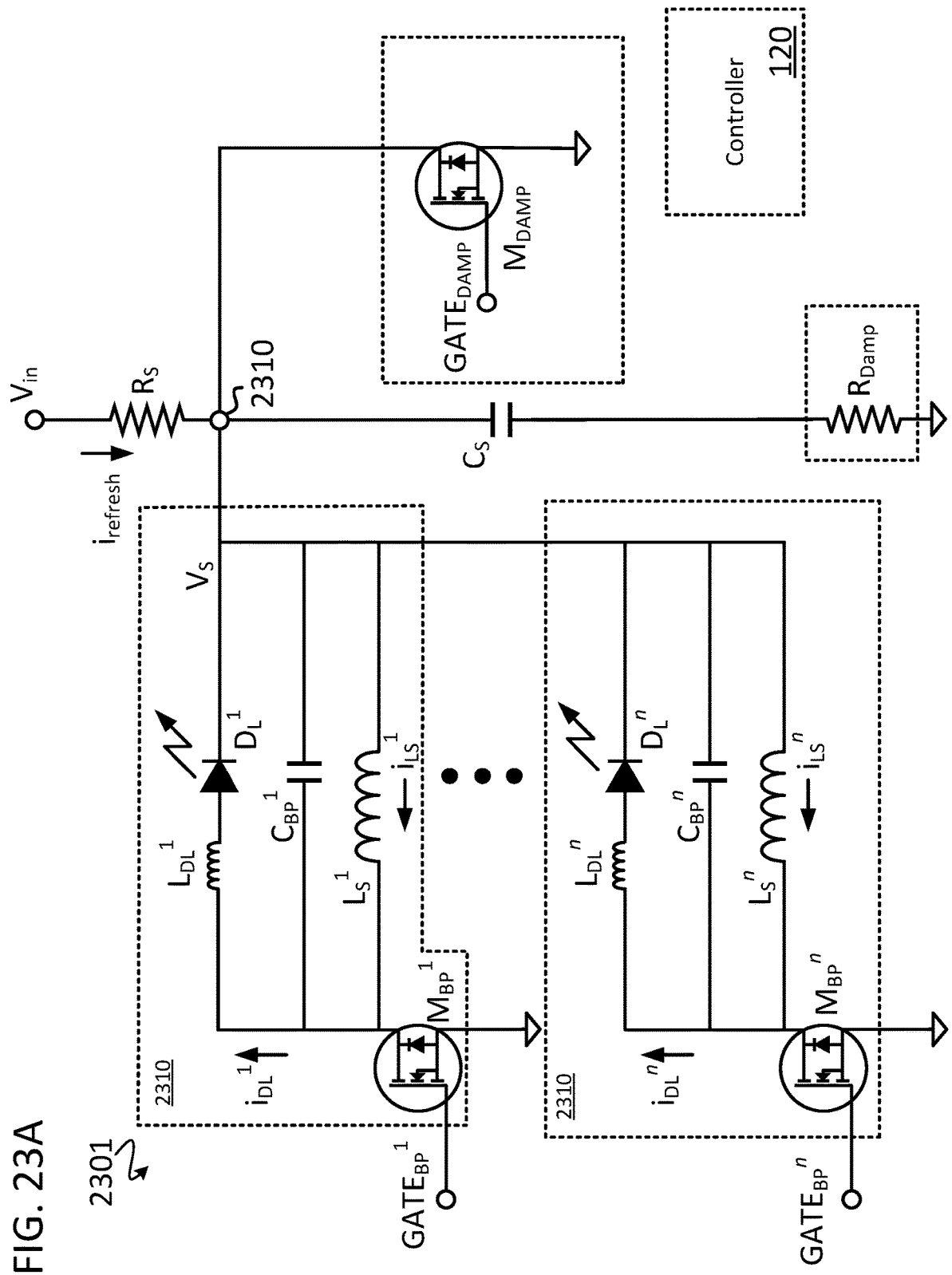
FIGS. 23A-23B are simplified circuit schematics of multi-channel pulsed laser diode drivers of an eleventh general topology, in accordance with some embodiments.

FIG. 23A shows a simplified circuit schematic of a multi-channel pulsed laser diode driver 2301 of an eleventh general topology, in accordance with some embodiments. The multi-channel pulsed laser diode driver 2301 is configured to independently drive n laser diodes where n is a number ranging from two to 128 or more. The multi-channel pulsed laser diode driver 2301 is operable to cause a pulse to be emitted from any individual laser diode of the multi-channel pulsed laser diode driver 2301 in isolation or combined with one or more other pulses emitted from other laser diodes of the multi-channel pulsed laser diode driver 2301.

The pulsed laser diode driver 2301 is similar to the pulsed laser diode driver 2201, except that the pulsed laser diode driver 2301 includes n resonant laser diode driver cells 2310, where n is an integer number of resonant laser diode driver cells (e.g., 2, 4, 8, 16, 32, etc.). Each of the resonant laser diode driver cells 2310 includes a respective laser diode $D_L{}^n$, a bypass capacitor $C_{BP}{}^n$, an inductor $L_S{}^n$, and a bypass switch $M_{BP}$ n. Also shown, for each of the n resonant laser diode driver cells, is a respective parasitic inductance $L_{DL}{}^n$ of that cell's laser diode $D_L{}^n$, a respective current $i_{LS}{}^n$ through that cell's inductor $L_S{}^n$, a respective current $i_{DL}{}^n$ through that cell's laser diode $D_L{}^n$, and a respective bypass switch gate driver signal $GATE_{PB}{}^n$ at a gate node of that cell's bypass switch $M_{BP}{}^n$.

In addition to the n resonant laser diode driver cells 2310, the pulsed laser diode driver 2301 generally includes the previously described source resistor $R_S$, the optional controller 120, and the source capacitor $C_S$. Also shown is the optional damping resistor $R_{Damp}$, the optional damping switch $M_{DAMP}$, the refresh current $i_{Refresh}$, the node 2310, the DC input voltage $V_{in}$, a source voltage $V_S$ at the source capacitor $C_S$, and a damping switch gate driver signal $GATE_{DAMP}$.

Either or both of the bypass switches $M_{BP}{}^n$ and/or the damping switch $M_{DAMP}$ can be implemented as N-type switches or P-type switches. In some embodiments, the bypass switches $M_{BP}{}^n$ and/or the damping switch $M_{DAMP}$ are implemented as Silicon-based or Silicon-Carbide-based field-effect transistors (FETs). Operation of each of the resonant laser diode driver cells 2310 of the pulsed laser diode driver 2301 is similar to the operation of the pulsed laser diode driver 2201 and is described in more detail below with reference to FIG. 26.

Figure 23B:
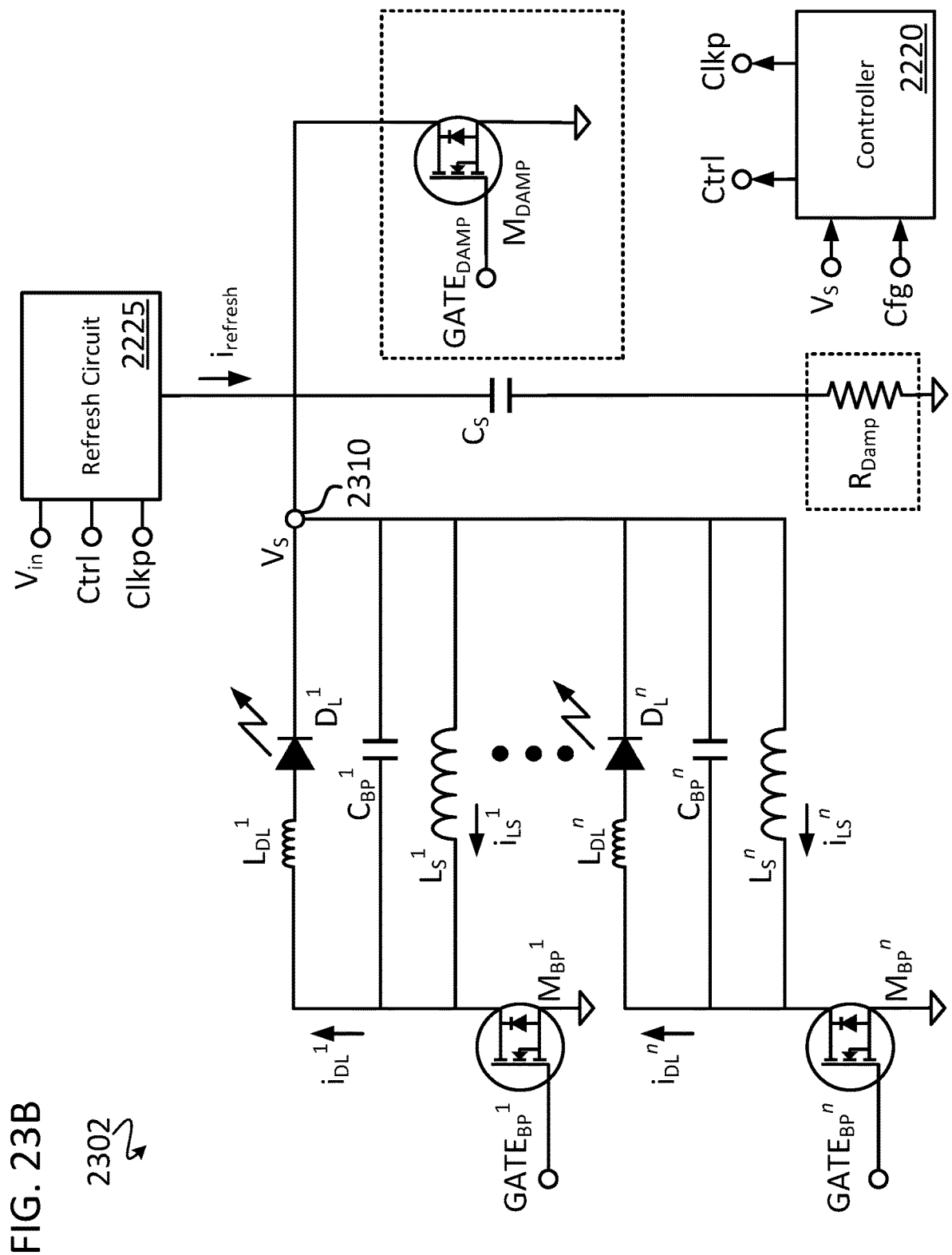

FIG. 23B provides an example of a multi-channel pulsed laser diode driver 2302 that has an actively controlled refresh circuit, in accordance with some embodiments. The multi-channel pulsed laser diode driver 2302 has all of the components, signals, and nodes described above with reference to the pulsed laser diode driver 2301 of FIG. 23A, with the exception of the source resistor $R_S$ of FIG. 23A which has advantageously been replaced in FIG. 23B by the optional refresh circuit 2225, described above, to rapidly charge the source capacitor $C_S$. Additionally, the optional controller 120 has been replaced by the optional controller 2220, described above. In some embodiments, the damping switch $M_{DAMP}$ is integrated within the refresh circuit 2225.

Figure 24:
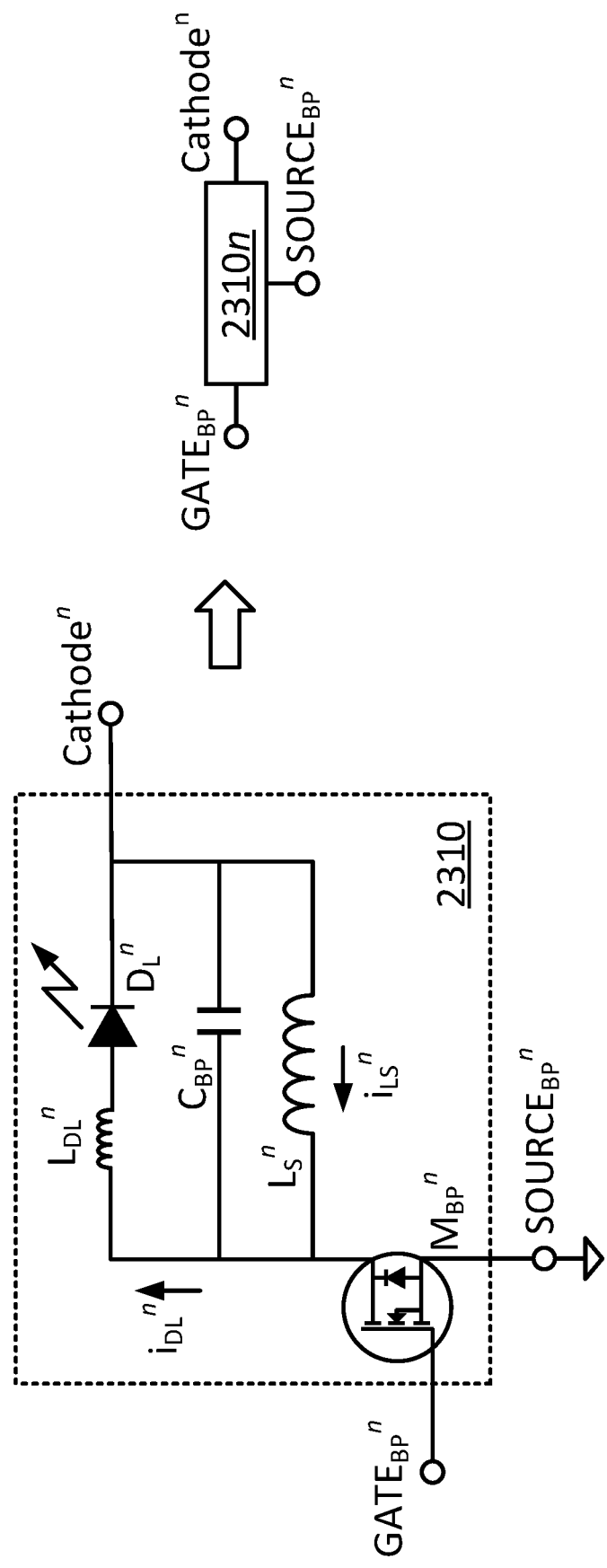
FIG. 24 shows simplified circuit schematics of a resonant laser diode driver cell, in accordance with some embodiments.

FIG. 24 shows simplified circuit schematics of the resonant laser diode driver cell 2310, in accordance with some embodiments. As described above, the resonant laser diode driver cell 2310 includes a respective laser diode $D_L{}^n$, a bypass capacitor $C_{BP}{}^n$, an inductor $L_S{}^n$, and a bypass switch $M_{BP}{}^n$. Also shown is a respective parasitic inductance $L_{DL}{}^n$ of that cell's laser diode $D_L{}^n$, a respective current $i_{LS}{}^n$ through that cell's inductor $L_S{}^n$, a respective current $i_{DL}{}^n$ through that cell's laser diode $D_L{}^n$, a respective bypass switch gate driver signal $GATE_{BP}{}^n$ at a gate node of that cell's bypass switch $M_{BP}{}^n$, a node labeled $SOURCE_{BP}{}^n$ at a source node of that cell's bypass switch $M_{BP}{}^n$, and a node labeled $CATHODE^n$ at a cathode node of that cell's laser diode $D_L{}^n$. As shown, a schematic representation of the resonant laser diode driver cell 2310 is simplified as the schematic representation 2310n.

Figure 25:
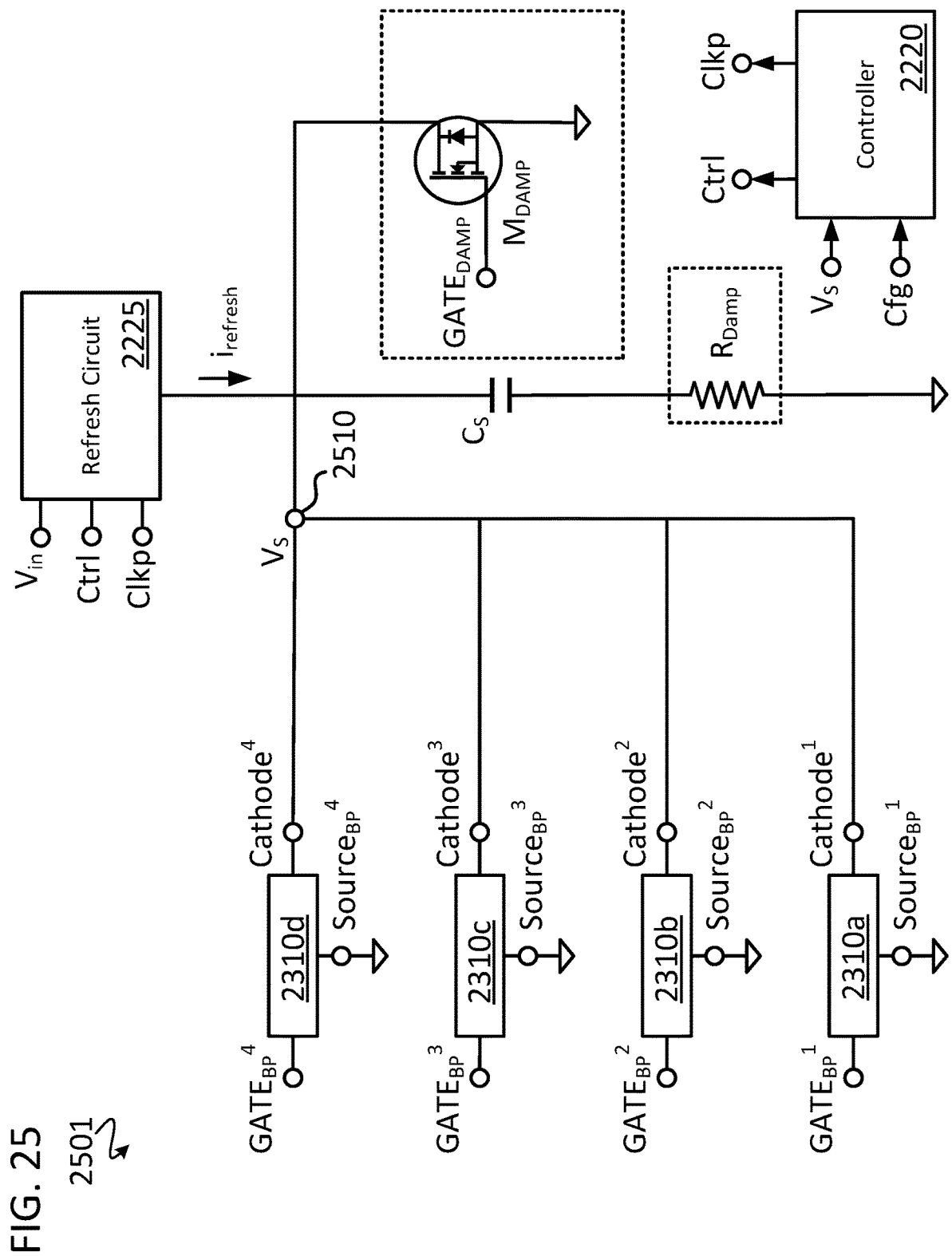
FIG. 25 is a simplified circuit schematic of a multi-channel pulsed laser diode driver of the eleventh general topology, in accordance with some embodiments.

FIG. 25 shows a simplified circuit schematic of a multi-channel pulsed laser diode driver 2501 of the eleventh general topology, in accordance with some embodiments. The pulsed laser diode driver 2501 is similar to the pulsed laser diode driver 2302, except that the pulsed laser diode driver 2501 specifically shows n=4 resonant laser diode driver cells 2310a-d, each of which implements a respective one of the resonant laser diode driver cells 2310 shown in FIG. 24.

Each of the resonant laser diode driver cells 2310a-d includes a respective one of a laser diode $D_L{}^n$, bypass capacitor $C_{BP}{}^n$, inductor $L_S{}^n$, and bypass switch $M_{BP}{}^n$ as shown in FIG. 24. That is, the resonant laser diode driver cells 2310a-d include respective laser diodes $D_L{}^{1-4}$, respective bypass capacitors $C_{BP}{}^{1-4}$, respective inductors $L_S{}^{1-4}$, and respective bypass switches $M_{BP}{}^{1-4}$. Because each of the resonant laser diode driver cells 2310a-d advantageously requires only one switch, printed circuit board layout considerations for the multi-channel pulsed laser diode driver 2501, especially when reducing parasitic inductances, is simplified as compared to printed circuit board layout considerations for designs having two switches per cell. Additionally, because each of the respective bypass switches $M_{BP}{}^1$ through $M_{BP}{}^4$ of the resonant laser diode driver cells 2310a-d are configured as low-side switches (i.e., a source node of each aforementioned switch is directly electrically connected to ground), a gate control signal of those switches does not need to be level-shifted by bootstrap circuitry, thereby advantageously simplifying the design and reducing the cost of the multi-channel pulsed laser diode driver 2501 as compared to a laser diode driver circuit that requires bootstrap circuitry.

In addition to the four resonant laser diode driver cells 2310a-d, the pulsed laser diode driver 2501 generally includes the previously described optional refresh circuit 2225, the optional controller 2220, the source capacitor $C_S$, the optional damping resistor $R_{Damp}$, the optional damping switch $M_{DAMP}$, the refresh current $i_{Refresh}$, a node 2510, the DC input voltage $V_{in}$, the source voltage $V_S$ at the source capacitor $C_S$, the control signal Ctrl, the clocking signal Clkp, and the damping switch gate driver signal $GATE_{DAMP}$ described above with reference to FIG. 23B. Operation of each of the resonant laser diode driver cells 2310a-d of the pulsed laser diode driver 2501 is similar to the operation of the pulsed laser diode driver 2201 described with reference to FIG. 22A and is described in more detail below.

Figure 26:
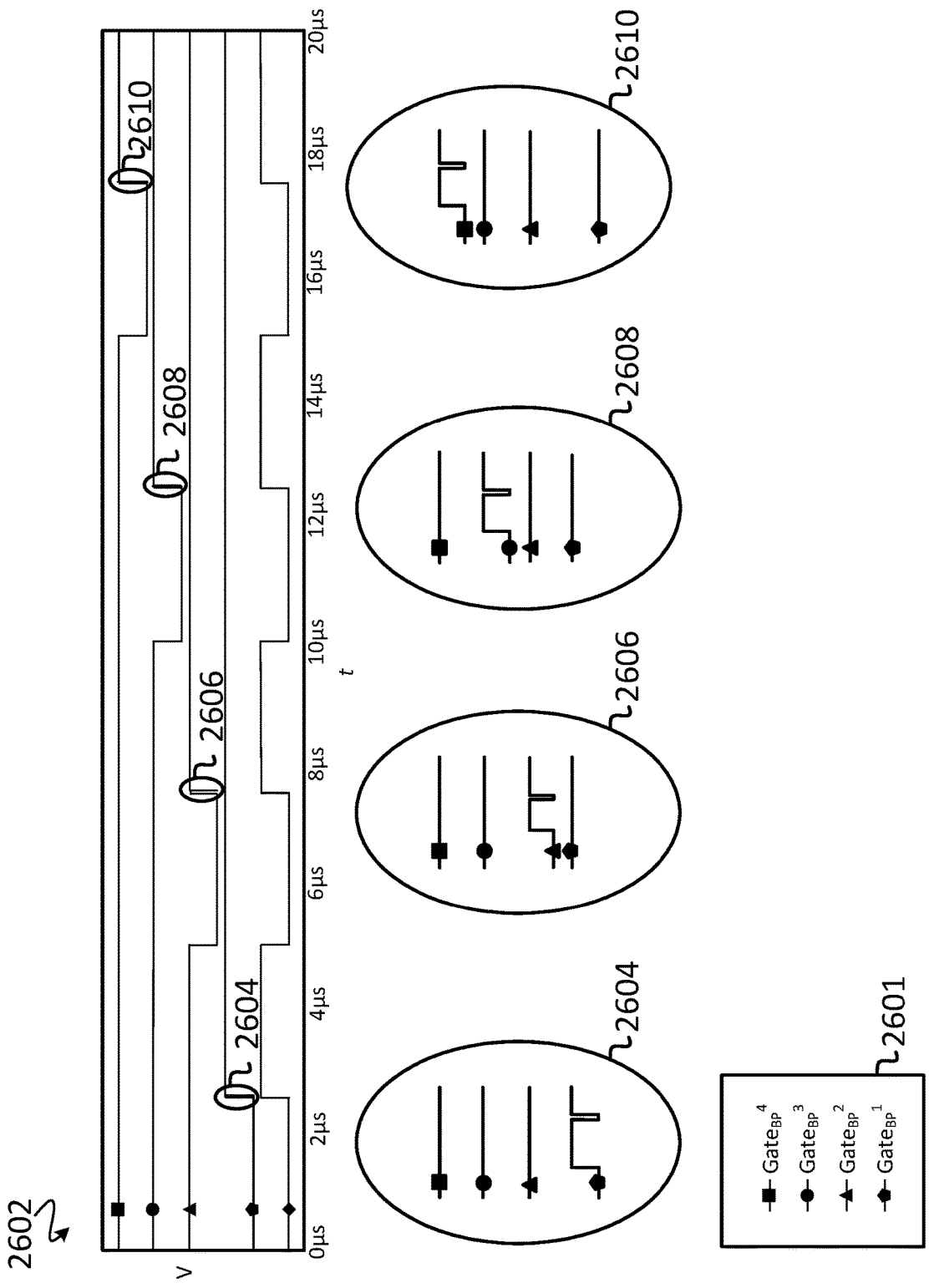
FIG. 26 shows simplified plots of signals related to operation of the pulsed laser diode driver shown in FIG. 25, in accordance with some embodiments.

Simplified example waveforms 2602 of signals related to the operation of the multi-channel pulsed laser diode driver 2501 are shown in FIG. 26, in accordance with some embodiments. Also shown is a legend 2601 and expanded regions of interest 2604, 2606, 2608, and 2610 of the waveforms 2602. As indicated by the legend 2601, the simplified waveforms 2602 of FIG. 26 include a first bypass switch gate driver signal $Gate_{BP}{}^1$, a second bypass switch gate driver signal $Gate_{BP}{}^2$, a third bypass switch gate driver signal $Gate_{BP}{}^3$, and a fourth bypass switch gate driver signal $Gate_{BP}{}^4$ over a 20 μs duration. With reference to FIG. 25, the first bypass switch gate driver signal $Gate_{BP}{}^1$ is operable to control the bypass switch $M_{BP}{}^1$ of the resonant laser diode driver cell 2310a, the second bypass switch gate driver signal $Gate_{BP}{}^2$ is operable to control the bypass switch $M_{BP}{}^2$ of the resonant laser diode driver cell 2310b, the third bypass switch gate driver signal $Gate_{BP}{}^3$ is operable to control the bypass switch $M_{BP}{}^3$ of the resonant laser diode driver cell 2310c, and the fourth bypass switch gate driver signal $Gate_{BP}{}^4$ is operable to control the bypass switch $M_{BP}{}^4$ of the resonant laser diode driver cell 2310d.

Each of the expanded regions of interest 2604, 2606, 2608, and 2610 illustrate a pre-flux interval of a selected channel during which an inductor current of that channel's inductor is ramping up, a very short pulse interval during which current through that channel's inductor is directed through that channel's laser diode, and a discharge interval in accordance with steps 301 through 305 described with reference to FIG. 3. Per the description above, the region of interest 2604 illustrates pulse generation for the first channel (i.e., 2310a) of the multi-channel pulsed laser diode driver 2501, the region of interest 2606 illustrates pulse generation for the second channel (i.e., 2310b) of the multi-channel pulsed laser diode driver 2501, the region of interest 2608 illustrates pulse generation for the third channel (i.e., 2301c) of the multi-channel pulsed laser diode driver 2501, and the region of interest 2610 illustrates pulse generation for the fourth channel (i.e., 2301d) of the multi-channel pulsed laser diode driver 2501.

In some embodiments, the Ctrl signals generated by the optional controller 2220 include n channel selection signals. Each channel selection signal is operable to control whether a corresponding channel of the multi-channel pulsed laser diode drivers 2301/2501 will emit a pulse for a given clock cycle. For example, if each of the n channel selection signals are asserted during a clock cycle, all n channels of the multi-channel pulsed laser diode drivers 2301/2501 will emit a pulse during that clock cycle. Or, for example, if only one of the of the n channel selection signals is asserted during a clock cycle, only that channel of the multi-channel pulsed laser diode driver 2501 will emit a pulse during that clock cycle. In some embodiments, the channel selection signals control pulse emission for corresponding channels during a clock cycle by controlling whether the gate bypass signal for that channel $GATE_{BP}{}^n$ is produced during that clock cycle. In other embodiments, the channel selection signals control pulse emission for a channel during a clock cycle by controlling whether the source capacitor $C_S$ is charged during that clock cycle.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A pulsed laser diode driver comprising:
   a plurality of resonant laser diode driver cells, each resonant laser diode driver cell comprising:
      an inductor having a first terminal and a second terminal, the first terminal being configured to receive a source voltage;
      a bypass capacitor having a first terminal directly electrically connected to the first terminal of the inductor and a second terminal directly electrically connected to the second terminal of the inductor;
      a laser diode having a cathode that is directly electrically connected to the first terminal of the inductor and an anode that is directly electrically connected to the second terminal of the inductor; and
      a bypass switch having a drain node that is directly electrically connected to the second terminal of the inductor and a source node that is directly electrically connected to ground;
   a source capacitor having a first terminal directly electrically connected to the first terminal of each inductor of the plurality of resonant laser diode driver cells to provide the source voltage thereto and a second terminal electrically coupled to ground; and
   a damping switch having a drain node that is directly electrically connected to the first terminal of the source capacitor and a source node that is directly electrically connected to ground;
   wherein:
   for each resonant laser diode driver cell of the plurality of resonant laser diode driver cells, the bypass switch is configured to control a current flow through the inductor to produce a high-current pulse through the laser diode, the high-current pulse corresponding to a peak current of a resonant waveform developed at the anode of the laser diode; and
   the damping switch is configured to discharge the source capacitor after each high-current pulse is produced.

2. The pulsed laser diode driver of claim 1, further comprising:
   a source resistor configured to receive a DC input voltage, the source voltage being received at the first terminal of the source capacitor via the source resistor.

3. The pulsed laser diode driver of claim 1, further comprising:
   a refresh circuit configured to receive a DC input voltage, the source voltage being received at the first terminal of the source capacitor via the refresh circuit.

4. The pulsed laser diode driver of claim 3, further comprising:
   an adjustable voltage supply configured to generate the DC input voltage.

5. The pulsed laser diode driver of claim 4, wherein:
   the adjustable voltage supply comprises a Digital-to-Analog Converter (DAC).

6. The pulsed laser diode driver of claim 3, wherein:
   the refresh circuit stops charging the source capacitor when a desired voltage level is reached.

7. A pulsed laser diode driver comprising:
   a plurality of resonant laser diode driver cells, each resonant laser diode driver cell comprising:
      an inductor having a first terminal and a second terminal, the first terminal being configured to receive a source voltage;
      a bypass capacitor having a first terminal directly electrically connected to the first terminal of the inductor and a second terminal directly electrically connected to the second terminal of the inductor;
      a laser diode having a cathode that is directly electrically connected to the first terminal of the inductor and an anode that is directly electrically connected to the second terminal of the inductor; and
      a bypass switch having a drain node that is directly electrically connected to the second terminal of the inductor and a source node that is directly electrically connected to ground; and
   a source capacitor having a first terminal directly electrically connected to the first terminal of each inductor of the plurality of resonant laser diode driver cells to provide the source voltage thereto and a second terminal electrically coupled to ground;

wherein:

for each resonant laser diode driver cell of the plurality of resonant laser diode driver cells, the bypass switch is configured to control a current flow through the inductor to produce a high-current pulse through the laser diode, the high-current pulse corresponding to a peak current of a resonant waveform developed at the anode of the laser diode.

8. The pulsed laser diode driver of claim 7, further comprising:

a damping switch having a drain node that is directly electrically connected to the first terminal of the source capacitor and a source node that is directly electrically connected to ground;

wherein:

the damping switch is configured to discharge the source capacitor after each high-current pulse is produced.

9. The pulsed laser diode driver of claim 7, further comprising:

a damping resistor having a first terminal that is directly electrically connected to the second terminal of the source capacitor and a second terminal that is directly electrically connected to ground.

10. The pulsed laser diode driver of claim 7, further comprising:

a source resistor configured to receive a DC input voltage, the source voltage being received at the first terminal of the source capacitor via the source resistor.

11. The pulsed laser diode driver of claim 7, further comprising:

a refresh circuit configured to receive a DC input voltage, the source voltage being received at the first terminal of the source capacitor via the refresh circuit.

12. The pulsed laser diode driver of claim 11, further comprising:

an adjustable voltage supply configured to generate the DC input voltage.

13. The pulsed laser diode driver of claim 12, wherein: the adjustable voltage supply comprises a Digital-to-Analog Converter (DAC).

14. The pulsed laser diode driver of claim 11, wherein: the refresh circuit stops charging the source capacitor when a desired voltage level is reached.

15. A pulsed laser diode driver, comprising:

a plurality of laser diode driver modules, each laser diode driver module comprising:

an inductor having a first terminal and a second terminal, the first terminal being configured to receive a source voltage;

a source capacitor having a first terminal directly electrically connected to the first terminal of the inductor to provide the source voltage and a second terminal electrically coupled to ground;

a bypass capacitor having a first terminal directly electrically connected to the first terminal of the inductor and a second terminal directly electrically connected to the second terminal of the inductor;

a laser diode having a cathode that is directly electrically connected to the first terminal of the inductor and an anode that is directly electrically connected to the second terminal of the inductor; and a bypass switch having a drain node that is directly electrically connected to the second terminal of the inductor and a source node that is directly electrically connected to ground;

wherein:

a respective source capacitor of each laser diode driver module of the plurality of laser diode driver modules is configured to receive the source voltage at the first terminal of that respective source capacitor; and the bypass switch of each laser diode driver module of the plurality of laser diode driver modules is configured to control a current flow through the inductor of that laser diode driver module to produce a high-current pulse through the laser diode of that laser diode driver module, the high-current pulse corresponding to a peak current of a resonant waveform developed at the anode of that laser diode.

16. The pulsed laser diode driver of claim 15, wherein each laser diode driver module further comprises:

a damping switch having a drain node that is directly electrically connected to the first terminal of the source capacitor of that laser diode driver module and a source node that is directly electrically connected to ground;

wherein:

the damping switch is configured to discharge the source capacitor of that laser diode driver module after the high-current pulse is produced.

17. The pulsed laser diode driver of claim 15, further comprising:

a refresh circuit configured to receive a DC input voltage, the source voltage being received at the first terminal of each of the respective source capacitors via the refresh circuit.

18. The pulsed laser diode driver of claim 17, further comprising:

an adjustable voltage supply configured to generate the DC input voltage.

19. The pulsed laser diode driver of claim 18, wherein: the adjustable voltage supply comprises a Digital-to-Analog Converter (DAC).

* * * * *